(12) United States Patent
Yanagisawa et al.

(10) Patent No.: US 11,522,530 B2
(45) Date of Patent: Dec. 6, 2022

(54) WAVEFORM SHAPING CIRCUIT, SIGNAL GENERATION APPARATUS, AND SIGNAL READING SYSTEM

(71) Applicant: HIOKI E.E. CORPORATION, Nagano (JP)

(72) Inventors: Koichi Yanagisawa, Nagano (JP); Hiroyoshi Ikeda, Nagano (JP); Shin Kasai, Nagano (JP); Tomoharu Sakai, Nagano (JP)

(73) Assignee: HIOKI E.E. CORPORATION, Nagano (JP)

( * ) Notice: Subject to any disclaimer, the term of this patent is extended or adjusted under 35 U.S.C. 154(b) by 0 days.

(21) Appl. No.: 17/539,568

(22) Filed: Dec. 1, 2021

(65) Prior Publication Data

US 2022/0094343 A1    Mar. 24, 2022

Related U.S. Application Data

(62) Division of application No. 17/262,058, filed as application No. PCT/JP2019/029048 on Jul. 24, 2019, now Pat. No. 11,349,464.

(30) Foreign Application Priority Data

Jul. 26, 2018 (JP) .............................. JP2018-140191
Jul. 19, 2019 (JP) .............................. JP2019-133343

(51) Int. Cl.
*H03K 5/01* (2006.01)
*H03F 3/45* (2006.01)
(Continued)

(52) U.S. Cl.
CPC ........... *H03K 5/01* (2013.01); *H03F 3/45475* (2013.01); *H03K 5/24* (2013.01); *H03M 1/66* (2013.01); *H04L 25/06* (2013.01)

(58) Field of Classification Search
CPC ................................. H03K 5/01; H03K 5/24
See application file for complete search history.

(56) References Cited

U.S. PATENT DOCUMENTS 5,643,136 A    7/1997    Kono et al.
6,388,462 B1    5/2002    Tsuzura
(Continued)

FOREIGN PATENT DOCUMENTS

JP    04-132412    5/1992
JP    08-028689    2/1996
(Continued)

OTHER PUBLICATIONS

Apr. 12, 2022 Extended European Search Report in European Pat. Appl. No. 19842087.9.
(Continued)

*Primary Examiner* — Sibin Chen
(74) *Attorney, Agent, or Firm* — Greenblum & Bernstein, P.L.C.

(57) ABSTRACT

A waveform shaping circuit includes a capacitor, an impedance element, a switch circuit, and a switch control circuit. Opposite ends of the capacitor are connected to the input and output, respectively. One end of the impedance element supplies a target constant voltage to the output end of the capacitor. The switch circuit has a switch without a diode. When on, the switch applies the target constant voltage to the output. When off, it does not. The switch control circuit switches the switch on during a high voltage period in an AC component of an input pulse signal and switches the switch off during a low voltage period of the AC component. The circuit shapes the input pulse signal into an output pulse signal whose peak-to-peak voltage is equivalent to a peak-
(Continued)

to-peak voltage of the AC component and whose voltage during the high voltage period is at the target constant voltage.

16 Claims, 13 Drawing Sheets

(51) Int. Cl.
      *H03K 5/24*       (2006.01)
      *H03M 1/66*       (2006.01)
      *H04L 25/06*       (2006.01)

(56) References Cited

U.S. PATENT DOCUMENTS

| | | | | |
|---|---|---|---|---|
| 2007/0069925 A1* | 3/2007 | Masaki | .................... | G01D 5/00 |
| | | | | 341/50 |
| 2007/0137628 A1* | 6/2007 | Naruse | .................... | F02P 17/12 |
| | | | | 123/644 |
| 2009/0140849 A1 | 6/2009 | Henry | | |
| 2011/0063043 A1* | 3/2011 | Yoshida | .................... | H01S 5/50 |
| | | | | 333/20 |
| 2012/0212251 A1* | 8/2012 | Yanagishima | .......... | H02P 31/00 |
| | | | | 324/762.01 |
| 2013/0195159 A1 | 8/2013 | Morohashi | | |
| 2016/0315662 A1 | 10/2016 | Henry et al. | | |

FOREIGN PATENT DOCUMENTS

| | | |
|---|---|---|
| JP | 2013-162159 | 8/2013 |
| JP | 2018-519703 | 7/2018 |
| WO | 2010/041212 | 4/2010 |

OTHER PUBLICATIONS

Official Communication issued by International Bureau of WIPO for Patent Application No. PCT/JP2019/029048, dated Oct. 8, 2019.

\* cited by examiner

WAVEFORM SHAPING CIRCUIT, SIGNAL GENERATION APPARATUS, AND SIGNAL READING SYSTEM

CROSS REFERENCE TO RELATED APPLICATIONS

The present application is a divisional of U.S. patent application Ser. No. 17/262,058 filed Jan. 21, 2021, which is a U.S. National Stage Application of International Patent Application No. PCT/JP2019/029048 filed Jul. 24, 2019, which claims the benefit of Japanese Patent Application Nos. 2019-133343 filed Jul. 19, 2019, and 2018-140191 filed Jul. 26, 2018. The disclosure of each of the above-noted applications is expressly incorporated herein by reference in its entirety.

TECHNICAL FIELD

The present invention relates to a waveform shaping circuit that performs waveform shaping to set the voltage during a high voltage period or the voltage during a low voltage period of an input pulse signal with a superimposed DC voltage that changes or an input pulse signal with a varying amplitude at a target constant voltage set in advance and outputs the result as an output pulse signal. The present invention also relates to a signal generation apparatus that is equipped with this waveform shaping circuit and generates a code specifying signal that can specify a code corresponding to a logic signal based on a logic signal transferred via a communication path, and to a signal reading system equipped with this signal generation apparatus.

BACKGROUND ART

As a waveform shaping circuit of this type, Patent Literature 1 indicated below discloses a waveform shaping circuit (or "clamp circuit") composed of a capacitor and a diode. This waveform shaping circuit performs waveform shaping that maintains the peak-to-peak voltage of an input pulse signal (or "input signal") regardless of the magnitude of this peak-to-peak voltage and sets the voltage during a high voltage period (or "positive peak value") at zero volts (when it is assumed the diode is an ideal diode) as a target constant voltage, and outputs a shaped signal. This means that at a voltage comparator disposed downstream of the waveform shaping circuit, by comparing the signal outputted from the waveform shaping circuit with a reference voltage that has been selected at a voltage that is lower than but close to the target constant voltage (zero volts), it is possible to generate sampling pulses that are synchronized with the input pulse signal.

CITATION LIST

Patent Literature

Patent Literature 1
Japanese Examined Patent Application Publication No. H08-28689 (see pages 2 to 3 and FIGS. 1 and 5)

SUMMARY OF INVENTION

Technical Problem

However, the waveform shaping circuit disclosed in Patent Literature 1 has the following problem to be solved. More specifically, since an actual diode will always have a forward voltage, the waveform shaping circuit will set and output the voltage of the input pulse signal during the high voltage period (that is, the positive peak value) at a target constant voltage which is higher by the forward voltage than zero volts. Since the current-voltage characteristics of the diode that sets the forward voltage will fluctuate according to temperature, this waveform shaping circuit has a problem to be solved in that the target constant voltage will also fluctuate according to temperature.

The present invention was conceived in view of the above problem to be solved, and it is a principal object of the present invention to provide a waveform shaping circuit that does not include a diode that is affected by temperature. It is another principal object of the present invention to provide a signal generation apparatus equipped with this waveform shaping circuit, and a signal reading system equipped with this signal generation apparatus.

Solution to Problem

To achieve the stated object, a waveform shaping circuit according to claim 1 comprises: a capacitor with one end connected to an input where an input pulse signal is inputted and another end connected to an output; a first impedance element that has one end, which is connected to the other end of the capacitor, and another end, to which a target constant voltage is applied, and supplies the target constant voltage to the other end of the capacitor; a switch circuit that includes a switch without including a diode, has one end connected to the output and has another end to which the target constant voltage is applied, applies, in a state where the switch is on, the target constant voltage to the output and stops, in a state where the switch is off, application of the target constant voltage to the output; and a switch control circuit that generates and outputs, based on the input pulse signal, a control pulse signal that shifts the switch into the on state during a low voltage period in an AC component of the input pulse signal and shifts the switch to the off state during a high voltage period of the AC component, wherein the waveform shaping circuit shapes the input pulse signal into an output pulse signal whose peak-to-peak voltage is equivalent to a peak-to-peak voltage of the AC component and whose voltage during the low voltage period is set at the target constant voltage, and outputs the output pulse signal from the output.

Also, a waveform shaping circuit according to claim 2 comprises: a capacitor with one end connected to an input where an input pulse signal is inputted and another end connected to an output; a first impedance element that has one end, which is connected to the other end of the capacitor, and another end, to which a target constant voltage is applied, and supplies the target constant voltage to the other end of the capacitor; a switch circuit that includes a switch without including a diode, has one end connected to the output and has another end to which the target constant voltage is applied, applies, in a state where the switch is on, the target constant voltage to the output and stops, in a state where the switch is off, application of the target constant voltage to the output; and a switch control circuit that generates and outputs, based on the input pulse signal, a control pulse signal that shifts the switch into the on state during a high voltage period in an AC component of the input pulse signal and shifts the switch to the off state during a low voltage period of the AC component, wherein the waveform shaping circuit shapes the input pulse signal into an output pulse signal whose peak-to-peak voltage is equivalent to a peak-to-peak voltage of the AC component and whose voltage during the high voltage period is set at the target constant voltage, and outputs the output pulse signal from the output.

Also, with the waveform shaping circuit according to claim 3, in the waveform shaping circuit according to claim 1, the switch is configured to shift to the on state when the control pulse signal is at a high potential and to shift to the off state when the control pulse signal is at a low potential, and the switch control circuit includes a comparator whose inverting input terminal is connected to the other end of the capacitor, whose non-inverting input terminal inputs a reference voltage that is higher than the target constant voltage, and whose output terminal outputs the control pulse signal.

Also, with the waveform shaping circuit according to claim 4, in the waveform shaping circuit according to claim 1, the switch is configured to shift to the on state when the control pulse signal is at a low potential and to shift to the off state when the control pulse signal is at a high potential, and the switch control circuit includes a comparator whose non-inverting input terminal is connected to the other end of the capacitor, whose inverting input terminal inputs a reference voltage that is higher than the target constant voltage, and whose output terminal outputs the control pulse signal.

Also, with the waveform shaping circuit according to claim 5, in the waveform shaping circuit according to claim 2, the switch is configured to shift to the on state when the control pulse signal is at a high potential and to shift to the off state when the control pulse signal is at a low potential, and the switch control circuit includes a comparator whose non-inverting input terminal is connected to the other end of the capacitor, whose inverting input terminal inputs a reference voltage that is lower than the target constant voltage, and whose output terminal outputs the control pulse signal.

Also, with the waveform shaping circuit according to claim 6, in the waveform shaping circuit according to claim 2, the switch is configured to shift to the on state when the control pulse signal is at a low potential and to shift to the off state when the control pulse signal is at a high potential, and the switch control circuit includes a comparator whose inverting input terminal is connected to the other end of the capacitor, whose non-inverting input terminal inputs a reference voltage that is lower than the target constant voltage, and whose output terminal outputs the control pulse signal.

Also, with the waveform shaping circuit according to claim 7, in the waveform shaping circuit according to claim 1, the switch is configured to shift to the on state when the control pulse signal is at a high potential and to shift to the off state when the control pulse signal is at a low potential, and the switch control circuit includes: a comparator whose inverting input terminal is connected to the other end of the capacitor and whose output terminal outputs the control pulse signal; and a resistance voltage divider circuit that has one end connected to the output terminal, has another end to which one of the target constant voltage and a voltage in the vicinity of the target constant voltage is applied, and outputs a divided voltage, which is set by the one of the target constant voltage and the voltage in the vicinity of the target constant voltage and a voltage of the control pulse signal, as a reference voltage to a non-inverting input terminal of the comparator.

Also, with the waveform shaping circuit according to claim 8, in the waveform shaping circuit according to claim 1, the switch is configured to shift to the on state when the control pulse signal is at a low potential and to shift to the off state when the control pulse signal is at a high potential, and the switch control circuit includes: a comparator that has one of the target constant voltage and a voltage in the vicinity of the target constant voltage applied to an inverting input terminal and outputs the control pulse signal from an output terminal; and a resistance voltage divider circuit that has one end connected to the output terminal, has another end connected to the other end of the capacitor, and outputs a divided voltage pulse signal, which is set by a voltage of the output pulse signal and a voltage of the control pulse signal, to a non-inverting input terminal of the comparator.

Also, with the waveform shaping circuit according to claim 9, in the waveform shaping circuit according to claim 2, the switch is configured to shift to the on state when the control pulse signal is at a high potential and to shift to the off state when the control pulse signal is at a low potential, and the switch control circuit includes: a comparator that has one of the target constant voltage and a voltage in the vicinity of the target constant voltage applied to an inverting input terminal and outputs the control pulse signal from an output terminal; and a resistance voltage divider circuit that has one end connected to the output terminal, has another end connected to the other end of the capacitor, and outputs a divided voltage pulse signal, which is set by a voltage of the output pulse signal and a voltage of the control pulse signal, to a non-inverting input terminal of the comparator.

Also, with the waveform shaping circuit according to claim 10, in the waveform shaping circuit according to claim 2, the switch is configured to shift to the on state when the control pulse signal is at a low potential and to shift to the off state when the control pulse signal is at a high potential, and the switch control circuit includes: a comparator whose inverting input terminal is connected to the other end of the capacitor and whose output terminal outputs the control pulse signal; and a resistance voltage divider circuit that has one end connected to the output terminal, has another end to which one of the target constant voltage and a voltage in the vicinity of the target constant voltage is applied, and outputs a divided voltage, which is set by the one of the target constant voltage and the voltage in the vicinity of the target constant voltage and a voltage of the control pulse signal, as a reference voltage to a non-inverting input terminal of the comparator.

Also, with the waveform shaping circuit according to claim 11, in the waveform shaping circuit according to claim 1, the switch control circuit includes: a resistance voltage divider circuit that has one end connected to the other end of the capacitor, has another end to which the target constant voltage is applied, divides the output pulse signal, and outputs as a divided voltage pulse signal; a bias voltage source that generates a bias voltage based on the target constant voltage; and an adder that performs voltage addition of the bias voltage to the divided voltage pulse signal and outputs as the control pulse signal.

Also, with the waveform shaping circuit according to claim 12, in the waveform shaping circuit according to any one of claims 1 to 11, the switch circuit is composed of a series circuit in which a second impedance element and the switch are connected in series.

Also, with the waveform shaping circuit according to claim 13, in the waveform shaping circuit according to any one of claims 1 to 11, the other end of the capacitor is connected to the output via a third impedance element, and the switch circuit is composed of the switch (add "single" or "only" in the embodiment).

Also, with the waveform shaping circuit according to claim 14, in the waveform shaping circuit according to any one of claims 1 to 13, the switch is composed of a three-state buffer that is controlled by the control pulse signal, outputs the target constant voltage from an output terminal to the output when in the on state, and shifts the output terminal to a high impedance state when in the off state.

Also, the waveform shaping circuit according to claim 15 further comprises, in the waveform shaping circuit according to any one of claims 1 to 14, a D/A converter that performs D/A conversion on voltage data inputted from outside and outputs the target constant voltage with a voltage value indicated by the voltage data.

Also, a signal generation apparatus according to claim 16 generates, based on a two-wire differential voltage-type logic signal transferred via a communication path composed of a pair of coated conductors, a code specifying signal capable of specifying a code corresponding to the logic signal. The signal generation apparatus comprises: a fourth impedance element that is connected to one electrode out of a pair of electrodes that are respectively placed in contact with coated portions of the pair of coated conductors and generates a first voltage signal whose voltage changes in keeping with a voltage being transferred on one coated conductor, which is capacitively coupled to the one electrode, out of the pair of coated conductors; a fifth impedance element that is connected to another electrode out of the pair of electrodes and generates a second voltage signal whose voltage changes in keeping with a voltage being transferred on another coated conductor, which is capacitively coupled to the other electrode, out of the pair of coated conductors; and a differential amplifier that comprises: a differential amplifier circuit that inputs the first voltage signal and the second voltage signal and outputs a differential signal whose voltage changes in keeping with a differential voltage between the first voltage signal and the second voltage signal; and the waveform shaping circuit according to any one of claims 1, 3, 4, 7, 8, and 11, the waveform shaping circuit shaping the differential signal inputted as the input pulse signal into the output pulse signal whose peak-to-peak voltage is equivalent to a peak-to-peak voltage of an AC component of the differential signal and whose voltage during a low voltage period is set at the target constant voltage and outputting from the output as a single-ended signal, and the signal generation apparatus generates the code specifying signal based on the single-ended signal.

Also, a signal generation apparatus according to claim 17 generates, based on a two-wire differential voltage-type logic signal transferred via a communication path composed of a pair of coated conductors, a code specifying signal capable of specifying a code corresponding to the logic signal. The signal generation apparatus comprises: a fourth impedance element that is connected to one electrode out of a pair of electrodes that are respectively placed in contact with coated portions of the pair of coated conductors and generates a first voltage signal whose voltage changes in keeping with a voltage being transferred on one coated conductor, which is capacitively coupled to the one electrode, out of the pair of coated conductors; a fifth impedance element that is connected to another electrode out of the pair of electrodes and generates a second voltage signal whose voltage changes in keeping with a voltage being transferred on another coated conductor, which is capacitively coupled to the other electrode, out of the pair of coated conductors; and a differential amplifier that comprises: a differential amplifier circuit that inputs the first voltage signal and the second voltage signal and outputs a differential signal whose voltage changes in keeping with a differential voltage between the first voltage signal and the second voltage signal; and the waveform shaping circuit according to any one of claims 2, 5, 6, 9, and 10, the waveform shaping circuit shaping the differential signal inputted as the input pulse signal into the output pulse signal whose peak-to-peak voltage is equivalent to a peak-to-peak voltage of an AC component of the differential signal and whose voltage during a high voltage period is set at the target constant voltage and outputting from the output as a single-ended signal, and the signal generation apparatus generates the code specifying signal based on the single-ended signal.

Also, with the signal generation apparatus according to claim 18, in the signal generation apparatus according to either claim 16 or claim 17, the one electrode is connected to a free end-side of a first shielded cable whose base end-side is connected to the fourth impedance element, and the other electrode is connected to a free end-side of a second shielded cable whose base end-side is connected to the fifth impedance element, the second shielded cable being separate to the first shielded cable.

Also, a signal generation apparatus according to claim 19 generates, based on a two-wire differential voltage-type logic signal transferred via a communication path composed of a pair of coated conductors, a code specifying signal capable of specifying a code corresponding to the logic signal. The signal generation apparatus comprises: a differential amplifier that comprises: a differential amplifier circuit that is connected to a first current detection probe, which is attached to one coated conductor out of the pair of coated conductors, detects a current flowing through the one coated conductor with a current value which changes in keeping with a voltage being transferred on the one coated conductor, and outputs a first voltage signal whose voltage value changes in keeping with the current value, and is connected to a second current detection probe, which is attached to another coated conductor out of the pair of coated conductors, detects a current flowing through the other coated conductor with a current value which changes in keeping with a voltage being transferred on the other coated conductor, and outputs a second voltage signal whose voltage value changes in keeping with the current value, the differential amplifier circuit inputting the first voltage signal and the second voltage signal and outputting a differential signal whose voltage changes in keeping with a differential voltage between the first voltage signal and the second voltage signal; and the waveform shaping circuit according to any one of claims 1, 3, 4, 7, 8, and 11, wherein the waveform shaping circuit shapes the difference signal inputted as the input pulse signal into the output pulse signal whose peak-to-peak voltage is equivalent to a peak-to-peak voltage of an AC component of the differential signal and whose voltage during a low voltage period is set at the target constant voltage and outputs from the output as a single-ended signal, and the signal generation apparatus generates the code specifying signal based on the single-ended signal.

Also, a signal generation apparatus according to claim 20 generates, based on a two-wire differential voltage-type logic signal transferred via a communication path composed of a pair of coated conductors, a code specifying signal capable of specifying a code corresponding to the logic signal. The signal generation apparatus comprises: a differential amplifier that comprises: a differential amplifier circuit that is connected to a first current detection probe, which is attached to one coated conductor out of the pair of coated conductors, detects a current flowing through the one coated conductor with a current value which changes in keeping with a voltage being transferred on the one coated conductor, and outputs a first voltage signal whose voltage value changes in keeping with the current value, and is connected to a second current detection probe, which is attached to another coated conductor out of the pair of coated conductors, detects a current flowing through the other coated conductor with a current value which changes in keeping with a voltage being transferred on the other coated conductor, and outputs a second voltage signal whose voltage value changes in keeping with the current value, the differential amplifier circuit inputting the first voltage signal and the second voltage signal and outputting a differential signal whose voltage changes in keeping with a differential voltage between the first voltage signal and the second voltage signal; and the waveform shaping circuit according to any one of claims 2, 5, 6, 9, and 10, wherein the waveform shaping circuit shapes the difference signal inputted as the input pulse signal into the output pulse signal whose peak-to-peak voltage is equivalent to a peak-to-peak voltage of an AC component of the differential signal and whose voltage during a high voltage period is set at the target constant voltage and outputs from the output as a single-ended signal, and the signal generation apparatus generates the code specifying signal based on the single-ended signal.

Also, a signal generation apparatus according to claim 21 further comprises, in the signal generation apparatus according to any one of claims 16 to 20, a signal generator that generates the code specifying signal by comparing the single-ended signal with a threshold voltage and binarizing a result.

Also, a signal reading system according to claim 22 comprises: the signal generation apparatus according to any one of claims 16 to 21; and a coding apparatus that specifies the code corresponding to the logic signal based on the code specifying signal generated by the signal generation apparatus.

Advantageous Effects of Invention

In this way, the waveform shaping circuits according to claim 1 and claim 2 have a configuration where the switch circuit does not include a diode that would be affected by temperature. Accordingly, with these waveform shaping circuits, by using the target constant voltage, which is hardly affected by temperature, it is possible to reliably shape the input pulse signal without being affected by temperature to the output pulse signal whose peak-to-peak voltage is equivalent to the peak-to-peak voltage of the AC component of the input pulse signal and whose low potential-side voltage (the voltage during the low voltage period) is set at a constant voltage (the target constant voltage) that is not affected by temperature or to reliably shape to the output pulse signal whose peak-to-peak voltage is equivalent to the peak-to-peak voltage of the AC component of the input pulse signal and whose high potential-side voltage (the voltage during the high voltage period) is set at a constant voltage (the target constant voltage) that is not affected by temperature, and to output the output pulse signal from the output. This means that with the signal generation apparatuses according to claim 16 and claim 17 which are equipped with one of these waveform shaping circuits, it is possible to reliably generate the code specifying signal without being affected by temperature. Also, with the signal reading system according to claim 22 equipped with one of these signal generation apparatuses, it is possible to accurately read a CAN frame from a serial bus for CAN communication and reliably output a CAN frame that is the same as the read CAN frame to various CAN communication-compatible devices without being affected by temperature.

With the waveform shaping circuits according to claim 3 and claim 4, even in a state where the low potential-side voltage (that is, the voltage during the low voltage period) of the output pulse signal is set at the target constant voltage and noise is superimposed on the output pulse signal, until the voltage level of the noise reaches the reference voltage (that is, until the noise rises to the reference voltage), the switch control circuit keeps the control pulse signal at the high potential (that is, the switch in the series circuit is kept in the on state), so that it is possible to have the series circuit continue applying the target constant voltage to the other end of the capacitor (and the output). Accordingly, with these waveform shaping circuits, it is possible to reduce malfunctions due to noise. Also, with the signal generation apparatuses according to claim 16 and claim 17 equipped with one of these waveform shaping circuits, and the signal reading system according to claim 22 including one of these signal generation apparatuses, it is possible to reduce malfunctions due to noise.

With the waveform shaping circuits according to claim 5 and claim 6, even in a state where the high potential-side voltage (that is, the voltage during the high voltage period) of the output pulse signal is set at the target constant voltage and noise is superimposed on the output pulse signal, until the voltage level of the noise reaches the reference voltage (that is, until the noise falls to the reference voltage), the switch control circuit keeps the control pulse signal at the high potential (that is, the switch in the series circuit is kept in the on state), so that it is possible to have the series circuit continue applying the target constant voltage to the other end of the capacitor (and the output). Accordingly, with these waveform shaping circuits, it is possible to reduce malfunctions due to noise. Also, with the signal generation apparatuses according to claim 16 and claim 17 equipped with one of these waveform shaping circuits, and the signal reading system according to claim 22 including one of these signal generation apparatuses, it is possible to reduce malfunctions due to noise.

When the output pulse signal is the low potential-side voltage (that is, the voltage during the low voltage period) for the waveform shaping circuits according to claim 7 and claim 8 or when the output pulse signal is the high potential-side voltage (that is, the voltage during the high voltage period) for the waveform shaping circuits according to claim 9 and claim 10 and noise is superimposed on the output pulse signal, so long as the voltage level of the noise is lower than the level set by the hysteresis characteristic described above, the switch control circuit can keep the potential of the control pulse signal at the present potential (that is, when the switch in the series circuit is on, the on state is maintained, and when the switch is off, the off state is maintained), which makes it possible to keep the voltage of the output pulse signal in the present state. This means that with these waveform shaping circuits, it is possible to make a greater reduction in malfunctions due to noise. Also, with the signal generation apparatuses according to claim 16 and claim 17 equipped with one of these waveform shaping circuits, and the signal reading system according to claim 22 including one of these signal generation apparatuses, it is possible to make a further reduction in malfunctions due to noise.

With the waveform shaping circuit according to claim 11, the switch control circuit includes: a resistance voltage divider circuit that divides the output pulse signal and outputs as a divided voltage pulse signal; a bias voltage source that generates a bias voltage based on the target constant voltage; and an adder that performs voltage addition of the bias voltage to the divided voltage pulse signal and outputs as the control pulse signal. Accordingly, with this waveform shaping circuit, it is possible, even with a configuration that does not use a comparator, to reliably shape the input pulse signal into the output pulse signal whose peak-to-peak voltage is equivalent to the peak-to-peak voltage of the AC component of the input pulse signal and whose low potential-side voltage (that is, the voltage during the low voltage period) is set at the target constant voltage or to reliably shape into the output pulse signal whose peak-to-peak voltage is equivalent to the peak-to-peak voltage of the AC component of the input pulse signal and whose high potential-side voltage (that is, the voltage during the high voltage period) is set at the target constant voltage, and to output the output pulse signal from the output. By doing so, it is possible to increase the design freedom for the waveform shaping circuit.

Since the switch circuit in the waveform shaping circuit according to claim 12 is composed of a series circuit in which a second impedance element and the switch are connected in series and the switch circuit in the waveform shaping circuit according to claim 13 is composed of the switch, it is possible to simplify the configuration of the switch circuit. In particular, when the switch circuit is composed of a switch, the target constant voltage can be applied directly without passing through the second impedance element, which makes it possible to steepen rises and falls in the output pulse signal (which further reduces the time taken to shift to the target constant voltage).

With the waveform shaping circuit according to claim 14, the switch that constructs the series circuit is constructed of a three-state buffer. Accordingly, with this waveform shaping circuit, a logic IC, such as an output buffer (or input/output buffer (bidirectional buffer)) incorporated in an integrated circuit, can be used as the switch.

With the waveform shaping circuit according to claim 15, by a D/A converter that outputs the target constant voltage with a voltage value indicated by voltage data inputted from outside, by changing the voltage data, it is possible to change the high potential-side voltage (that is, the voltage during the high voltage period) and/or the low potential-side voltage (that is, the voltage during the low voltage period) set at the target constant voltage in the output pulse signal. Accordingly, it is possible to easily adjust the target constant voltage so that the input pulse signal can be reliably shaped into the output pulse signal.

With the signal generation apparatus according to Claim 18 and a signal reading system equipped with this signal generation apparatus, since the respective electrodes of the pair of electrode portions are connected to (disposed at) the free end-sides of the first shielded cable and the second shielded cable that are formed separately, it is possible to attach the electrodes at different positions along the length direction of a communication path (that is, at arbitrary positions where attachment is easy).

With the signal generation apparatuses according to Claims 19 and 20 and signal reading systems equipped with these signal generation apparatuses, by performing a simple task of attaching current detection probes (clamping when the probes are clamp-shaped) at arbitrary locations in the longitudinal direction of the pair of coated conductors, it is possible to generate a single-ended signal that makes it possible to generate a code specifying signal capable of specifying codes indicated by a logic signal being transferred via the pair of coated conductors. Accordingly, by providing a device capable of generating the code specifying signal based on the single-ended signal, it is possible to generate the code specifying signal, to specify codes indicated by the logic signal based on the generated code specifying signal, and to specify a code string composed of a string of the specified codes. By doing so, when a connector is not installed on the pair of coated conductors, or even when a connector is installed on the pair of coated conductors, it is possible to read the logic signal at arbitrary locations on the pair of coated conductors and specify both the codes and the code string.

With the signal generation apparatus according to claim 21 and the signal reading system according to claim 22 equipped with this signal generation apparatus, by including a signal generator, it is possible to avoid the burden of having to separately provide an apparatus for generating the code specifying signal based on the single-ended signal.

DESCRIPTION OF EMBODIMENTS

Figure 1:
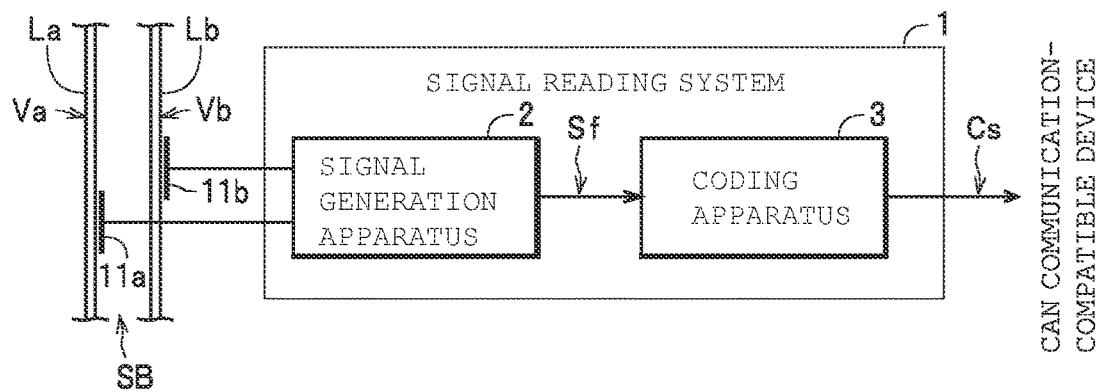
FIG. 1 is a block diagram depicting the configuration of a signal reading system 1.

Preferred embodiments of a signal generation apparatus, a signal reading system, and a waveform shaping circuit included in this signal generation apparatus will be described with reference to the accompanying drawings.

The signal generation apparatus generates, based on a two-wire differential voltage-type logic signal that is transferred via a communication path composed of a pair of coated conductors, a code specifying signal that is capable of specifying codes corresponding to a logic signal. This signal reading system is a system that specifies codes corresponding to the above logic signal based on the code specifying signal generated by the signal generation apparatus and also specifies a code string composed of the specified codes. This signal reading system can be configured to be compatible with various "two-wire differential voltage-type logic signals" that comply with various communication protocols such as "CAN protocol", "CAN FD", and "FlexRay (registered trademark)" and/or various "two-wire differential voltage-type logic signals" that comply with various communication protocols that enable low-amplitude, low-power communication using "LVDS". For a "serial bus for CAN communication" that uses "CAN protocol" and "CAN FD", the "high potential-side signal line (CANH) and low potential-side signal line (CANL)" correspond to "a pair of coated conductors for transferring logic signals". For a "serial bus for FlexRay communication", the "positive-side signal line (BP) and negative-side signal line (BM)" correspond to "a pair of coated conductors for transferring logic signals". For a "serial bus that communicates according to LVDS", the "positive logic-side signal line and negative logic-side signal line" correspond to "a pair of coated conductors for transferring logic signals". Since the signal reading system has a function of specifying codes and code strings corresponding to the logic signals mentioned above, the signal reading system also functions as an analyzer that detects logic signals being transferred on a communication path. In addition, when configured to store a detected code string in a memory, the signal reading system also functions as a recording apparatus (or "recorder").

In the following description, as examples, a signal generation apparatus and a signal reading system are used for a "serial bus for CAN communication" and are disposed between a serial bus for CAN communication (the "communication path") and various electronic devices, which operate by acquiring various CAN frames (that is, strings of codes indicated by two-wire differential voltage-type logic signals (hereinafter, also referred to as "code strings")) from the serial bus. In more detail, an example configuration where logic signals are read from a communication path installed in an automobile and various processes using the corresponding code strings (CAN frames) are executed in an external device (or "CAN communication-compatible device") will be described.

The signal reading system 1 depicted in FIG. 1 is one example of a "signal reading system" for the present invention, and includes a signal generation apparatus 2 (one example of a "signal generation apparatus" for the present invention) and a coding apparatus 3 (one example of a "coding apparatus" for the present invention). This signal reading system 1 is configured to read CAN frames (one example of "logic signals transferred via a communication path") from a serial bus SB for CAN communication (one example of a "communication path") installed in an automobile and to output CAN frames Cs (one example of "code strings corresponding to logic signals") that are the same as the read CAN frames to various CAN communication-compatible devices (that is, the signal reading system 1 is configured as a "CAN bus analyzer").

Figure 2:
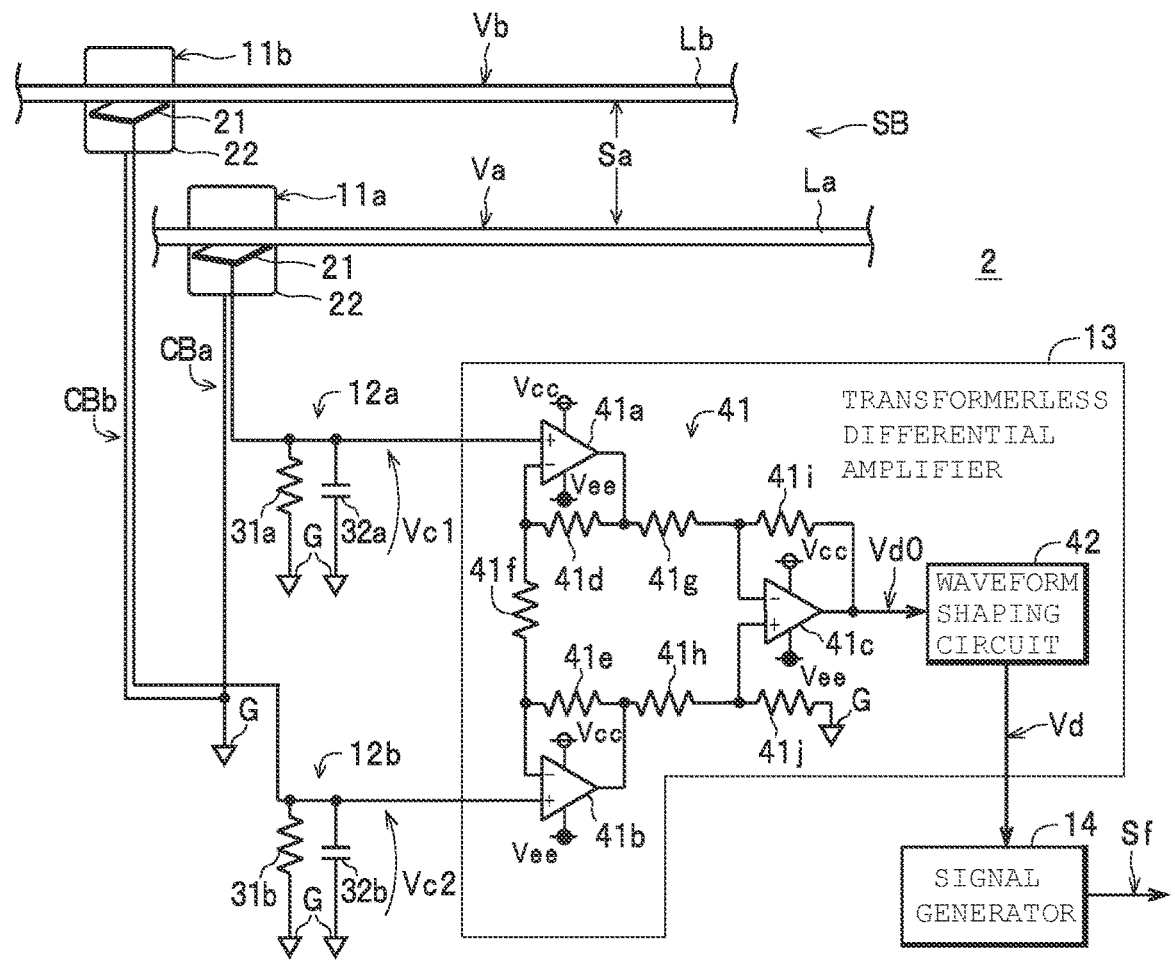
FIG. 2 is a block diagram depicting the configuration of a signal generation apparatus 2.

With this configuration, during communication that conforms to CAN protocol performed via the serial bus SB, as depicted in FIG. 2, a logic signal Sa that expresses the respective codes constructing a CAN frame (or "code string") is transferred as a differential signal for a potential difference (Va−Vb) between the voltage Va of a voltage signal transferred on a coated conductor La as the CANHigh (or "CANH") signal line out of two signal lines on the serial bus SB (hereinafter, for ease of understanding, the voltage signal itself is also referred to as the "voltage signal Va") and the voltage Vb of a voltage signal transferred on a coated conductor Lb as the CANLow (or "CANL") signal line out of the two signal lines (hereinafter, for ease of understanding, the voltage signal itself is also referred to as the "voltage signal Vb").

Figure 6:
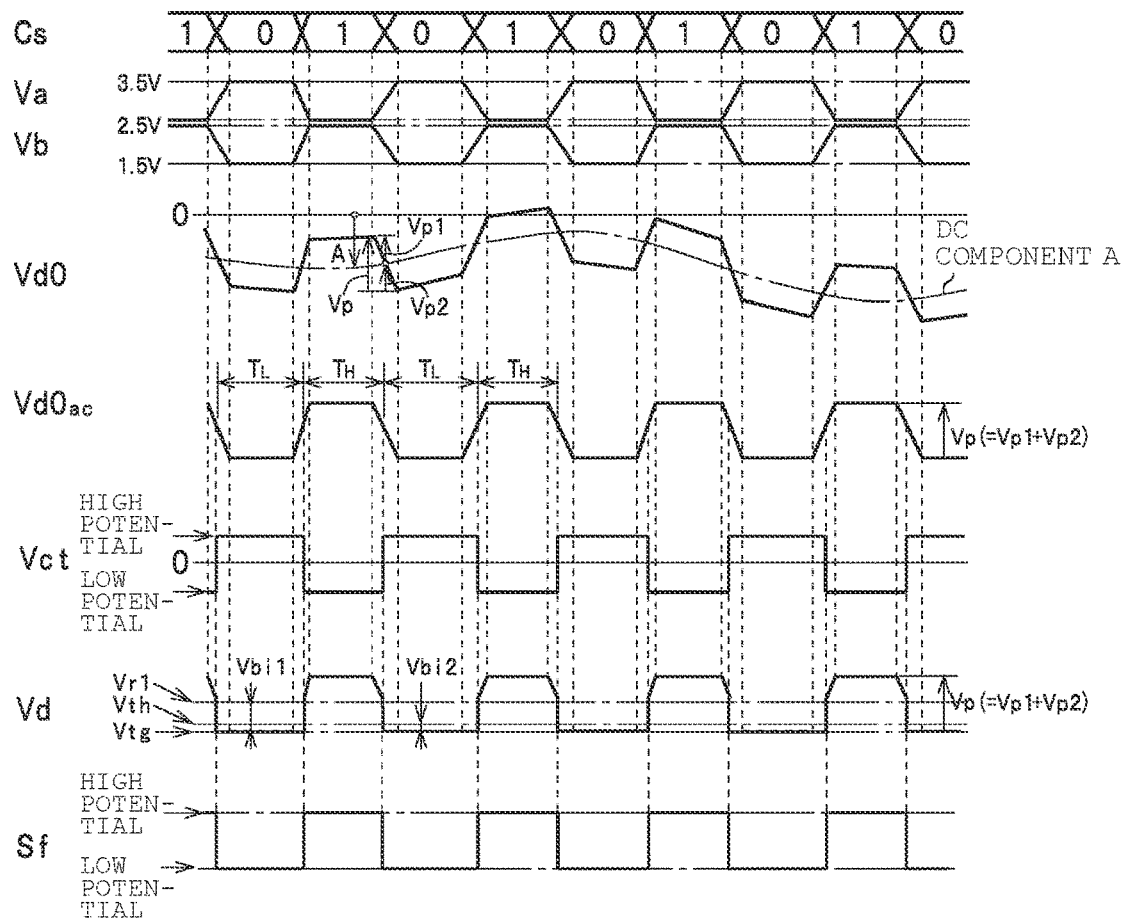
FIG. 6 is a waveform diagram useful in explaining the operation of a signal generation apparatus 2 equipped with the waveform shaping circuit 42 and the signal generator 14 in FIG. 5.

Note that since the principles for transferring the logic signal Sa via the serial bus SB are well known, detailed description is omitted here. However, the specifications of the CANHigh (CANH) voltage signal Va and the CANLow (CANL) voltage signal Vb will be described in brief. As depicted in FIG. 6, the voltage signals Va and Vb are voltage signals that change in opposite directions from the base voltage (+2.5V), and when the voltage signal Va is this base voltage, the voltage signal Vb will also be the same base voltage over the same period, with the code Cs (logical value) that composes the CAN frame transferred during this period where the potential difference (Va−Vb) is zero (that is, the minimum value) indicating "1". On the other hand, when the voltage signal Va is a set voltage (+3.5V) that is higher than the base voltage, during the same period, the voltage signal Vb will be a different set voltage (+1.5V) that is conversely lower than the base voltage, with the code Cs (logical value) that composes the CAN frame transferred during this period where the potential difference (Va−Vb) is maximized indicating "0". In addition, "SG", which is a signal line that serves as the reference potential for transferring differential signals on the serial bus SB, and signal lines and power lines disposed for purposes aside from transferring differential signals have been omitted from the description and drawings.

As depicted in FIG. 2, the signal generation apparatus 2 is equipped with electrode portions 11a and 11b, impedance elements 12a and 12b, a differential amplifier 13, and a signal generator 14. The signal generation apparatus 2 generates, as depicted in FIG. 6, a code specifying signal Sf capable of specifying codes Cs ("1" or "0") corresponding to differential signals, which are codes Cs (the potential difference (Va−Vb)) corresponding to the voltage signals Va and Vb, based on a two-wire differential voltage-type logic signal Sa (in this example, the voltage signal Va on the coated conductor La side and the voltage signal Vb on the coated conductor Lb side) transferred via a serial bus SB composed of a pair of coated conductors La and Lb (hereinafter, also collectively referred to as the "coated conductors L" when no distinction is made).

The electrode portions 11a and 11b have the same configuration and each include an electrode 21 and a shield 22. The electrode portions 11a and 11b are configured to be detachable from an arbitrary one of the coated conductors La and Lb. Note that for ease of understanding, as depicted in FIGS. 1 and 2, it is assumed here that the electrode portion 11a is attached to the coated conductor La, and the electrode portion 11b is attached to the coated conductor Lb. The electrode portions 11a and 11b are configured so that in the state where the corresponding coated conductor L is attached, each electrode 21 comes into contact with (or touches) an insulation-coated portion (hereinafter, also simply referred to as the "coated portion") of the coated conductor L. With this configuration, the respective electrodes 21 of the electrode portions 11a and 11b become capacitively coupled in a contactless state (that is, a state with no metallic contact) with the metal portions (core wires) of the corresponding coated conductors La and Lb. In a state where the electrode portions 11a and 11b are attached to the corresponding coated conductors La and Lb, the shields 22 cover the parts of the coated portions of the coated conductors La and Lb that are in contact with the electrodes 21 and also the electrodes 21 themselves, which prevents the electrodes 21 from becoming capacitively coupled to metal portions aside from the metal portions of the corresponding coated conductors La.

As one example in the present embodiment, the impedance element 12a includes a resistor 31a and a capacitor 32a connected in parallel to the resistor 31a, and the impedance element 12b includes a resistor 31b (with the same resistance value as the resistor 31a) and a capacitor 32b (with the same capacitance value as the capacitor 32a) that is connected in parallel to the resistor 31b. In the impedance element 12a as a fourth impedance element, the resistor 31a is composed of a resistor with a high resistance value (that is, a high impedance resistor of at least several MD). One end (that is, one end of the impedance element 12a) is connected to the electrode 21 of the electrode portion 11a (hereinafter, also referred to as "the first electrode 21") via the core wire of a shielded cable (coaxial cable) CBa (hereinafter, also referred to as the "first shielded cable CBa"). The other end (that is, the other end of the impedance element 12a) is connected to a location at a reference potential (that is, the ground G) of the signal generation apparatus 2. Likewise, in the impedance element 12b as a fifth impedance element, the resistor 31b is composed of a resistor with a high resistance value (that is, a high impedance resistor of at least several MΩ). One end (that is, one end of the impedance element 12b) is connected to the electrode 21 (hereinafter, the "second electrode 21") of the electrode portion 11b via the core wire of a shielded cable (coaxial cable) CBb (hereinafter, also referred to as the "second shielded cable CBb"). The other end (that is, the other end of the impedance element 12b) is connected to the ground G. The electrode portion 11a-side end of the shield of the shielded cable CBa is connected to the shield 22 of the electrode portion 11a, and the impedance element 12a-side end is connected to the ground G. Likewise, the electrode portion 11b-side end of the shield of the shielded cable CBb is connected to the shield 22 of the electrode portion 11b, and the impedance element 12b-side end is connected to the ground G.

With this configuration, a first voltage signal Vc1 whose voltage changes in keeping with the voltage Va of the voltage signal Va transferred on the coated conductor La that is capacitively coupled to the electrode 21 of the electrode portion 11a (that is, whose voltage becomes low when the voltage Va is the base voltage described above and becomes high when the voltage Va is the high set voltage described above) is generated across both ends of the impedance element 12a. Likewise, a second voltage signal Vc2 whose voltage changes in keeping with the voltage Vb of the voltage signal Vb transferred on the other coated conductor Lb that is capacitively coupled to the electrode 21 of the electrode portion 11b (that is, whose voltage becomes high when the voltage Vb is the base voltage described above and becomes low when the voltage Vb is the low set voltage described above) is generated across both ends of the impedance element 12b. Also, since both the first voltage signal Vc1 and the second voltage signal Vc2 are signals detected using capacitive coupling, the DC level (or "DC component") changes in keeping with changes in the voltage signals Va and Vb (that is, changes in the pulse lengths of the voltage signals Va and Vb and/or changes in pulse density).

Note that the impedance elements 12a and 12b are not limited to the above configuration (that is, a parallel circuit composed of the resistor 31a and the capacitor 32a and a parallel circuit composed of the resistor 31b and the capacitor 32b). As one example, it is also possible to configure circuits with only the resistor 31a and the resistor 31b, and circuits with only the capacitor 32a and the capacitor 32b. Also, the capacitors 32a and 32b may be composed of discrete parts, or may be composed of the wiring capacitances (that is, the capacitances formed between the core wires and shields) of the shielded cables (coaxial cables) CBa and CBb that connect the impedance elements 12a and 12b and the corresponding electrodes 21.

The differential amplifier 13 inputs the first voltage signal Vc1 and the second voltage signal Vc2, and outputs a single-ended signal Vd whose voltage changes in keeping with the differential voltage (Vc1−Vc2) between the voltage signals Vc1 and Vc2.

In more detail, as depicted in FIG. 2, the differential amplifier 13 includes a differential amplifier circuit 41 and a waveform shaping circuit 42. The differential amplifier circuit 41 and the waveform shaping circuit 42 do not use a transformer and as described later and are configured as transformerless differential amplifiers by being mainly composed of an operational amplifier and/or a comparator. Also, as one example in the present embodiment, the differential amplifier circuit 41 has three operational amplifiers 41a, 41b, and 41c that operate on a positive power supply voltage Vcc and a negative power supply voltage Vee (as one example, ±10V), and seven resistors 41d, 41e, 41f, 41g, 41h, 41i, and 41j, and has the overall configuration of an instrumentation amplifier. In the differential amplifier circuit 41, the non-inverting input terminal of the operational amplifier 41a is connected to one end of the impedance element 12a, and the resistor 41d (a feedback resistor) is connected between the inverting input terminal and the output terminal. The non-inverting input terminal of the operational amplifier 41b is connected to one end of the impedance element 12b, and a resistor 41e (that is, a feedback resistor with the same resistance value as the resistor 41d) is connected between the inverting input terminal and the output terminal. The respective inverting input terminals of the operational amplifier 41a and the operational amplifier 41b are connected via a resistor 41f (a common input resistor for the operational amplifier 41a and the operational amplifier 41b). The inverting input terminal of the operational amplifier 41c is connected via a resistor 41g (one input resistor) to the output terminal of the operational amplifier 41a, the non-inverting input terminal is connected via a resistor 41h (another input resistor that has the same resistance value as the resistor 41g) to the output terminal of the operational amplifier 41b, a resistor 41i (feedback resistor) is connected between the inverting input terminal and the output terminal, and the inverting input terminal is connected via a resistor 41j (with the same resistance value as the resistor 41i) to the ground G. With this configuration, the operational amplifier 41c functions as a differential amplifier that amplifies and outputs the difference between the output signals outputted from the operational amplifiers 41a and 41b.

By using this configuration, the differential amplifier circuit 41 inverts and amplifies a differential voltage (Vc1−Vc2) for the voltage signals Vc1 and Vc2 with a known amplification factor set by the resistance values of the resistors 41d, 41e, 41f, 41g, and 41i and outputs a differential signal Vd0 as a voltage signal. This differential signal Vd0 is a voltage signal that becomes a high potential-side voltage during a period where a code Cs (="1") that constructs a CAN frame (code string) is being transferred on the serial bus SB (that is, when the voltages Va and Vb are both the base voltage) and becomes a low potential-side voltage during a period where a code Cs (="0") that constructs a CAN frame is being transferred (that is, when the voltage Va is the high set voltage and the voltage Vb is the low set voltage). Also, as described above, since the voltage signals Vc1 and Vc2 are signals whose DC levels change in keeping with changes in the voltage signals Va and Vb, the differential signal Vd0 generated based on the voltage signals Vc1 and Vc2 is also a signal whose DC level (DC component) changes, although this change in DC level is reduced in the differential amplification circuit 41.

Figure 3:
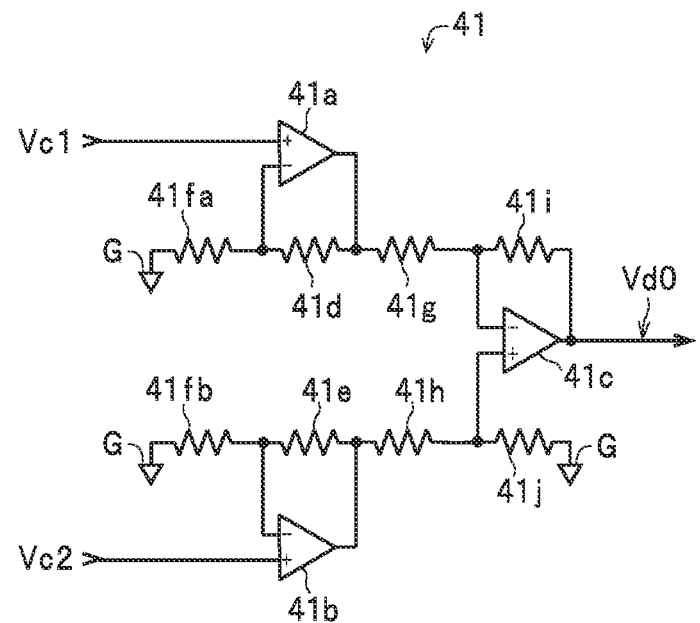
FIG. 3 is a circuit diagram depicting another configuration of a differential amplifier circuit 41.

Note that although the differential amplifier circuit 41 uses a configuration (that is, an instrumentation amplifier configuration) where the input resistance connected to the respective inverting input terminals of the operational amplifier 41a and the operational amplifier 41b is composed of the common resistor 41f, the differential amplifier circuit 41 is not limited to this configuration. As one example, as depicted in FIG. 3, it is also possible to use a configuration where a resistor 41fa is connected to the inverting input terminal of the operational amplifier 41a as a separate input resistor, this inverting input terminal is connected to the ground G via the resistor 41fa, a resistor 41fb (with the same resistance value as the resistor 41fa) is connected to the inverting input terminal of the operational amplifier 41b as a separate input resistor, and this inverting input terminal is connected to the ground G via the resistor 41fb. With this configuration also, the differential amplifier circuit 41 amplifies the differential voltage (Vc1−Vc2) described above with a known amplification factor set by the resistance values of the resistors 41d, 41e, 41fa, 41fb, 41g, and 41i and outputs the differential signal Vd0.

Figure 4:
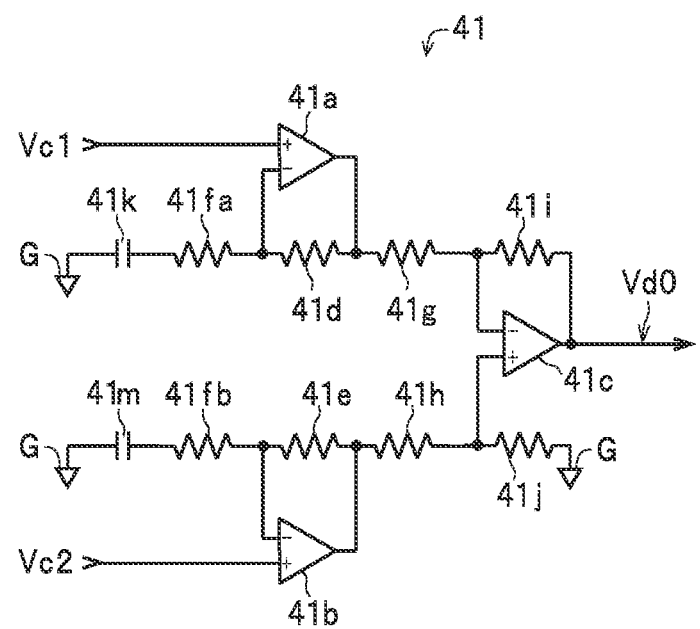
FIG. 4 is a circuit diagram depicting another configuration of a differential amplifier circuit 41.

The differential amplifier circuit 41 described above and depicted in FIG. 3 is configured so that the operational amplifier 41a and the operational amplifier 41b amplify not only the AC component of the voltage signals Vc1 and Vc2 but also the DC component. This means that when the DC component is large, the output signals outputted from the output terminals of the operational amplifier 41a and the operational amplifier 41b may be saturated. To reduce saturation in the output signals, like the differential amplifier circuit 41 depicted in FIG. 4, it is possible to use a configuration where a capacitor 41k is connected in series with the resistor 41fa connected between the inverting input terminal of the operational amplifier 41a and the ground G and a capacitor 41m is connected in series with a resistor 41fb connected between the inverting input terminal of the operational amplifier 41b and the ground G. Since the operational amplifier 41a and the operational amplifier 41b with this configuration operate so as to amplify only the AC components of the respective voltage signals Vc1 and Vc2 without amplifying the DC components, it is possible to significantly reduce the occurrence of saturation in the output signals outputted from the output terminals due to the DC components of the voltage signals Vc1 and Vc2.

The waveform shaping circuit 42 inputs the differential signal Vd0 and performs shaping (waveform shaping) on the differential signal Vd0 to produce a single-ended signal Vd whose peak-to-peak voltage (or "peak-peak voltage") is equivalent to the peak-to-peak voltage (or "peak-peak voltage") of the AC component of the differential signal Vd0 and whose either high potential-side voltage (that is, the voltage during a high voltage period) or low potential-side voltage (that is, the voltage during a low voltage period) is set at a target constant voltage Vtg set in advance. With this configuration, the waveform shaping circuit 42 can be regarded as a reference potential fixing circuit that fixes either the high or low potential-side voltage of the single-ended signal Vd at a reference potential of the signal (that is, the voltage when the peak-peak voltage is zero volts, in the present embodiment, the target constant voltage Vtg).

Figure 5:
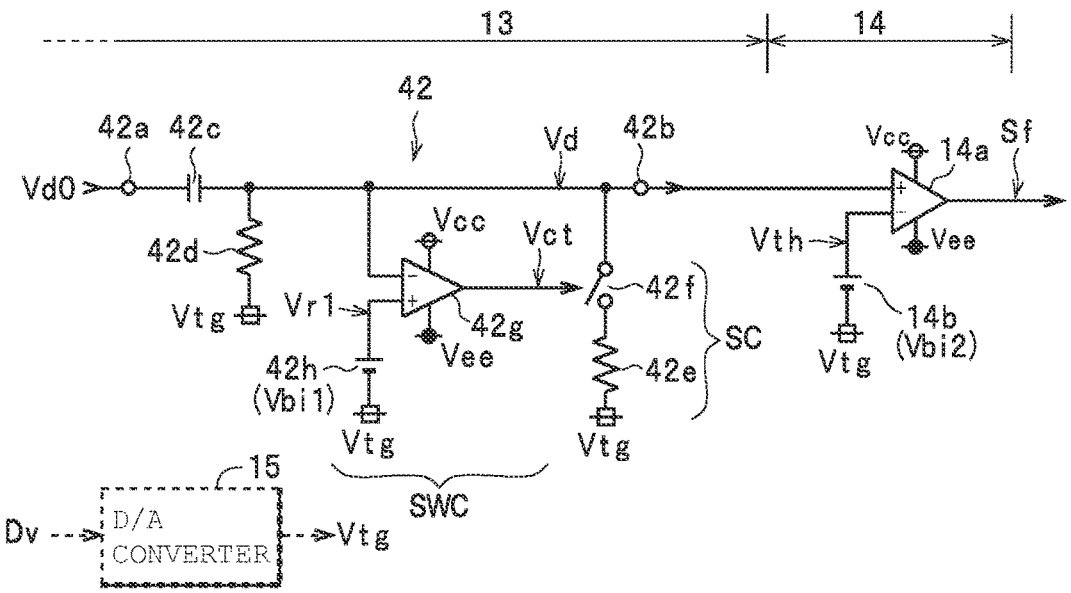
FIG. 5 is a circuit diagram depicting the configuration of a waveform shaping circuit 42 in FIG. 2 and a signal generator 14.

As one example, as depicted in FIG. 5, the waveform shaping circuit 42 is equipped with an input 42a into which the differential signal Vd0 is inputted as an input pulse signal, an output 42b that outputs the single-ended signal Vd as an output pulse signal, a capacitor 42c, a first impedance element 42d, a switch circuit SC which includes a switch 42f but does not include a diode (as described later, a switch circuit with a series circuit composed of a second impedance element 42e and the switch 42f that are connected in series), and a switch control circuit SWC that is constructed of a comparator or the like and generates and outputs a control pulse signal Vct that shifts the switch 42f from the on state to the off state and from the off state to the on state based on the differential signal Vd0.

In more detail, one end of the capacitor 42c is connected to the input 42a and the other end is connected to the output 42b. The first impedance element 42d is composed for example of a resistance (one resistor or a resistance circuit composed of a plurality of resistors connected in series or in parallel), with one end of the first impedance element 42d connected to the other end of the capacitor 42c and the target constant voltage Vtg applied to the other end of the first impedance element 42d so that the target constant voltage Vtg is supplied to the other end of the capacitor 42c (and to the output 42b). Note that the target constant voltage Vtg is set in advance at an arbitrary constant voltage that is lower than the positive power supply voltage Vcc but higher than the negative power supply voltage Vee. Although the first impedance element 42d may be constructed, as depicted in FIG. 5, of a single resistor (with one end connected to the other end of the capacitor 42c and the target constant voltage Vtg applied to the other end) as the simplest configuration, the first impedance element 42d is not limited to this configuration. Although not illustrated, the first impedance element 42d may be configured by using an inductor together with a resistor or in place of a resistor. Note that the total impedance value (which is the resistance value when the configuration only includes resistors) of the first impedance element 42d is set at a value (as one example, when only resistors are used, a value of several kΩ to several hundred kΩ) that is larger than the impedance value of the second impedance element 42e (which is the resistance value when the second impedance element 42e only includes resistors).

As one example, as depicted in FIG. 5, the switch circuit SC is constructed of a series circuit composed of the second impedance element 42e and the switch 42f that are connected in series. The switch circuit SC has one end connected to the other end of the capacitor 42c (and to the output 42b) and the target constant voltage Vtg applied to the other end. With this configuration, when the switch 42f has been shifted to the on state by the control pulse signal Vct outputted from the switch control circuit SWC, the switch circuit SC applies the target constant voltage Vtg to the other end of the capacitor 42c (and to the output 42b) but when the switch 42f has been shifted to the off state, the application of the target constant voltage Vtg to the other end of the capacitor 42c (and to the output 42b) is stopped. Since the switch circuit SC does not include a diode whose forward voltage would tend to fluctuate according to temperature, it is possible to apply the target constant voltage Vtg as it is to the other end of the capacitor 42c without being affected by fluctuations in temperature.

Provided that the switch 42f is a semiconductor switch whose impedance is low in the on state and the target constant voltage Vtg applied to the other end of the switch circuit SC can be applied to the output 42b via the second impedance element 42e (as one example, a resistor with a sufficiently low resistance value compared to the overall resistance value of the first impedance element 42d), the switch 42f may be constructed of various types of semiconductor switches, such as an analog switch, a bipolar transistor, or a field effect transistor. Also, as one example in the present embodiment, the switch 42f is configured to shift to the on state when the control pulse signal Vct is at a high potential and to shift to the off state when the control pulse signal Vct is at a low potential (that is, to operate with positive logic, also known as "active high").

In one example in the present embodiment, the second impedance element 42e is constructed of a resistor whose resistance value is set sufficiently low so that the target constant voltage Vtg applied to the other end can be supplied to the other end of the capacitor 42c (and to the output 42b) with a low impedance when the switch 42f is on. However, the resistance value of the second impedance element 42e is set at a resistance value (as one example, a resistance value of about ten-odd Ω to several tens of Ω) such that even when the switch 42f is in the on state (that is, a state where the target constant voltage Vtg is being supplied), the voltage at the other end of the capacitor 42c may slightly fluctuate from the target constant voltage Vtg due to the influence of voltage changes when the differential signal Vd0 falls or rises (that is, the voltage at the other end of the capacitor 42c may fall momentarily when the differential signal Vd0 falls, or rise momentarily when the differential signal Vd0 rises). The second impedance element 42e may be constructed of one resistor as depicted in FIG. 5 as the simplest configuration, but may also be constructed by connecting a plurality of resistors in series or in parallel. Also, although not illustrated, the second impedance element 42e may be constructed using an inductor together with a resistor or in place of a resistor. The order in which the second impedance element 42e and the switch 42f are aligned in the switch circuit SC may also be the reverse order to the order depicted in FIG. 5.

The switch control circuit SWC is constructed without using a diode and for the configuration depicted in FIG. 5, outputs, as depicted in FIG. 6, the control pulse signal Vct that becomes a high potential (or "high level", as one example, a voltage level in the vicinity of the positive power supply voltage Vcc for the comparator 42g described later) to cause the switch 42f to shift to the on state during the low voltage period $T_L$ in the AC component $Vd0_{ac}$ (see FIG. 6) of the differential signal Vd0 inputted into the input 42a and becomes a low potential (or "low level", as one example, a voltage level in the vicinity of the negative power supply voltage Vee for the comparator 42g described later) to cause the switch 42f to shift to the off state during the high voltage period $T_H$ in the AC component $Vd0_{ac}$.

In more detail, as depicted in FIG. 5, the switch control circuit SWC includes one comparator 42g, which operates on the positive power supply voltage Vcc and the negative power supply voltage Vee, and one reference power supply 42h that outputs a DC constant voltage (or "bias voltage") Vbi1 (≠0 volt). The negative electrode side of the reference power supply 42h is connected to the target constant voltage Vtg, so that a voltage (Vtg+Vbi1) produced by adding the DC constant voltage Vbi1 to the target constant voltage Vtg is outputted from the positive electrode side as the reference voltage (or "first reference voltage") Vr1. The DC constant voltage Vbi1 is set at a voltage value of several percent to ten-odd percent, for example, of the peak-to-peak voltage Vp (see FIG. 6) of the AC component $Vd0_{ac}$ of the differential signal Vd0. Accordingly, the reference voltage Vr1 is set at a voltage that is slightly higher than the target constant voltage Vtg. The comparator 42g is configured with the inverting input terminal connected to the other end of the capacitor 42c and, by having the reference voltage Vr1 inputted into this non-inverting input terminal, outputs the control pulse signal Vct described above from the output terminal.

The operation of the waveform shaping circuit 42 when the switch 42f shifts to the on state in low voltage periods $T_L$ in the AC component $Vd0_{ac}$ and shifts to the off state in high voltage periods $T_H$ in the AC component $Vd0_{ac}$ according to this control pulse signal Vct will now be described. Note that although for ease of understanding, the differential signal Vd0 is depicted in FIG. 6 in a state where the DC component A of the differential signal Vd0 fluctuates greatly within one cycle of the AC component $Vd0_{ac}$ of the differential signal Vd0, in reality, due to low-frequency noise of below 100 Hz, such as a commercial power frequency, being superimposed, the DC component A fluctuates with a sufficiently long cycle compared to one cycle (usually several µs or less) of the AC component $Vd0_{ac}$. For this reason, the following description will assume that the DC component A is substantially constant within one cycle of the AC component $Vd0_{ac}$ of the differential signal Vd0. The peak-to-peak voltage of the AC component $Vd0_{ac}$ is indicated by the symbol "Vp", and it is assumed that the voltage value of the differential signal Vd0 in the high voltage periods $T_H$ is higher by a voltage Vp1 than the DC component A and the voltage value of the differential signal Vd0 in the low voltage periods $T_L$ is lower by a voltage Vp2 than the DC component A. Any sag that occurs in the single-ended signal Vd is assumed to be negligible.

First, in the low voltage period $T_L$ where the switch 42f is turned on, the target constant voltage Vtg is supplied from the switch circuit SC via the second impedance element 42e with a low impedance, so that the voltage at the other end of the capacitor 42c (and the output 42b), that is, the single-ended signal Vd is set at the target constant voltage Vtg as depicted in FIG. 6. Since it is the low voltage period $T_L$, the voltage at one end of the capacitor 42c (that is, the input 42a-side end) to which the differential signal Vd0 is applied becomes a voltage (A−Vp2). This means that when the voltage at the one end of the capacitor 42c is assumed to be a positive voltage with the voltage at the other end set at the target constant voltage Vtg as a reference, the capacitor 42c is charged by a voltage (A−Vp2−Vtg).

From this state, when it becomes the high voltage period $T_H$ where the switch 42f is placed in the off state, the supplying of the target constant voltage Vtg from the switch circuit SC is stopped and the voltage at the one end of the capacitor 42c (the input 42a-side end) becomes the voltage (A+Vp1). As a result, the voltage at the other end of the capacitor 42c (and the output 42b) becomes a voltage (A+Vp1−(A−Vp2−Vtg)) obtained by subtracting the voltage (A−Vp2−Vtg) from the voltage (A+Vp1), or in other words, the voltage (Vp1+Vp2+Vtg). The voltage (Vp1+Vp2) is the peak-to-peak voltage Vp of the AC component $Vd0_{ac}$. From this, the voltage (Vp1+Vp2+Vtg), which is the voltage at the one end (the input 42a-side end) of the capacitor 42c, that is, the single-ended signal Vd is set at the voltage (Vp+Vtg) as depicted in FIG. 6.

From the above, in the waveform shaping circuit 42 depicted in FIG. 5, the switch control circuit SWC alternately shifts the switch 42f between the on state and the off state, so that as depicted in FIG. 6, the differential signal Vd0 (that is, a signal where the DC component A has been superimposed on the AC component $Vd0_{ac}$ of the peak-to-peak voltage Vp) is shaped (that is, subjected to waveform shaping) into the single-ended signal Vd whose peak-to-peak voltage Vp is equivalent to the peak-to-peak voltage Vp of the AC component $Vd0_{ac}$ of the differential signal Vd0 and whose low potential-side voltage (the voltage during the low voltage period $T_L$) is set at the target constant voltage Vtg and then outputted from the output 42b. That is, the waveform shaping circuit 42 has a function of removing the DC component A superimposed on the differential signal Vd0 (that is, of removing low-frequency noise). By doing so, the waveform shaping circuit 42 outputs a signal whose voltage changes in response to changes in the codes Cs that construct a CAN frame, that is, the single-ended signal Vd whose voltage is a low potential (the target constant voltage Vtg) during periods where the code Cs is "0" and is a high potential during periods where the code Cs is "1".

Next, the operation when the comparator 42g of the switch control circuit SWC outputs the control pulse signal Vct will be described.

When the AC component $Vd0_{ac}$ switches from the low voltage period $T_L$ to the high voltage period $T_H$ (that is, when the AC component $Vd0_{ac}$ rises), the voltage (that is, the voltage at the other end of the capacitor 42c, that is, the voltage of the single-ended signal Vd) of the output 42b to which the target constant voltage Vtg is applied from the switch circuit SC with a low impedance via the second impedance element 42e is affected by the change in the voltage of the AC component $Vd0_{ac}$ and momentarily rises from the target constant voltage Vtg to exceed the reference voltage Vr1. Accordingly, the comparator 42g shifts the control pulse signal Vct from the high potential to the low potential, as depicted in FIG. 6. Here, since the switch 42f in the switch circuit SC shifts to the off state, the application of the target constant voltage Vtg to the output 42b by the switch circuit SC is stopped and the voltage of the single-ended signal Vd shifts to a voltage (Vp+Vtg). As a result, the voltage of the single-ended signal Vd is thereafter maintained in a state that exceeds the reference voltage Vr1. Note that in the low voltage period $T_L$ of the AC component $Vd0_{ac}$, the voltage of the single-ended signal Vd becomes the target constant voltage Vtg as described above, and the inverting input terminal of the comparator 42g also becomes the target constant voltage Vtg. However, since the reference voltage Vr1 (=Vtg+Vbi1) inputted into the non-inverting input terminal of the comparator 42g is higher than (that is, not the same voltage as) the target constant voltage Vtg, the comparator 42g continuously outputs the control pulse signal Vct at the high potential (that is, the application of the target constant voltage Vtg from the switch circuit SC to the output 42b is continued).

When the AC component $Vd0_{ac}$ switches from the high voltage period $T_H$ to the low voltage period $T_L$ (that is, when the AC component $Vd0_{ac}$ falls), the voltage of the single-ended signal Vd falls from the voltage (Vp+Vtg) in keeping with the fall in the voltage of the AC component $Vd0_{ac}$ and falls below the reference voltage Vr1. Accordingly, the comparator 42g shifts the control pulse signal Vct from the low potential to the high potential as depicted in FIG. 6. In this case, the switch 42f in the switch circuit SC shifts to the on state. This means that the application of the target constant voltage Vtg to the output 42b by the switch circuit SC starts and the voltage of the single-ended signal Vd is thereafter maintained at the target constant voltage Vtg, which is lower than the reference voltage Vr1.

As one example, as depicted in FIG. 5, the signal generator 14 includes one comparator 14a that operates on the positive power supply voltage Vcc and the negative power supply voltage Vee, and one reference power supply 14b that outputs a DC constant voltage (or "bias voltage") Vbi2 (≠0 volt). The negative electrode side of the reference power supply 14b is connected to the target constant voltage Vtg, and the reference power supply 14b outputs a voltage (Vtg+Vbi2) obtained by adding the DC constant voltage Vbi2 to the target constant voltage Vtg from the positive electrode side as a threshold voltage Vth. The DC constant voltage Vbi2 is set at a voltage value of several percent to ten-odd percent, for example, of the peak-to-peak voltage Vp for the AC component $Vd0_{ac}$ of the differential signal Vd0. Accordingly, the threshold voltage Vth is set at a voltage that is slightly higher than the target constant voltage Vtg. Note that the relative magnitudes of the threshold voltage Vth and the reference voltage Vr1 described above may be such that the voltages are equal, or one voltage may be higher than the other (Note that in the example in FIG. 6, the reference voltage Vr1 is higher than the threshold voltage Vth).

The comparator 14*a* has its non-inverting input terminal connected to the output 42*b*, has the threshold voltage Vth inputted into the inverting input terminal, and outputs the code specifying signal Sf from the output terminal by comparing the single-ended signal Vd outputted from the output 42*b* with the threshold voltage Vth and binarizing the result. As described above, since the threshold voltage Vth is set at a voltage that is slightly higher than the target constant voltage Vtg, as depicted in FIG. 6, the signal generator 14 provided with the comparator 14*a* reliably binarizes the single-ended signal Vd (that is, a signal where the peak-to-peak voltage is the voltage Vp and the low potential-side voltage is set at the target constant voltage Vtg) using the threshold voltage Vth, and generates and outputs the code specifying signal code specifying signal Sf that has a high potential (the maximum output voltage of the comparator 14*a*) during a period where a code Cs that constructs a CAN frame being transferred via the serial bus SB is "1" and a low potential (the minimum output voltage of the comparator 14*a*) during a period where a code Cs is "0".

As described above, although the target constant voltage Vtg is set at an arbitrary constant voltage that is below the positive power supply voltage Vcc and is above the negative power supply voltage Vee, in the waveform shaping circuit 42 and the signal generator 14 with the configuration depicted in FIG. 5, the target constant voltage Vtg is normally set at the potential of the ground G (that is, zero volts) in the signal generation apparatus 2. Accordingly, the waveform shaping circuit 42 outputs the single-ended signal Vd with a peak-to-peak voltage Vp and whose low potential-side voltage is set at the target constant voltage Vtg (which is zero volts).

Note that the waveform shaping circuit 42 is not limited to the configuration depicted in FIG. 5 and described above, that is, a configuration that inputs the differential signal Vd0 and performs shaping (waveform shaping) on the differential signal Vd0 to produce the single-ended signal Vd whose peak-to-peak voltage Vp is equivalent to the peak-to-peak voltage Vp of the AC component of the differential signal Vd0 and whose low potential-side voltage (the voltage during the low voltage period $T_L$ or "bottom voltage") is set at the target constant voltage Vtg and then outputs the single-ended signal Vd. As one example, by configuring the waveform shaping circuit 42 as depicted in FIG. 7, it is also possible to use a configuration that performs shaping (waveform shaping) to produce a single-ended signal Vd whose peak-to-peak voltage Vp is equivalent to the peak-to-peak voltage Vp of the AC component of the differential signal Vd0 and whose high potential-side voltage (the voltage during the high voltage period $T_H$ or "top voltage") is set at the target constant voltage Vtg and then outputs the single-ended signal Vd.

The waveform shaping circuit 42 and the signal generator 14 depicted in FIG. 7 will now be described. Note that configurations that are the same as in the waveform shaping circuit 42 and the signal generator 14 depicted in FIG. 5 are assigned the same reference numerals and duplicated description thereof is omitted.

As one example, the waveform shaping circuit 42 is equipped with the input 42*a* into which the differential signal Vd0 is inputted, the output 42*b* that outputs the single-ended signal Vd, the capacitor 42*c*, the first impedance element 42*d*, the switch circuit SC that is composed of the second impedance element 42*e* and the switch 42*f*, and the switch control circuit SWC that is constructed of a comparator or the like without including a diode and outputs the control pulse signal Vct that shifts the switch 42*f* from the on state to the off state and from the off state to the on state.

Figure 7:
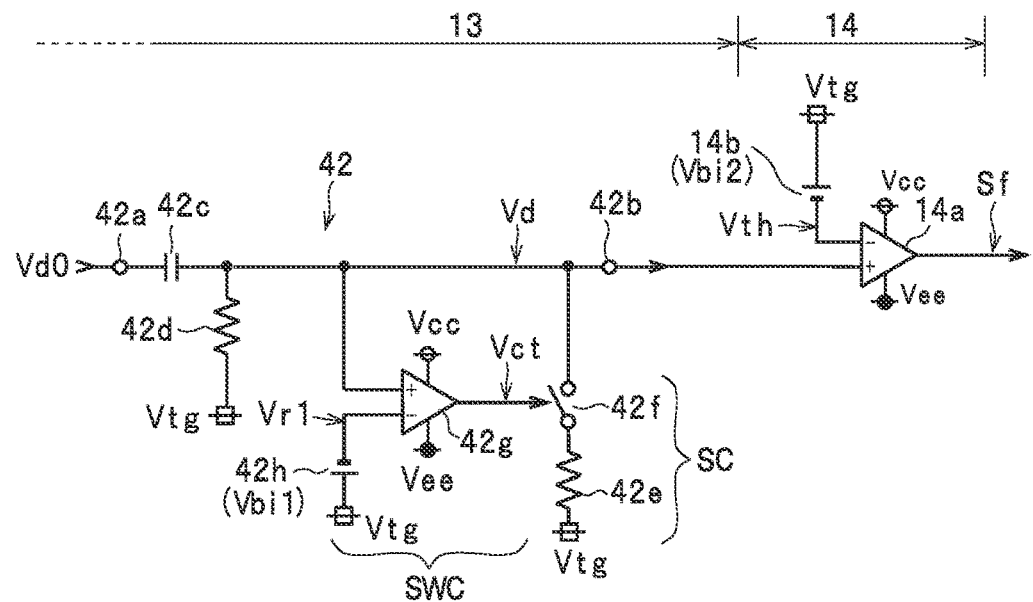
FIG. 7 is a circuit diagram depicting another configuration of the waveform shaping circuit 42 and another configuration of the signal generator 14.

Here, as a specific example, as depicted in FIG. 7, the first impedance element 42*d* is constructed of a single resistor (which has one end connected to the other end of the capacitor 42*c* and a target constant voltage Vtg applied to the other end).

As depicted in FIG. 7, the switch control circuit SWC includes one comparator 42*g*, which operates on the positive power supply voltage Vcc and the negative power supply voltage Vee, and one reference power supply 42*h* that outputs a DC constant voltage (or "bias voltage") Vbi1. The positive electrode side of the reference power supply 42*h* is connected to the target constant voltage Vtg and the reference power supply 42*h* outputs a voltage (Vtg−Vbi1) produced by subtracting the DC constant voltage Vbi1 from the target constant voltage Vtg from the negative electrode side as the reference voltage Vr1. Since the DC constant voltage Vbi1 is set at a voltage value of several percent to ten-odd percent, for example, of the peak-to-peak voltage Vp, the reference voltage Vr1 is set at a voltage that is slightly lower than the target constant voltage Vtg. The comparator 42*g* is configured with the non-inverting input terminal connected to the other end of the capacitor 42*c*, and by having the reference voltage Vr1 inputted into the inverting input terminal, outputs the control pulse signal Vct which, as depicted in FIG. 8, becomes a low potential to shift the switch 42*f* to the off state during low voltage periods $T_L$ in the AC component $Vd0_{ac}$ of the differential signal Vd0 and becomes a high voltage to shift the switch 42*f* to the on state during high voltage periods $T_H$ in the AC component $Vd0_{ac}$.

The operation of the waveform shaping circuit 42 when the switch 42*f* shifts to the off state in low voltage periods $T_L$ in the AC component $Vd0_{ac}$ and shifts to the on state in high voltage periods $T_F$, in the AC component $Vd0_{ac}$ according to this control pulse signal Vct will now be described. Note that although for ease of understanding, the differential signal Vd0 is depicted in FIG. 8 in a state where the DC component A of the differential signal Vd0 greatly fluctuates within one cycle of the AC component $Vd0_{ac}$ of the differential signal Vd0, in reality, the DC component A fluctuates with a sufficiently long cycle compared to one cycle (usually several μs or less) of the AC component $Vd0_{ac}$. For this reason, the following description will assume that the DC component A is substantially constant within one cycle of the AC component $Vd0_{ac}$ of the differential signal Vd0. The peak-to-peak voltage of the AC component $Vd0_{ac}$ is indicated by the symbol "Vp", and it is assumed that the voltage value of the differential signal Vd0 in the high voltage periods $T_H$ is the voltage Vp1 higher than the DC component A and the voltage of the differential signal Vd0 in the low voltage periods $T_L$ is the voltage Vp2 lower than the DC component A. Any sag that occurs in the single-ended signal Vd is assumed to be negligible.

Figure 8:
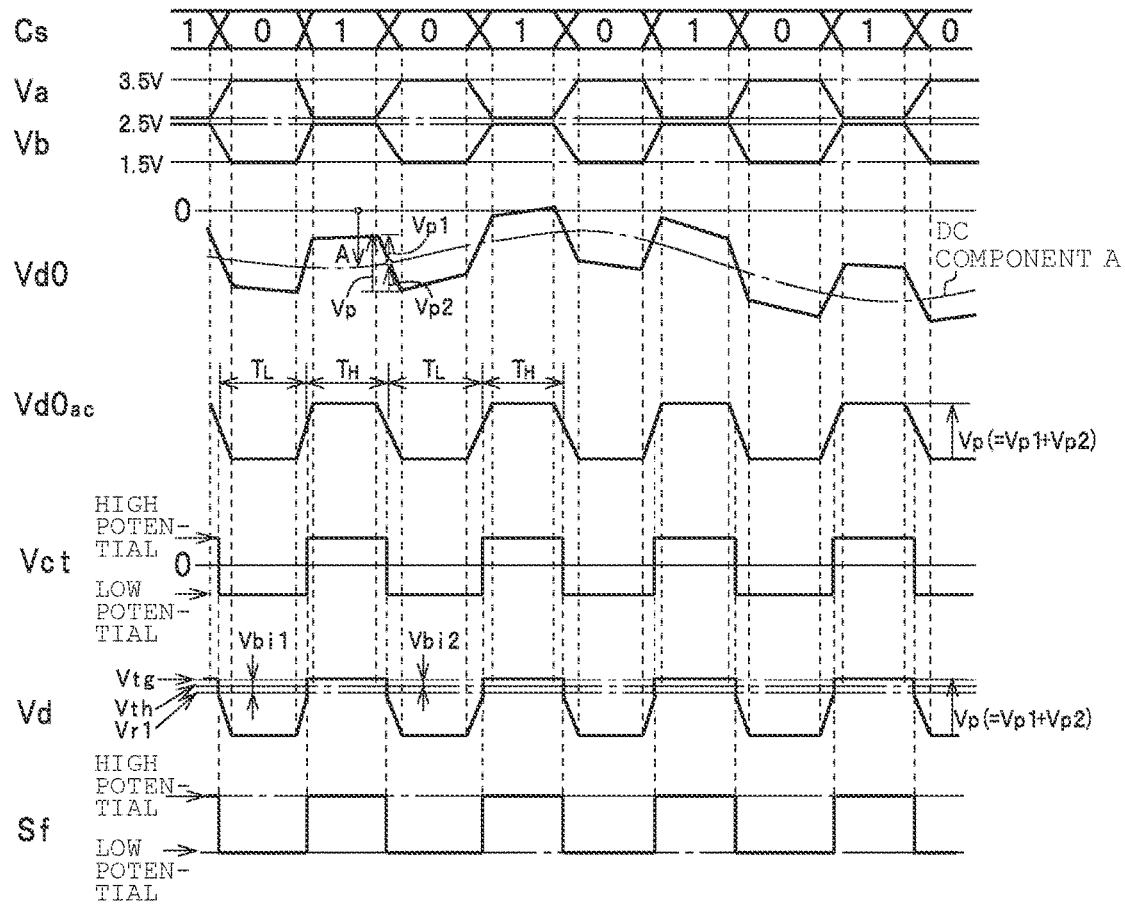
FIG. 8 is a waveform diagram useful in explaining the operation of a signal generation apparatus 2 equipped with the waveform shaping circuit 42 and the signal generator 14 in FIG. 7.

First, in the high voltage period $T_H$ where the switch 42*f* is turned on, the target constant voltage Vtg is supplied from the switch circuit SC via the second impedance element 42*e* with a low impedance, so that the voltage at the other end of the capacitor 42*c* (and the output 42*b*), that is, the single-ended signal Vd is set at the target constant voltage Vtg as depicted in FIG. 8. Since it is the high voltage period $T_H$, the voltage at the one end of the capacitor 42*c* (that is, the input 42*a*-side end) to which the differential signal Vd0 is applied becomes a voltage (A+Vp1). This means that when the voltage at the one end of the capacitor 42c is assumed to be a positive voltage with the voltage at the other end set at the target constant voltage Vtg as a reference, the capacitor 42c is charged by a voltage (A+Vp1−Vtg).

From this state, when it becomes the low voltage period $T_L$ where the switch 42f is placed in the off state, the supplying of the target constant voltage Vtg from the switch circuit SC is stopped and the voltage at the one end of the capacitor 42c (the input 42a-side end) becomes the voltage (A−Vp2). As a result, the voltage at the other end of the capacitor 42c (and the output 42b) becomes a voltage (A−Vp2−(A+Vp1−Vtg)) obtained by subtracting the voltage (A+Vp1−Vtg) from the voltage (A−Vp2), or in other words, the voltage (−(Vp1+Vp2)+Vtg). The voltage (Vp1+Vp2) is the peak-to-peak voltage Vp of the AC component $Vd0_{ac}$. From this, the voltage (−(Vp1+Vp2)+Vtg), which is the voltage at the one end (the input 42a-side end) of the capacitor 42c, that is, the single-ended signal Vd is set at the voltage (−Vp+Vtg) as depicted in FIG. 8.

From the above, in the waveform shaping circuit 42 depicted in FIG. 7, the switch control circuit SWC alternately shifts the switch 42f between the on state and the off state, so that as depicted in FIG. 8, the differential signal Vd0 (that is, a signal where the DC component A has been superimposed on the AC component $Vd0_{ac}$ of the peak-to-peak voltage Vp) is shaped (that is, subjected to waveform shaping) into the single-ended signal Vd whose peak-to-peak voltage Vp is equivalent to the peak-to-peak voltage Vp of the AC component $Vd0_{ac}$ of the differential signal Vd0 and whose high potential-side voltage (the voltage during the high voltage period $T_H$) is set at the target constant voltage Vtg (that is, the influence of variations in the DC component A is removed), and the single-ended signal Vd is then outputted from the output 42b. By doing so, the waveform shaping circuit 42 outputs a signal whose voltage changes in response to changes in the codes Cs that construct a CAN frame, that is, the single-ended signal Vd whose voltage is a low potential during periods where the code Cs is "0" and is a high potential (the target constant voltage Vtg) during periods where the code Cs is "1".

The operation when the comparator 42g of the switch control circuit SWC outputs the control pulse signal Vct described above will now be described.

When the AC component $Vd0_{ac}$ switches from the high voltage period $T_H$ to the low voltage period $T_L$ (that is, when the AC component $Vd0_{ac}$ falls), the voltage (that is, the voltage at the other end of the capacitor 42c, that is, the voltage of the single-ended signal Vd) of the output 42b to which the target constant voltage Vtg is applied with a low impedance from the switch circuit SC via the second impedance element 42e is affected by the change in the voltage of the AC component $Vd0_{ac}$ and momentarily falls from the target constant voltage Vtg to fall below the reference voltage Vr1. Accordingly, the comparator 42g shifts the control pulse signal Vct from the high potential to the low potential, as depicted in FIG. 8. Here, since the switch 42f in the switch circuit SC shifts to the off state, the application of the target constant voltage Vtg to the output 42b by the switch circuit SC is stopped and the voltage of the single-ended signal Vd shifts to a voltage (−Vp+Vtg). As a result, the voltage of the single-ended signal Vd is thereafter maintained in a state that is below the reference voltage Vr1. Note that in the high voltage period $T_H$ of the AC component $Vd0_{ac}$, the voltage of the single-ended signal Vd becomes the target constant voltage Vtg as described above, and the non-inverting input terminal of the comparator 42g also becomes the target constant voltage Vtg. However, since the reference voltage Vr1 (=Vtg−Vbi1) inputted into the inverting input terminal of the comparator 42g is lower than (that is, not the same voltage as) the target constant voltage Vtg, the comparator 42g continuously outputs the control pulse signal Vct at the high potential (that is, the application of the target constant voltage Vtg from the switch circuit SC to the output 42b is continued).

When the AC component $Vd0_{ac}$ switches from the low voltage period $T_L$ to the high voltage period $T_H$ (that is, when the AC component $Vd0_{ac}$ rises), the voltage of the single-ended signal Vd rises from the voltage (−Vp+Vtg) in keeping with the rise in the voltage of the AC component $Vd0_{br}$ and rises above the reference voltage Vr1. Accordingly, the comparator 42g shifts the control pulse signal Vct from the low potential to the high potential as depicted in FIG. 8. In this case, the switch 42f in the switch circuit SC shifts to the on state. This means that the application of the target constant voltage Vtg to the output 42b by the switch circuit SC starts and the voltage of the single-ended signal Vd is thereafter maintained at the target constant voltage Vtg, which is higher than the reference voltage Vr1.

As one example, as depicted in FIG. 7, the signal generator 14 includes one comparator 14a and one reference power supply 14b. The positive electrode side of the reference power supply 14b is connected to the target constant voltage Vtg, and the reference power supply 14b outputs a voltage (Vtg−Vbi2) obtained by subtracting a DC constant voltage Vbi2 from the target constant voltage Vtg from the negative electrode side as the threshold voltage Vth. Since the DC constant voltage Vbi2 is set at a voltage value that is several percent to ten-odd percent, for example, of the peak-to-peak voltage Vp, the threshold voltage Vth is set at a voltage that is slightly lower than the target constant voltage Vtg.

The comparator 14a has its non-inverting input terminal connected to the output 42b, has the threshold voltage Vth inputted into the inverting input terminal, and outputs the code specifying signal Sf from the output terminal by comparing the single-ended signal Vd outputted from the output 42b with the threshold voltage Vth and binarizing the result. As described above, since the threshold voltage Vth is set at a voltage that is slightly lower than the target constant voltage Vtg, as depicted in FIG. 8, the signal generator 14 equipped with the comparator 14a reliably binarizes the single-ended signal Vd (that is, a signal where the peak-to-peak voltage is the voltage Vp and the high potential-side voltage is set at the target constant voltage Vtg) using the threshold voltage Vth, and generates and outputs a code specifying signal Sf that has a high potential (the maximum output voltage of the comparator 14a) during a period where a code Cs that constructs a CAN frame being transferred via the serial bus SB is "1" and a low potential (the minimum output voltage of the comparator 14a) during a period where the code Cs is "0".

With the waveform shaping circuit 42 and the signal generator 14 of the configuration depicted in FIG. 7, by using the configuration described above, when for example, the target constant voltage Vtg is set at a predetermined positive voltage that is higher than the potential of the ground G (zero volts) but below the positive power supply voltage Vcc, the waveform shaping circuit 42 outputs the single-ended signal Vd with a peak-to-peak voltage Vp and a high potential-side voltage set at the positive target constant voltage Vtg.

Figure 9:
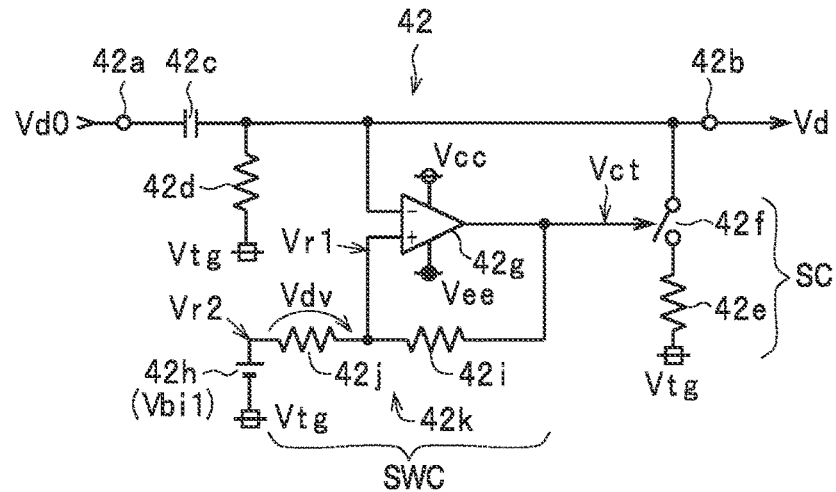
FIG. 9 is a circuit diagram of another waveform shaping circuit 42.

The waveform shaping circuit 42 with the configuration depicted in FIG. 5 can be changed to a configuration which, like the waveform shaping circuit 42 with the configuration depicted in FIG. 9, is equipped with a resistance voltage divider circuit 42k that is constructed of two resistors 42i and 42j connected in series, has one end (that is, the resistor 42i-side end) connected to the output terminal of the comparator 42g, has a reference voltage Vr2 (or "second reference voltage") applied to the other end (the resistor 42j-side end), and outputs a divided voltage set by the reference voltage Vr2 and the voltage of the control pulse signal Vct to the non-inverting input terminal of the comparator 42g as the reference voltage Vr1, thereby providing the comparator 42g with a hysteresis characteristic (that is, a configuration where the comparator 42g is operated as a hysteresis comparator). Note that configurations that are the same as in the waveform shaping circuit 42 depicted in FIG. 5 have been assigned the same reference numerals and duplicated description thereof is omitted.

In this resistance voltage divider circuit 42k, the resistance value of the resistor 42i is set at a value that is sufficiently larger than the resistance value of the resistor 42j (as one example, when the resistor 42j is several tens of kΩ, the resistance 42i is around several MΩ). In this resistance voltage divider circuit 42k, the voltage (Vtg+Vbi1, a voltage that is equivalent to the reference voltage Vr1 in FIG. 5) outputted from the reference power supply 42h whose negative electrode side is connected to the target constant voltage Vtg is used as the reference voltage Vr2 (a voltage in the vicinity of the target constant voltage Vtg (in this example, a voltage slightly higher than the target constant voltage Vtg)). However, the configuration is not limited to this, and although not illustrated, it is also possible to use a configuration where a voltage that is lower (slightly lower) than the target constant voltage Vtg, which is another example of a voltage in the vicinity of the target constant voltage Vtg, is used as the reference voltage Vr2, or a configuration where the target constant voltage Vtg itself is used as the reference voltage Vr2.

By using this configuration, with the waveform shaping circuit 42 depicted in FIG. 9, when the AC component $Vd0_{ac}$ switches from the low voltage period $T_L$ to the high voltage period $T_H$ (that is, when the AC component $Vd0_{ac}$ rises), the voltage (that is, the voltage at the other end of the capacitor 42c, that is, the voltage of the single-ended signal Vd) of the output 42b to which the target constant voltage Vtg is applied with a low impedance from the switch circuit SC via the second impedance element 42e is affected by the change in the voltage of the AC component $Vd0_{ac}$ and momentarily rises from the target constant voltage Vtg to rise above the reference voltage Vr1. In this configuration, the resistance voltage divider circuit 42k adds a voltage Vdv, which is obtained by dividing the voltage difference (Vct−Vr2) between the high-potential control pulse signal Vct and the reference voltage Vr2, to the reference voltage Vr2, and outputs as the reference voltage (divided voltage) Vr1. Accordingly, with this comparator 42g, compared to the comparator 42g depicted in FIG. 5, when the voltage of the output 42b is affected by a change in the voltage of the AC component $Vd0_{ac}$ and has risen momentarily further (the voltage Vdv higher than with the configuration in FIG. 5) from the target constant voltage Vtg to rise above the reference voltage Vr1, the control pulse signal Vct is shifted from the high potential to the low potential.

When the AC component $Vd0_{ac}$ switches from the high voltage period $T_H$ to the low voltage period $T_L$ (when the AC component $Vd0_{ac}$ falls), the voltage of the single-ended signal Vd falls from the voltage (Vp+Vtg) in keeping with the fall in the voltage of the AC component $Vd0_{ac}$ and falls below the reference voltage Vr1. In this configuration, the resistance voltage divider circuit 42k adds the voltage Vdv, which is obtained by dividing the differential voltage (Vct−Vr2) between the low potential control pulse signal Vct and the reference voltage Vr2, to the reference voltage Vr2, and outputs as the reference voltage (divided voltage) Vr1. Accordingly, with this comparator 42g, compared to the comparator 42g depicted in FIG. 5, when the voltage of the output 42b is affected by a change in the voltage of the AC component $Vd0_{ac}$ and has fallen momentarily further (the voltage Vdv lower than with the configuration of FIG. 5) from the target constant voltage Vtg to fall below the reference voltage Vr1, the control pulse signal Vct is shifted from the low potential to the high potential.

In this way, in the waveform shaping circuit 42 with the configuration depicted in FIG. 9, the comparator 42g operates with a hysteresis characteristic (compared to the configuration depicted in FIG. 5, the reference voltage Vr1 inputted into the non-inverting input terminal exhibits hysteresis so as to change with a hysteresis width of ±Vdv centered on the reference voltage Vr2), and outputs the control pulse signal Vct. For this reason, in a state where some noise is superimposed on the differential signal Vd0 inputted into the input 42a, when the single-ended signal Vd is the target constant voltage Vtg (that is, the voltage in the low voltage period), it will still be possible, even with the noise superimposed on the single-ended signal Vd, for the switch control circuit SWC to keep the potential of the control pulse signal Vct at the present potential (that is, when the switch 42f of the switch circuit SC is in the on state, the on state can be maintained, while when the switch 42f of the switch circuit SC is in the off state, the off state can be maintained) so long as the voltage level of the noise remains below the level set by the hysteresis characteristic described above. By doing so, the waveform shaping circuit 42 with the configuration depicted in FIG. 9 can generate the control pulse signal Vct while reducing the influence of noise (that is, while further reducing malfunctions due to noise).

Figure 10:
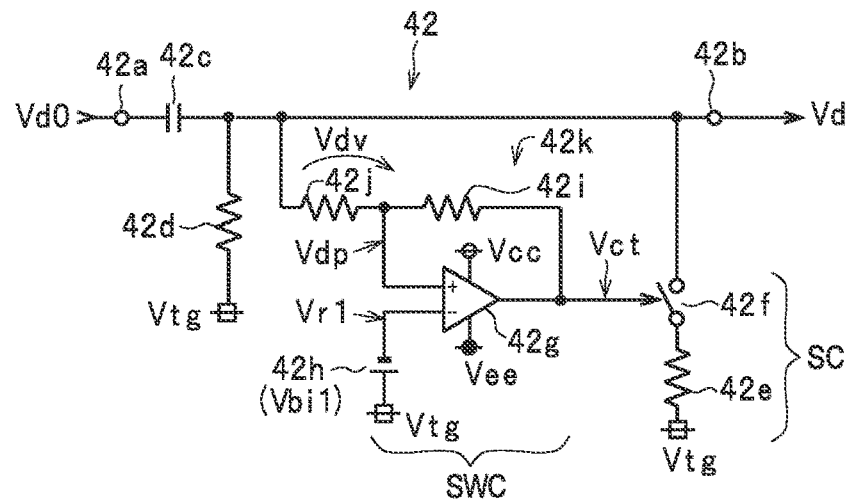
FIG. 10 is a circuit diagram of another waveform shaping circuit 42.

The waveform shaping circuit 42 with the configuration depicted in FIG. 7 can be changed to a configuration which, like the waveform shaping circuit 42 with the configuration depicted in FIG. 10, is equipped with a resistance voltage divider circuit 42k that is constructed of two resistors 42i and 42j connected in series, has one end (that is, the resistor 42i-side end) connected to the output terminal of the comparator 42g, has another end (the resistor 42j-side end) connected to the other end of the capacitor 42c (and the output 42b), and outputs a divided voltage pulse signal Vdp set by the voltage of the single-ended signal Vd and the voltage of the control pulse signal Vct to the non-inverting input terminal of the comparator 42g, thereby providing the comparator 42g with a hysteresis characteristic. Note that configurations that are the same as in the waveform shaping circuit 42 depicted in FIG. 7 have been assigned the same reference numerals and duplicated description thereof is omitted. Also, the resistance voltage divider circuit 42k has the same configuration as the resistance voltage divider circuit 42k of the waveform shaping circuit 42 depicted in FIG. 9.

By using this configuration, with the waveform shaping circuit 42 depicted in FIG. 10, when the AC component $Vd0_{ac}$ switches from the high voltage period $T_H$ to the low voltage period $T_L$ (that is, when the AC component $Vd0_{ac}$ falls), the voltage (that is, the voltage at the other end of the capacitor 42c, that is, the voltage of the single-ended signal Vd) of the output 42b to which the target constant voltage Vtg is applied with a low impedance from the switch circuit SC via the second impedance element 42*e* is affected by the change in the voltage of the AC component $Vd0_{ac}$ and momentarily falls from the target constant voltage Vtg to fall below the reference voltage Vr1. In this configuration, the resistance voltage divider circuit 42*k* outputs the differential voltage pulse signal Vdp, which is obtained by dividing a differential voltage between the high potential control pulse signal Vct and the voltage of the single-ended signal Vd, to the non-inverting input terminal of the comparator 42*g*. Accordingly, with this comparator 42*g*, compared with the comparator 42*g* depicted in FIG. 7, when the voltage of the single-ended signal Vd (that is, the voltage of the output 42*b*) is affected by a change in the voltage of the AC component $Vd0_{ac}$ and has fallen momentarily further (further by the voltage Vdv generated between both ends of the resistor 42*j* than the configuration of FIG. 7) from the target constant voltage Vtg, the divided voltage pulse signal Vdp inputted into the non-inverting input terminal is below the reference voltage Vr1, which shifts the control pulse signal Vct from the high potential to the low potential.

Also, when the AC component $Vd0_{ac}$ switches from the low voltage period $T_L$ to the high voltage period $T_H$ (that is, when the AC component $Vd0_{ac}$ rises), the voltage of the single-ended signal Vd rises from a voltage (−Vp+Vtg) in keeping with the rise in the voltage of the AC component $Vd0_{ac}$ and rises above the reference voltage Vr1. In this configuration, the resistance voltage divider circuit 42*k* outputs the divided voltage pulse signal Vdp, which is obtained by dividing a differential voltage between the low potential control pulse signal Vct and the voltage of the single-ended signal Vd, to the non-inverting input terminal of the comparator 42*g*. Accordingly, with this comparator 42*g*, compared with the comparator 42*g* depicted in FIG. 7, when the voltage of the single-ended signal Vd (that is, the voltage of the output 42*b*) has momentarily risen from the voltage (−Vp+Vtg) (which is higher by the voltage Vdv across both ends of the resistor 42*j* than the configuration in FIG. 7), the divided voltage pulse signal Vdp inputted into the non-inverting input terminal will exceed the reference voltage Vr1, which shifts the control pulse signal Vct from the low potential to the high potential.

In this way, in the waveform shaping circuit 42 with the configuration depicted in FIG. 10, the comparator 42*g* outputs the control pulse signal Vct by operating with a hysteresis characteristic (compared to the configuration depicted in FIG. 7, the comparator 42*g* exhibits a hysteresis characteristic so that only when the voltage of the single-ended signal Vd changes so as to exceed a hysteresis width of ±Vdv centered on the reference voltage Vr1, the potential of the control pulse signal Vct is changed from the high potential to the low potential and from the low potential to the high potential). This means that like the waveform shaping circuit 42 with the configuration depicted in FIG. 9 described above, even when some noise is superimposed on the differential signal Vd0 inputted into the input 42*a*, the waveform shaping circuit 42 with the configuration depicted in FIG. 10 is still capable of generating the control pulse signal Vct while reducing the influence of the noise.

Figure 11:
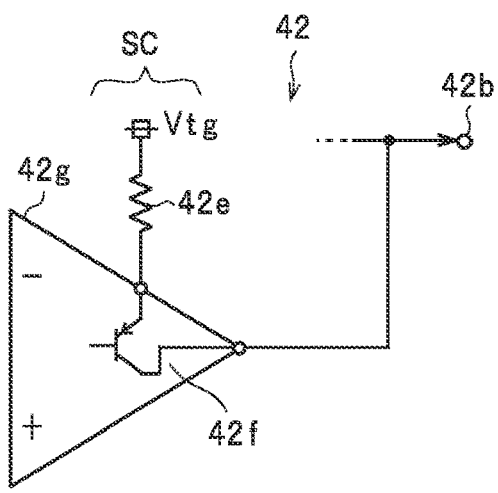
FIG. 11 is a diagram useful in explaining another waveform shaping circuit 42.

Note that although the switch circuit SC is constructed using the switch 42*f* disposed separately to the comparator 42*g* in the respective waveform shaping circuits 42 depicted in FIGS. 5, 7, 9 and 10 described above, as depicted in FIG. 11 for example, it is also possible to use a configuration where a comparator that incorporates a PNP-type open-collector transistor as the output stage is used as the comparator 42*g* in the respective waveform shaping circuits 42 depicted in FIGS. 5 and 9. In a waveform shaping circuit 42 that uses this configuration, as depicted in FIG. 11, the target constant voltage Vtg is supplied via the second impedance element 42*e* to the emitter terminal of the transistor of the output stage, and an output terminal that is connected to the collector terminal of the transistor is connected to the output 42*b*. With this configuration, the transistor incorporated in the comparator 42*g* can function as the switch 42*f* that constructs the switch circuit SC.

Figure 12:
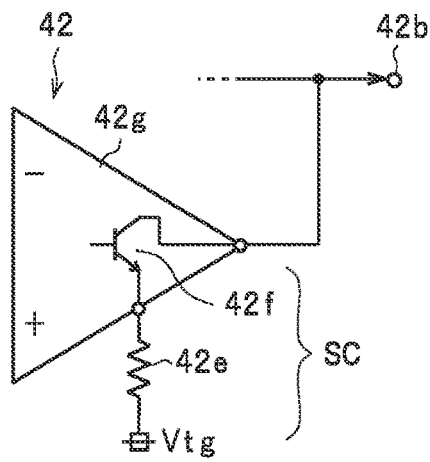
FIG. 12 is a diagram useful in explaining another waveform shaping circuit 42.

Also, as depicted in FIG. 12 for example, it is also possible to use a configuration where a comparator that incorporates an NPN-type open-collector transistor as the output stage is used as the comparator 42*g* in the respective waveform shaping circuits 42 depicted in FIGS. 7 and 10. In a waveform shaping circuit 42 that uses this configuration, as depicted in FIG. 12, the target constant voltage Vtg is supplied via the second impedance element 42*e* to the emitter terminal of the transistor, and an output terminal that is connected to the collector terminal of the transistor is connected to the output 42*b*. With this configuration, the transistor incorporated in the comparator 42*g* can function as the switch 42*f* that constructs the switch circuit SC.

By using the configurations depicted in FIGS. 11 and 12, the number of components of the waveform shaping circuit 42 can be reduced by an amount corresponding to the omission of the switch 42*f*.

Figure 13:
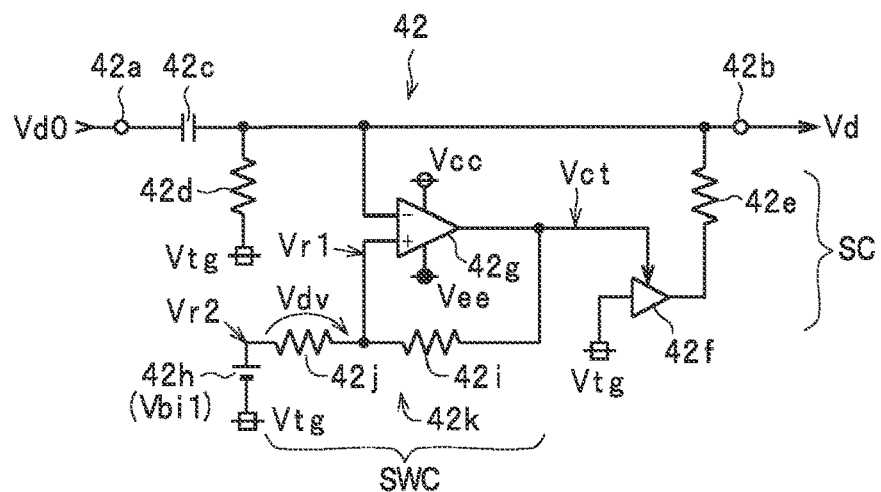
FIG. 13 is a circuit diagram of another waveform shaping circuit 42.

It is also possible to use a three-state logic IC as the switch 42*f* of the switch circuit SC in the respective waveform shaping circuits 42 depicted in FIGS. 5 and 9 described above. An example of a waveform shaping circuit 42 with a configuration where a three-state logic IC (hereinafter, also referred to as the "logic IC 42*f*") is used as the switch 42*f* of the waveform shaping circuit 42 depicted in FIG. 9 is depicted in FIG. 13. Note that configurations that are the same as in the waveform shaping circuit 42 depicted in FIG. 9 have been assigned the same reference numerals and duplicated description thereof is omitted. In the waveform shaping circuit 42 depicted in FIG. 13, a voltage corresponding to the low level of the logic IC 42*f* is set as the target constant voltage Vtg, this target constant voltage Vtg is inputted into the input terminal of the logic IC 42*f*, the output terminal of the logic IC 42*f* is connected via the second impedance element 42*e* to the output 42*b*, and the control pulse signal Vct is inputted into the control input terminal of the logic IC 42*f*. The logic IC 42*f* is composed of a logic IC whose control input terminal has positive logic (or "active high", a configuration where the target constant voltage Vtg is outputted when the control pulse signal Vct is at a high potential, and the output is placed in a high impedance state when the control pulse signal Vct is at a low potential).

In this switch circuit SC, when the control pulse signal Vct is at the high potential, the logic IC 42*f* outputs the target constant voltage Vtg to the output 42*b*, and when the control pulse signal Vct is at the low potential, the logic IF 42*f* shifts the output to a high impedance state, so that the outputting of the target constant voltage Vtg to the output 42*b* is stopped.

The waveform shaping circuit 42 depicted in FIG. 13 operates in the same way as the waveform shaping circuit 42 depicted in FIG. 9 and, as depicted in FIG. 6, shapes (that is, performs waveform shaping on) the differential signal Vd0 into the single-ended signal Vd whose peak-to-peak voltage Vp is equivalent to the peak-to-peak voltage Vp of the AC component $Vd0_{ac}$ of the differential signal Vd0 and whose low potential-side voltage (that is, the voltage during the low voltage period $T_L$) is set at the target constant voltage Vtg, and then outputs the single-ended signal Vd from the output 42*b*. By doing so, as depicted in FIG. 6, the waveform shaping circuit 42 outputs a signal whose voltage changes in response to changes in the codes Cs that construct a CAN frame, that is, the single-ended signal Vd whose voltage is a low potential (the target constant voltage Vtg) during periods where the code Cs is "0" and whose voltage is a high potential during periods where the code Cs is "1".

Figure 14:
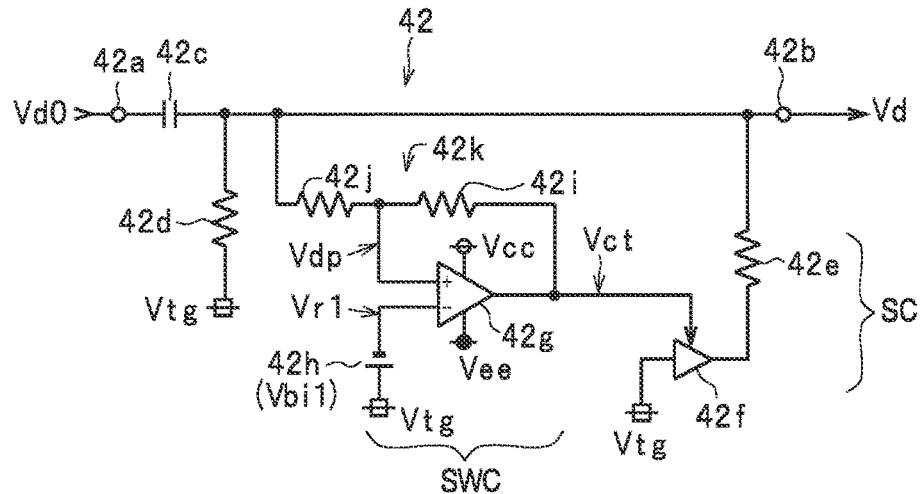
FIG. 14 is a circuit diagram of another waveform shaping circuit 42.

It is also possible to use a three-state logic IC as the switch 42f of the switch circuit SC in the respective waveform shaping circuits 42 depicted in FIGS. 7 and 10 described above. As one example, a waveform shaping circuit 42 with a configuration where a logic IC 42f (that is, a logic IC with the same positive logic as the logic IC 42f depicted in FIG. 13) is used as the switch 42f of the waveform shaping circuit 42 depicted in FIG. 10 is depicted in FIG. 14. Note that configurations that are the same as in the waveform shaping circuit 42 depicted in FIG. 10 have been assigned the same reference numerals and duplicated description thereof is omitted. In the waveform shaping circuit 42 depicted in FIG. 14, the voltage corresponding to the high level in the logic IC 42f is set as the target constant voltage Vtg, this target constant voltage Vtg is inputted into the input terminal of the logic IC 42f, the output terminal of the logic IC 42f is connected via the second impedance element 42e to the output 42b, and the control pulse signal Vct is inputted into the control input terminal of the logic IC 42f.

The waveform shaping circuit 42 depicted in FIG. 14 operates in the same way as the waveform shaping circuit 42 depicted in FIG. 10, and as depicted in FIG. 8, shapes (that is, performs waveform shaping on) the differential signal Vd0 into the single ended signal Vd whose peak-to-peak voltage Vp is equivalent to the peak-to-peak voltage Vp of the AC component $Vd0_{ac}$ of the differential signal Vd0 and whose high potential-side voltage (that is, the voltage of the high voltage period $T_H$) is set at the target constant voltage Vtg, and then outputs the single-ended signal Vd from the output 42b. By doing so, as depicted in FIG. 8, the waveform shaping circuit 42 outputs a signal whose voltage changes in response to changes in the codes Cs that construct a CAN frame, that is, the single-ended signal Vd whose voltage becomes a low potential during periods where the code Cs is "0" and whose voltage becomes a high potential (that is, the target constant voltage Vtg) during periods where the code Cs is "1".

By using the configurations depicted in FIGS. 13 and 14, it is possible to use an output buffer incorporated in an integrated circuit as the logic IC 42f.

Figure 15:
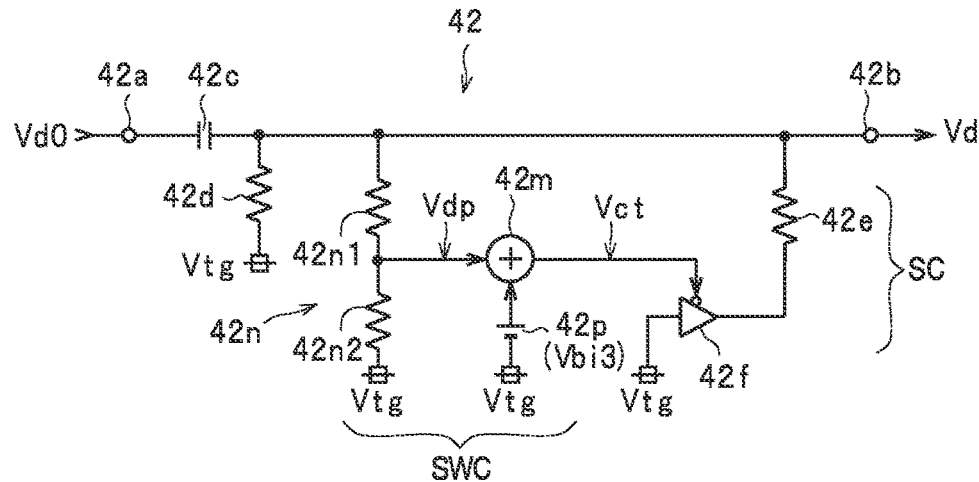
FIG. 15 is a circuit diagram of another waveform shaping circuit 42.

Also, in the same way as the waveform shaping circuits 42 depicted in FIGS. 5, 9 and 13, it is also possible to use, as the waveform shaping circuit 42 depicted in FIG. 15, a waveform shaping circuit that shapes (that is, performs waveform shaping on) the differential signal Vd0 into the single-ended signal Vd whose peak-to-peak voltage Vp is equivalent to the peak-to-peak voltage Vp of the AC component $Vd0_{ac}$ of the differential signal Vd0 and whose low potential-side voltage (that is, the voltage during the low voltage period $T_L$) is set at the target constant voltage Vtg, and then outputs the single-ended signal Vd from the output 42b. Since this waveform shaping circuit 42 is configured to use a three-state logic IC as the switch 42f of the switch circuit SC in the same way as the waveform shaping circuit 42 depicted in FIG. 13 described above, the present waveform shaping circuit 42 will be described in comparison to the waveform shaping circuit 42 depicted in FIG. 13. Note that the configurations that are the same as in the waveform shaping circuit 42 depicted in FIG. 13 have been assigned the same reference numerals and duplicated description thereof is omitted.

The waveform shaping circuit 42 depicted in FIG. 15 is equipped with the input 42a into which the differential signal Vd0 is inputted, the output 42b which outputs the single-ended signal Vd, the capacitor 42c, the first impedance element 42d, a switch circuit SC which is constructed of the second impedance element 42e and a three-state logic IC (hereinafter referred to as the logic IC 42f") as the switch 42f, and a switch control circuit SWC that is constructed of an adder 42m and the like without including a diode and outputs a control pulse signal Vct that shifts the switch 42f from the on state to the off state and from the off state to the on state.

The switch control circuit SWC includes, in addition to the adder 42m, a resistance voltage divider circuit 42n and a bias voltage source 42p. The resistance voltage divider circuit 42n is configured to include resistors connected in series, has one end connected to the output 42b, has the target constant voltage Vtg applied to the other end, divides the single-ended signal Vd outputted from the output 42b, and outputs the result to the adder 42m as the divided voltage pulse signal Vdp. As one example, although the resistance voltage divider circuit 42k in the present embodiment is constructed of two resistors 42n1 and 42n2 that are connected in series, and although not illustrated, it is also possible to combine more resistors. The bias voltage source 42p has the negative electrode side connected to the target constant voltage Vtg, adds a generated DC constant voltage (or "bias voltage") Vbi3 (≠0 volt) to the target constant voltage Vtg, and outputs to the adder 42m. In this configuration, the voltage dividing ratio and/or voltage values of the resistance voltage divider circuit 42n and the bias voltage source 42p are set in advance so that the amplitude and DC level of the control pulse signal Vct outputted from the adder 42m match the input specification of the control input terminal of the logic IC 42f described later.

The adder 42m inputs the divided voltage pulse signal Vdp and the summed voltage (Vbi3+Vtg) produced by adding the DC constant voltage Vbi3 and the target constant voltage Vtg, adds these voltages, and outputs the control pulse signal Vct (=Vdp+Vbi3+Vtg). Since this control pulse signal Vct is a signal with the same phase as the divided voltage pulse signal Vdp obtained by dividing the single-ended signal Vd, the control pulse signal Vct is a signal whose voltage becomes low during the low voltage period $T_L$ in the AC component $Vd0_{ac}$ and becomes high during the high voltage period $T_H$ in the AC component $Vd0_{ac}$. That is, the control pulse signal Vct in FIG. 15 is a signal with the opposite phase to the phase of the control pulse signal Vct depicted in FIG. 6.

For this reason, unlike the logic IC 42f (that is, a logic IC where the control input terminal has positive logic (or "active high", a configuration where the target constant voltage Vtg is outputted when the control pulse signal Vct is at a high potential)) that constructs the switch circuit SC in the waveform shaping circuit 42 in FIG. 13 described above, the switch circuit SC in the waveform shaping circuit 42 in FIG. 15 is constructed using a logic IC 42f where the control input terminal has negative logic (or "active low", a configuration where the target constant voltage Vtg is outputted when the control pulse signal Vct is at a low potential).

In the same way as the waveform shaping circuits 42 depicted in FIGS. 5, 9, and 13, the waveform shaping circuit 42 depicted in FIG. 15 shapes (that is performs waveform shaping on) the differential signal Vd0 as depicted in FIG. 6 to produce the single-ended signal Vd whose peak-to-peak voltage Vp is equivalent to the peak-to-peak voltage Vp of the AC component $Vd0_{ac}$ of the differential signal Vd0 and whose low potential-side voltage (the voltage during the low voltage period $T_L$) is set at the target constant voltage Vtg and then outputs from the output 42b. By doing so, as depicted in FIG. 6, the waveform shaping circuit 42 outputs a signal whose voltage changes in response to changes in the codes Cs that construct a CAN frame, that is, the single-ended signal Vd whose voltage is a low potential (the target constant voltage Vtg) during periods where the code Cs is "0" and whose voltage is a high potential during periods where the code Cs is "1". Note that in the waveform shaping circuit 42 depicted in FIG. 15, in addition to the above-mentioned function of dividing the single-ended signal Vd, the resistance voltage divider circuit 42n has a function of supplying the target constant voltage Vtg to the other end of the capacitor 42c (and the output 42b) (which is the same function as the first impedance element 42d). For this reason, it is possible to omit the first impedance element 42d.

Also, as the logic IC 42f that constructs the switch circuit SC in the waveform shaping circuit 42 depicted in FIG. 15, although not illustrated, it is also possible to use a logic IC whose control input terminal has positive logic (so-called "active high") in place of a logic IC whose control input terminal has negative logic (so-called "active low") as in the configuration described above. In a waveform shaping circuit of this configuration, based on the control pulse signal Vct depicted in FIG. 8, the logic IC 42f that constructs the switch circuit SC applies the target constant voltage Vtg when the control pulse signal Vct is at a high potential and stops the application of the target constant voltage Vtg when the control pulse signal Vct is at a low potential, so that as depicted in FIG. 8, it is possible to shape (that is, perform waveform shaping on) the differential signal Vd0 to produce the single-ended signal Vd whose peak-to-peak voltage Vp is equivalent to the peak-to-peak voltage Vp of the AC component $Vd0_{ac}$ of the differential signal Vd0 and whose high potential-side voltage (the voltage during the high voltage period $T_H$) is set at the target constant voltage Vtg and to then output this single-ended signal Vd from the output 42b. By doing so, the waveform shaping circuit outputs a signal whose voltage changes in response to changes in the codes Cs that construct a CAN frame, that is, the single-ended signal Vd whose voltage is a low potential during the period when the code Cs is "0" and whose voltage is a high potential (the target constant voltage Vtg) during the period when the code Cs is "1".

Figure 16:
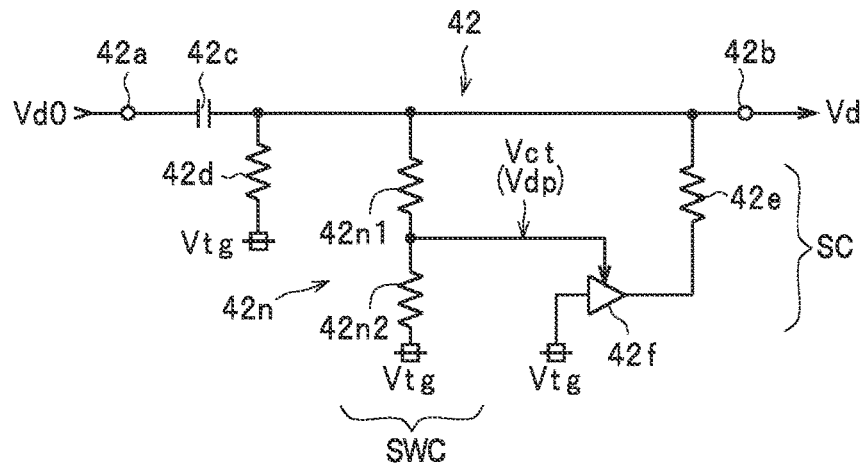
FIG. 16 is a circuit diagram of another waveform shaping circuit 42.

Also, in the waveform shaping circuit 42 depicted in FIG. 15 and the (not illustrated) waveform shaping circuit described above, when the amplitude and DC level of the divided voltage pulse signal Vdp outputted from the resistance voltage divider circuit 42n match the input specification of the control input terminal of the logic IC 42f, the switch control circuit SWC can be configured by omitting the adder 42m and the bias voltage source 42p and using only the resistance voltage divider circuit 42n in the same way as the waveform shaping circuit 42 depicted in FIG. 16. With this waveform shaping circuit 42, the divided voltage pulse signal Vdp outputted from the resistance voltage divider circuit 42n is supplied as it is as the control pulse signal Vct to the control input terminal of the logic IC 42f.

Since the waveform shaping circuit 42 depicted in FIG. 16 uses a logic IC whose control input terminal has positive logic (or "active high") as the logic IC 42f that constructs the switch circuit SC, as depicted in FIG. 8, the differential signal Vd0 is shaped (that is, subjected to waveform shaping) to produce the single-ended signal Vd whose peak-to-peak voltage Vp is equivalent to the peak-to-peak voltage Vp of the AC component $Vd0_{ac}$ of the differential signal Vd0 and whose high potential-side voltage (the voltage during the high voltage period $T_H$) is set at the target constant voltage Vtg and the single-ended signal Vd is then outputted from the output 42b.

Note that although not illustrated, it is also possible to construct a waveform shaping circuit using a logic IC where the control input terminal has negative logic (so-called "active low") as the logic IC 42f that constructs the switch circuit SC of the waveform shaping circuit 42 depicted in FIG. 16. As depicted in FIG. 6, this waveform shaping circuit shapes (that is, performs waveform shaping on) the differential signal Vd0 to produce the single-ended signal Vd whose peak-to-peak voltage Vp is equivalent to the peak-to-peak voltage Vp of the AC component $Vd0_{ac}$ of the differential signal Vd0 and whose low potential-side voltage (the voltage during the low voltage period $T_L$) is set at the target constant voltage Vtg and then outputs the single-ended signal Vd from the output 42b.

As the target constant voltage Vtg used in the respective waveform shaping circuits 42 described above, it is possible to dispose a DC constant voltage source, not illustrated, in the waveform shaping circuit 42 and use a DC constant voltage outputted from this DC constant voltage source. Alternatively, as illustrated by the broken lines in FIG. 5, it is also possible to use a configuration where a D/A converter 15, which converts voltage data Dv inputted from outside the waveform shaping circuit 42 and outputs a DC voltage with a voltage value indicated by the voltage data Dv, is disposed in the waveform shaping circuit 42 and the DC voltage outputted from the D/A converter 15 is used as the target constant voltage Vtg. Note that although the waveform shaping circuit 42 depicted in FIG. 5 is given here as one example, the same applies to the waveform shaping circuits 42 depicted in FIGS. 7 and 9 to 16. When a configuration where the D/A converter 15 is disposed in the waveform shaping circuit 42 is used, by changing the voltage data Dv, it is possible to change the high potential-side voltage (that is, the voltage during the high voltage period $T_H$) and/or the low potential-side voltage (that is, the voltage during the low voltage period $T_L$) set at the target constant voltage Vtg in the single-ended signal Vd. Accordingly, it is possible to easily adjust the target constant voltage Vtg so that the differential signal Vd0 can be reliably shaped into the single-ended signal Vd.

The coding apparatus 3 executes a coding process for specifying codes Cs (see FIGS. 6 and 8) corresponding to the logic signal Sa based on the code specifying signal Sf outputted from the signal generation apparatus 2, and outputs a string of the specified codes Cs (that is, the same CAN frame as the CAN frame being transferred on the serial bus SB) to various CAN communication-compatible devices connected to the signal reading system 1. In more detail, in the coding process, the coding apparatus 3 specifies that a code Cs constructing the CAN frame transferred via the serial bus SB is "1" during a high potential period of the code specifying signal Sf, specifies that a code Cs constructing the CAN frame is "0" during a low potential period of the code specifying signal Sf, specifies a code string composed of the specified codes Cs as the CAN frame being transferred via the serial bus SB and outputs the code string to various CAN communication-compatible devices. With this configuration, when the coding apparatus 3 is connected to a CAN communication-compatible device via a wired transmission line, the coding apparatus 3 outputs (transmits) the specified CAN frame to the CAN communication-compatible device by wired communication. When the coding apparatus 3 is connected to the CAN communication-compatible device via a wireless transmission line, the coding apparatus 3 outputs (transmits) the specified CAN frame to a CAN communication-compatible device by wireless communication.

Next, example usage of the signal reading system 1 and the operation of the signal reading system 1 during this usage will be described with reference to the drawings. Note that as depicted in FIG. 2, it is assumed that the electrode 21 of the electrode portion 11a is connected to one end of the impedance element 12a via the core wire of the shielded cable CBa, the shield 22 of the electrode portion 11a is connected via the shield of the shielded cable CBa to the ground G of the signal generation apparatus 2, the electrode 21 of the electrode portion 11b is connected to one end of the impedance element 12b via the core wire of the shielded cable CBb, and the shield 22 of the electrode portion 11b is connected to the ground G of the signal generation apparatus 2 via the shield of the shielded cable CBb.

First, as depicted in FIG. 2, the electrode portions 11a and 11b are attached to the coated conductors La and Lb so that the respective electrodes 21 contact (touch) the coated parts of the coated conductors La and Lb of the serial bus SB that has been laid out in an automobile, and a CAN communication-compatible device to which a CAN frame (a string of the codes Cs) read from the serial bus SB is to be outputted is connected to the coding apparatus 3.

Here, in the signal reading system 1 of the present embodiment, the logic signal Sa can be read from the serial bus SB by simply attaching the electrode portions 11a and 11b without working on the coated conductors La and Lb themselves (that is, removing the insulating coating), which means that the signal reading system 1 can be used even when a connector is not installed on the serial bus SB. Even when a connector is installed, the location for connecting to the serial bus SB (that is, the attachment location of the electrode portions 11a and 11b) is not limited to the installed location of the connector, and it is possible to connect to the serial bus SB at an arbitrary location in the longitudinal direction of the coated conductors La and Lb.

In this state, when a logic signal Sa is outputted to the serial bus SB from a CAN communication-compatible device, not illustrated, mounted in the automobile (such as a controller that outputs CAN frames that indicate control information or a detector that outputs CAN frames that indicate arbitrary measurement results), at the signal generation apparatus 2, a first voltage signal Vc1 whose voltage changes in keeping with the voltage Va of the voltage signal Va being transferred on the coated conductor La is generated at the impedance element 12a connected via the shielded cable CBa to the electrode portion 11a attached to the coated conductor La and a second voltage signal Vc2 whose voltage changes in keeping with the voltage Vb of the voltage signal Vb being transferred on the coated conductor Lb is generated at the impedance element 12b connected via the shielded cable CBb to the electrode portion 11b attached to the coated conductor Lb.

In the signal generation apparatus 2, the differential amplifier 13 inputs the first voltage signal Vc1 and the second voltage signal Vc2 and outputs the single-ended signal Vd whose voltage changes in keeping with the differential voltage (Vc1−Vc2) between these voltage signals Vc1 and Vc2. At the differential amplifier 13, when the waveform shaping circuit 42 has the circuit configuration depicted in any of FIGS. 5, 9, 11, 13, and 15, as depicted in FIG. 6, the single-ended signal Vd (that is, a signal whose waveform is shaped so that the voltage of the signal during the low potential period (the bottom voltage of the signal) is set at the target constant voltage Vtg) whose voltage becomes a low potential (the target constant voltage Vtg) during periods where a code Cs constructing the CAN frame being transferred to the serial bus SB is "0" and whose voltage becomes a high potential during periods where the code Cs is "1" is outputted. Also, when the waveform shaping circuit 42 has the circuit configuration depicted in any of FIGS. 7, 10, 12, 14, and 16, as depicted in FIG. 8, the single-ended signal Vd (that is, a signal whose waveform is shaped so that the voltage of the signal during the high potential period (the top voltage of the signal) is set at the target constant voltage Vtg) whose voltage becomes a high potential (the target constant voltage Vtg) during periods where a code Cs constructing the CAN frame being transferred to the serial bus SB is "1" and whose voltage becomes a low potential during periods where the code Cs is "0" is outputted.

Also, in the signal generation apparatus 2, when the waveform shaping circuit 42 has the circuit configuration depicted in any of FIGS. 5, 9, 11, 13, and 15, as depicted in FIG. 6, the signal generator 14 configured in the circuit depicted in FIG. 5 corresponding to the circuit configurations of these waveform shaping circuits 42 generates and outputs the code specifying signal Sf that has a "high potential period" in a period where a code Cs constructing the CAN frame transferred via the serial bus SB is "1" and has a "low potential period" in a period where the code Cs is "0". Also, when the waveform shaping circuit 42 has the circuit configuration depicted in any of FIGS. 7, 10, 12, 14, and 16, as depicted in FIG. 8, the signal generator 14 configured in the circuit depicted in FIG. 7 corresponding to the circuit configurations of these waveform shaping circuits 42 generates and outputs the code specifying signal Sf that has a "high potential period" in a period where a code Cs constructing the CAN frame transferred via the serial bus SB is "1" and has a "low potential period" in a period where the code Cs is "0".

Also, in the coding apparatus 3, each code Cs that constructs a CAN frame being transferred via the serial bus SB is specified based on the code specifying signal Sf generated and outputted by the signal generation apparatus 2, a code string constructed of the specified codes Cs is specified as the CAN frame being transferred via the serial bus SB, and this code string is outputted to various CAN communication-compatible devices. By doing so, a CAN communication-compatible device executes various types of processing set in advance corresponding to the CAN frame (that is, the string of codes Cs) outputted from the signal reading system 1 (that is, a CAN frame read from the serial bus SB by the signal reading system 1).

In this way, none of the waveform shaping circuits 42 described above that construct the signal generation apparatus 2 have a configuration where the switch circuit SC includes a diode that would be affected by temperature. Accordingly, with these waveform shaping circuits 42, by using the target constant voltage Vtg, which is hardly affected by temperature, it is possible to reliably shape the differential signal Vd0 outputted from the differential amplification circuit 41 without being affected by temperature to the single-ended signal Vd whose peak-to-peak voltage Vp is equivalent to the peak-to-peak voltage Vp of the AC component $Vd0_{ac}$ of the differential signal Vd0 and whose low potential-side voltage (the voltage during the low voltage period $T_L$) is set at a constant voltage (the target constant voltage Vtg) that is not affected by temperature or to reliably shape to the single-ended signal Vd whose peak-to-peak voltage Vp is equivalent to the peak-to-peak voltage Vp of the AC component $Vd0_{ac}$ of the differential signal Vd0 and whose high potential-side voltage (the voltage during the high voltage period $T_H$) is set at a constant voltage (the target constant voltage Vtg) that is not affected by temperature, and to output the single-ended signal Vd from the output 42b. This means that according to the signal generation apparatus 2 equipped with the waveform shaping circuit 42, it is possible to reliably generate the code specifying signal Sf without being affected by temperature. Also, according to the signal reading system 1 equipped with this signal generation apparatus 2, it is possible to reliably read a CAN frame from the serial bus SB for CAN communication and reliably output a CAN frame Cs that is the same as the read CAN frame to various CAN communication-compatible devices without being affected by temperature. On the other hand, in a waveform shaping circuit with a configuration where a diode is included in a circuit corresponding to the switch circuit SC in the present embodiment, even when a target constant voltage Vtg that is hardly affected by temperature is used, the target constant voltage Vtg will be supplied via a diode whose forward voltage is affected by and changes according to temperature, so that the low potential-side voltage or the high potential-side voltage of the single-ended signal Vd will change due to the influence of temperature. Also, since each waveform shaping circuit 42 has a function of removing the DC component A (that is, low frequency noise) superimposed on the differential signal Vd0 and outputting the resulting signal, according to the signal generation apparatus 2 equipped with this waveform shaping circuit 42 and the signal reading system 1 equipped with this signal generation apparatus 2, it is possible to accurately generate and output the code specifying signal Sf and the CAN frame Cs without being affected by the DC component A (low frequency noise).

Note that as described above, it is sufficient for this signal generation apparatus 2 to not include a diode on a path (in this example, the switch circuit SC) that applies the target constant voltage Vtg to the part (for example, the output 42b) of the waveform shaping circuit 42 where the single-ended signal Vd is outputted, and it should be obvious that circuits aside from the switch circuit SC in the waveform shaping circuit 42 may include a diode. Although not illustrated, one example of such a diode is a voltage clipping (voltage limiter) diode connected to the output terminal of the comparator 42g in order to limit the upper limit voltage and the lower limit voltage of the control pulse signal Vct outputted from the comparator 42g to within an input voltage range of the switch 42f. Although outside the waveform shaping circuit 42, another example is a voltage clipping (voltage limiter) diode connected to the non-inverting input terminal of the comparator 14a in the signal generator 14 in order to limit the voltage on the side of the single-ended signal Vd which is not set at the target constant voltage Vtg to within the input voltage range of the comparator 14a.

In the waveform shaping circuit 42 depicted in FIG. 5 described above that constructs the signal generation apparatus 2, the switch control circuit SWC includes a comparator 42g whose inverting input terminal is connected to another end of the capacitor 42c, has a reference voltage Vr1 that is higher (slightly higher) than the target constant voltage Vtg is inputted to the non-inverting input terminal, and outputs a control pulse signal Vct from an output terminal. Accordingly, with this waveform shaping circuit 42, even in a state where the low potential-side voltage (that is, the voltage in the low voltage period $T_L$) of the single-ended signal Vd is set at the target constant voltage Vtg and noise is superimposed on the single-ended signal Vd, until the voltage level of the noise reaches the reference voltage Vr1 (that is, until the noise rises to the reference voltage Vr1), the switch control circuit SWC keeps the control pulse signal Vct at the high potential (that is, the switch 42f is kept in the on state), and it is possible to have the switch circuit SC continue applying the target constant voltage Vtg to the other end of the capacitor 42c (and the output 42b). Accordingly, with the waveform shaping circuit 42, it is possible to reduce malfunctions due to noise.

In the waveform shaping circuit 42 depicted in FIG. 7 described above that constructs the signal generation apparatus 2, the switch control circuit SWC includes a comparator 42g that has a non-inverting input terminal connected to the other end of the capacitor 42c, has a reference voltage Vr1 that is lower (slightly lower) than the target constant voltage Vtg inputted into the inverting input terminal, and outputs the control pulse signal Vct from an output terminal. Accordingly, with this waveform shaping circuit 42, even in a state where the high potential-side voltage (that is, the voltage in the high voltage period $T_H$) of the single-ended signal Vd is set at the target constant voltage Vtg and noise is superimposed on the single-ended signal Vd, until the voltage level of the noise reaches the reference voltage Vr1 (that is, until the noise falls to the reference voltage Vr1), the switch control circuit SWC keeps the control pulse signal Vct at the high potential (that is, the switch 42f is kept in the on state), so that it is possible to have the switch circuit SC continue applying the target constant voltage Vtg to the other end of the capacitor 42c (and the output 42b). Accordingly, with the waveform shaping circuit 42, it is possible to reduce malfunctions due to noise.

This means that according to a signal generation apparatus 2 equipped with the waveform shaping circuits 42 depicted in FIGS. 5 and 7, it is possible to reliably generate the code specifying signal Sf without being affected by temperature and while also reducing malfunctions due to noise, and according to a signal reading system 1 equipped with this signal generation apparatus 2, it is possible to accurately read CAN frames from the serial bus SB for CAN communication and to output CAN frames Cs that are the same as the read CAN frames to various CAN communication-compatible devices without being affected by temperature and while also reducing malfunctions due to noise.

In the waveform shaping circuit 42 depicted in FIG. 9 described above that constructs this signal generation apparatus 2, the switch control circuit SWC is equipped with a comparator 42g, whose inverting input terminal is connected to the other end of the capacitor 42c and whose output terminal outputs the control pulse signal Vct, and a resistance voltage divider circuit 42k that has one end connected to the output terminal, has a reference voltage Vr2 that is in the vicinity of the target constant voltage Vtg (or the target constant voltage Vtg) applied to the other end, and outputs a divided voltage set by the reference voltage Vr2 (or the target constant voltage Vtg) and the voltage of the control pulse signal Vct as the reference voltage Vr1 to the non-inverting input terminal of the comparator 42g, with the comparator 42g exhibiting a hysteresis characteristic (that is, the comparator 42g operating as a hysteresis comparator).

In the waveform shaping circuit 42 depicted in FIG. 10 described above that constructs this signal generation apparatus 2, the switch control circuit SWC is equipped with a comparator 42g, to whose inverting input terminal the reference voltage Vr1 (a voltage that is one of the target constant voltage Vtg and a voltage in the vicinity of the target constant voltage Vtg) is applied and whose output terminal outputs the control pulse signal Vct, and a resistance voltage divider circuit 42k that has one end connected to the other end of the capacitor 42c, and outputs the divided voltage pulse signal Vdp set by the voltage of the single ended signal Vd and the voltage of the control pulse signal Vct to the non-inverting input terminal of the comparator 42g, with the comparator 42g exhibiting a hysteresis characteristic (that is, the comparator 42g operating as a hysteresis comparator).

This means that according to the waveform shaping circuits 42 depicted in FIGS. 9 and 10, even when noise is superimposed on the single-ended signal Vd either when the single-ended signal Vd is the low potential-side voltage (that is, the voltage in the low voltage period $T_L$) or when the single-ended signal Vd is the high potential-side voltage (that is, the voltage in the high voltage period $T_H$), so long as the voltage level of the noise is lower than the level set by the hysteresis characteristic described above, the switch control circuit SWC can keep the potential of the control pulse signal Vct at the present potential (that is, when the switch 42f is on, the on state is maintained, and when the switch 42f is off, the off state is maintained), which makes it possible to keep the voltage of the single-ended signal Vd in the present state. This means that with these waveform shaping circuits 42, it is possible to make a greater reduction in malfunctions due to noise.

This means that according to signal generation apparatuses 2 provided with the waveform shaping circuits 42 depicted in FIGS. 9 and 10, it is possible to reliably generate the code specifying signal Sf without being affected by temperature and while further reducing malfunctions due to noise, and according to the signal reading system 1 equipped with these signal generation apparatuses 2, it is possible to accurately read CAN frames from the serial bus SB for CAN communication without being affected by temperature and while further reducing malfunctions due to noise, and to output CAN frames Cs that are the same as the read CAN frames to various CAN communication-compatible devices.

Also, according to the waveform shaping circuits 42 depicted in FIGS. 15 and 16 that construct the signal generation apparatus 2, it is possible, even with a configuration that does not use a comparator, to reliably shape the differential signal Vd0 outputted from the differential amplifier circuit 41 into the single-ended signal Vd whose peak-to-peak voltage Vp is equivalent to the peak-to-peak voltage of the AC component $Vd0_{ac}$ of the differential signal Vd0 and whose low potential-side voltage (that is, the voltage during the low voltage period $T_L$) is set at the target constant voltage Vtg or to reliably shape into the single-ended signal Vd whose peak-to-peak voltage Vp is equivalent to the peak-to-peak voltage of the AC component $Vd0_{ac}$ of the differential signal Vd0 and whose high potential-side voltage (that is, the voltage during the high voltage period $T_H$) is set at the target constant voltage Vtg without being affected by temperature, and to output the single-ended signal Vd from the output 42b. By doing so, it is possible to increase the design freedom for the waveform shaping circuit.

Also, in the waveform shaping circuits 42 depicted in FIGS. 13 to 16 described above which construct the signal generation apparatus 2, the switch 42f that constructs the switch circuit SC is constructed of a three-state logic IC (the logic IC 42f) as a three-state buffer. Accordingly, with these waveform shaping circuits 42, an output buffer (or input/output buffer (bidirectional buffer)) incorporated in an integrated circuit can be used as the logic IC 42f.

Also, when the waveform shaping circuit 42 that constructs the signal generation apparatus 2 is equipped with the D/A converter 15 described above, by changing the voltage data Dv provided to the D/A converter 15, it is possible to change the high potential-side voltage (that is, the voltage in the high voltage period $T_H$) or the low potential-side voltage (voltage in the low voltage period $T_L$) set at the target constant voltage Vtg in the single-ended signal Vd. Accordingly, it is possible to easily adjust the target constant voltage Vtg so that the differential signal Vd0 can be reliably shaped into the single-ended signal Vd.

Also, although the signal generation apparatus 2 described above uses a configuration including the electrode portions 11a and 11b, with a configuration where the electrode portions 11a and 11b are separate to the signal generation apparatus 2, it is possible to connect the electrode portions 11a and 11b to the signal generation apparatus 2 via the shielded cables CBa and CBb.

Also, although the switch 42f in each switch circuit SC in the waveform shaping circuits 42 described above and depicted in FIGS. 5, 7, 9 and 10 is configured to operate with positive logic, the switch is not limited to this configuration and may operate with negative logic (so-called "active-low", that is, the switch operates so as to shift to the on state when the control pulse signal Vct is at a low potential and to shift to the off state when the control pulse signal Vct is at a high potential). Note that when the switch 42f is configured to operate with negative logic, it is necessary to change the configuration of the switch control circuit SWC that outputs the control pulse signal Vct. In the following description, the configuration of the waveform shaping circuit when the switch 42f of the waveform shaping circuit 42 depicted in FIGS. 5, 7, 9, and 10 operates with negative logic will be described, including the configuration of the switch control circuit SWC, with reference to FIG. 17 for a waveform shaping circuit 42 corresponding to the waveform shaping circuit 42 in FIG. 5, with reference to FIG. 18 for a waveform shaping circuit 42 corresponding to the waveform shaping circuit 42 in FIG. 7, with reference to FIG. 19 for a waveform shaping circuit 42 corresponding to the waveform shaping circuit 42 in FIG. 9, and with reference to FIG. 20 for a waveform shaping circuit 42 corresponding to the waveform shaping circuit 42 in FIG. 10.

First, the configuration of a waveform shaping circuit 42 with a switch 42f that operates with negative logic will be described with reference to FIG. 17. Note that compared to the waveform shaping circuit 42 depicted in FIG. 5, this waveform shaping circuit 42 has a configuration where the switch 42f operates with negative logic, and aside from a different configuration for the switch control circuit SWC that outputs the control pulse signal Vct as described above, has the same configuration as the waveform shaping circuit 42 depicted in FIG. 5. For this reason, the description below will focus on the switch control circuit SWC of the waveform shaping circuit 42.

In the same way as the switch control circuit SWC of the waveform shaping circuit 42 in FIG. 5, as depicted in FIG. 6, the switch control circuit SWC of this waveform shaping circuit 42 outputs the control pulse signal Vct for shifting the switch 42f to the on state during the low voltage period $T_L$ in the AC component $Vd0_{ac}$ to set (fix) the low potential-side voltage (that is, the voltage in the low voltage period $T_L$) of the single-ended signal Vd at the target constant voltage Vtg and shifting the switch 42f to the off state during the high voltage period $T_H$ in the AC component $Vd0_{ac}$. However, unlike the switch 42f of the waveform shaping circuit 42 in FIG. 5, the switch 42f of the waveform shaping circuit 42 in FIG. 17 operates with negative logic. For this reason, it is necessary for the switch control circuit SWC in FIG. 17 to output a control pulse signal Vct with opposite polarity to the polarity of the control pulse signal Vct outputted from the switch control circuit SWC in FIG. 5 (that is, it is necessary to output a signal with the same polarity as the control pulse signal Vct depicted in FIG. 8).

Figure 17:
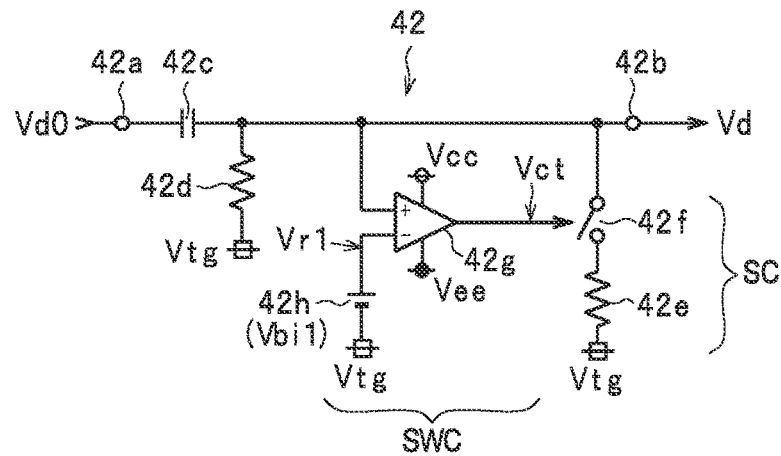
FIG. 17 is a circuit diagram of a waveform shaping circuit 42 where a switch 42f in FIG. 5 is configured to operate with negative logic.

Accordingly, the switch control circuit SWC in the waveform shaping circuit 42 in FIG. 17 has the basic configuration equivalent to the switch control circuit SWC in the waveform shaping circuit 42 depicted in FIG. 7 which outputs the control pulse signal Vct with the polarity depicted in FIG. 8. That is, the switch control circuit SWC in FIG. 17 is configured with the non-inverting input terminal of the comparator 42g connected to the other end of the capacitor 42c and with the reference voltage Vr1 inputted into the inverting input terminal. However, since the waveform shaping circuit 42 in FIG. 17 needs the reference voltage Vr1 to be equivalent to the waveform shaping circuit 42 in FIG. 5, as depicted in FIG. 17, the reference power supply 42h has a configuration equivalent to the waveform shaping circuit 42 in FIG. 5 and outputs a voltage that is higher than the target constant voltage Vtg as the reference voltage Vr1.

With this configuration, the switch control circuit SWC that drives the negative logic switch 42f generates the control pulse signal Vct (a signal with the opposite polarity to the control pulse signal Vct depicted in FIG. 6 (that is, a signal with a low potential in the low voltage period $T_L$ and a high potential in the high voltage period $T_H$)) that shifts from a high potential to a low potential when the voltage at the other end of the capacitor 42c (that is, the voltage of the single-ended signal Vd) has fallen from a state where the reference voltage Vr1 is exceeded and fallen below the reference voltage Vr1 and conversely shifts from the low potential to the high potential when the voltage at the other end of the capacitor 42c (that is, the voltage of the single-ended signal Vd) has risen from a state below the reference voltage Vr1 and now exceeds the reference voltage Vr1, and outputs the control pulse signal Vct to the switch 42f that has negative logic. As a result, the negative logic switch 42f shifts from the on state to the off state and from the off state to the on state at the same timing as the positive logic switch 42f of the waveform shaping circuit 42 depicted in FIG. 5. That is, as depicted in FIG. 17, the waveform shaping circuit 42 including the negative logic switch 42f and the switch control circuit SWC configured for this switch 42f has functions equivalent to the waveform shaping circuit 42 depicted in FIG. 5 (a waveform shaping circuit equipped with the positive logic switch 42f).

Next, the configuration of another waveform shaping circuit 42 with a switch 42f that operates with negative logic will be described with reference to FIG. 18. Note that compared to the waveform shaping circuit 42 depicted in FIG. 7, this waveform shaping circuit 42 has a configuration where the switch 42f operates with negative logic, and aside from a different configuration for the switch control circuit SWC that outputs the control pulse signal Vct as described above, has the same configuration as the waveform shaping circuit 42 depicted in FIG. 7. For this reason, the description below will focus on the switch control circuit SWC of the waveform shaping circuit 42.

In the same way as the switch control circuit SWC of the waveform shaping circuit 42 in FIG. 7, as depicted in FIG. 8, the switch control circuit SWC of this waveform shaping circuit 42 outputs the control pulse signal Vct for shifting the switch 42f to the on state during the high voltage period $T_H$ in the AC component $Vd0_{ac}$ to set (fix) the high potential-side voltage (that is, the voltage in the high voltage period $T_H$) of the single-ended signal Vd at the target constant voltage Vtg and shifting the switch 42f to the off state during the low voltage period $T_L$ in the AC component $Vd0_{ac}$. However, unlike the switch 42f of the waveform shaping circuit 42 in FIG. 7, the switch 42f of the waveform shaping circuit 42 in FIG. 18 operates with negative logic. For this reason, it is necessary for the switch control circuit SWC in FIG. 18 to output a control pulse signal Vct with opposite polarity to the polarity of the control pulse signal Vct outputted from the switch control circuit SWC in FIG. 7 (that is, it is necessary to output a signal with the same polarity as the control pulse signal Vct depicted in FIG. 6).

Figure 18:
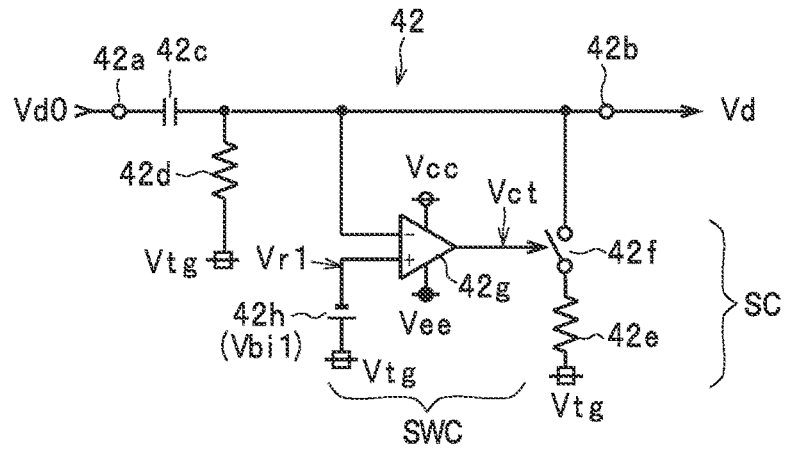
FIG. 18 is a circuit diagram of a waveform shaping circuit 42 where a switch 42f in FIG. 7 is configured to operate with negative logic.

Accordingly, the switch control circuit SWC in the waveform shaping circuit 42 in FIG. 18 has the basic configuration equivalent to the switch control circuit SWC in the waveform shaping circuit 42 depicted in FIG. 5 which outputs the control pulse signal Vct with the polarity depicted in FIG. 6. That is, in the switch control circuit SWC in FIG. 18 is configured with the inverting input terminal of the comparator 42g connected to the other end of the capacitor 42c and the reference voltage Vr1 inputted into the non-inverting input terminal. However, since the waveform shaping circuit 42 in FIG. 18 needs the reference voltage Vr1 to be equivalent to the waveform shaping circuit 42 in FIG. 7, as depicted in FIG. 18, the reference power supply 42h has a configuration equivalent to the waveform shaping circuit 42 in FIG. 7 and outputs a voltage that is lower than the target constant voltage Vtg as the reference voltage Vr1.

With this configuration, the switch control circuit SWC that drives the negative logic switch 42f generates the control pulse signal Vct (a signal with the opposite polarity to the control pulse signal Vct depicted in FIG. 8 (that is, a signal with a low potential in the high voltage period $T_H$ and a low potential in the low voltage period $T_L$)) that shifts from a low potential to a high potential when the voltage at the other end of the capacitor 42c (that is, the voltage of the single-ended signal Vd) has fallen from a state where the reference voltage Vr1 is exceeded and fallen below the reference voltage Vr1 and conversely shifts from the high potential to the low potential when the voltage at the other end of the capacitor 42c (that is, the voltage of the single-ended signal Vd) has risen from a state below the reference voltage Vr1 and now exceeds the reference voltage Vr1, and outputs the control pulse signal Vct to the switch 42f that has negative logic. As a result, the negative logic switch 42f shifts from the on state to the off state and from the off state to the on state at the same timing as the positive logic switch 42f of the waveform shaping circuit 42 depicted in FIG. 7. That is, as depicted in FIG. 18, the waveform shaping circuit 42 including the negative logic switch 42f and the switch control circuit SWC described above configured for this switch 42f has functions equivalent to the waveform shaping circuit 42 depicted in FIG. 7 (a waveform shaping circuit equipped with the positive logic switch 42f).

Next, the configuration of a waveform shaping circuit 42 with a switch 42f that operates with negative logic will be described with reference to FIG. 19. Note that compared to the waveform shaping circuit 42 depicted in FIG. 9, this waveform shaping circuit 42 has a configuration where the switch 42f operates with negative logic, and aside from a different configuration for the switch control circuit SWC that outputs the control pulse signal Vct as described above, has the same configuration as the waveform shaping circuit 42 depicted in FIG. 9. For this reason, the description below will focus on the switch control circuit SWC of the waveform shaping circuit 42.

In the same way as the switch control circuit SWC of the waveform shaping circuit 42 in FIG. 9, as depicted in FIG. 6, the switch control circuit SWC of this waveform shaping circuit 42 outputs the control pulse signal Vct for shifting the switch 42f to the on state during the low voltage period $T_L$ in the AC component $Vd0_{ac}$ to set (fix) the low potential-side voltage (that is, the voltage in the low voltage period $T_L$) of the single-ended signal Vd at the target constant voltage Vtg and shifting the switch 42f to the off state during the high voltage period $T_H$ in the AC component $Vd0_{ac}$. However, unlike the switch 42f of the waveform shaping circuit 42 in FIG. 9, the switch 42f of the waveform shaping circuit 42 in FIG. 19 operates with negative logic. For this reason, it is necessary for the switch control circuit SWC in FIG. 19 to output a control pulse signal Vct with opposite polarity to the polarity of the control pulse signal Vct outputted from the switch control circuit SWC in FIG. 9 (that is, it is necessary to output a signal with the same polarity as the control pulse signal Vct depicted in FIG. 8).

Figure 19:
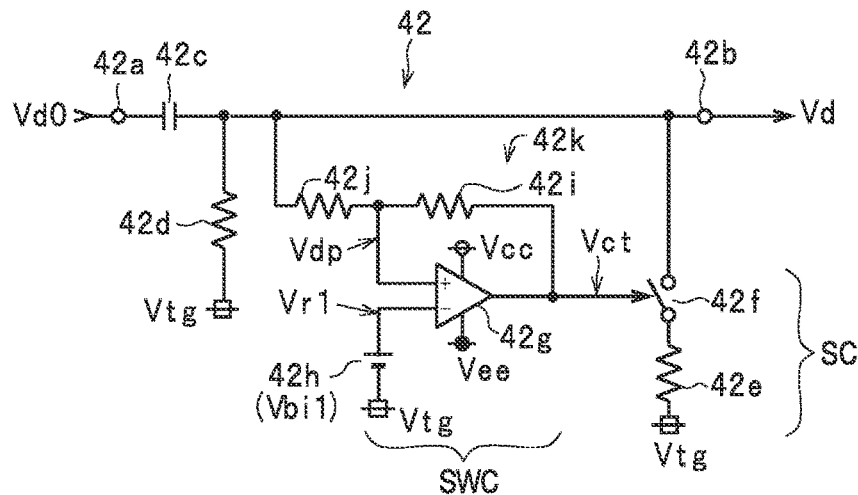
FIG. 19 is a circuit diagram of a waveform shaping circuit 42 where a switch 42f in FIG. 9 is configured to operate with negative logic.

Accordingly, the switch control circuit SWC in the waveform shaping circuit 42 in FIG. 19 has the basic configuration equivalent to the switch control circuit SWC in the waveform shaping circuit 42 depicted in FIG. 10 which outputs the control pulse signal Vct with the polarity depicted in FIG. 8. That is, the switch control circuit SWC in FIG. 19 is configured so that the reference voltage Vr1 is applied to the inverting input terminal of the comparator 42g and the resistance voltage divider circuit 42k is configured so that one end is connected to the output terminal of the comparator 42g, the other end is connected to the other end of the capacitor 42c, and a divided voltage pulse signal Vdp set by the voltage of the single-ended signal Vd and the voltage of the control pulse signal Vct is outputted to the non-inverting input terminal of the comparator 42g. However, since the waveform shaping circuit 42 in FIG. 19 needs the reference voltage Vr1 to be equivalent to the waveform shaping circuit 42 in FIG. 5, as depicted in FIG. 19, the reference power supply 42h has a configuration equivalent to the waveform shaping circuit 42 in FIG. 5 and outputs a voltage that is higher than the target constant voltage Vtg as the reference voltage Vr1.

With this configuration, the switch control circuit SWC that drives the negative logic switch 42f generates the control pulse signal Vct (a signal with the opposite polarity to the control pulse signal Vct depicted in FIG. 6 (that is, a signal with a low potential in the low voltage period $T_L$ and a high potential in the high voltage period $T_H$)) that shifts from a high potential to a low potential when the voltage of the divided voltage pulse signal Vdp that falls in keeping with a fall in the voltage at the other end of the capacitor 42c (that is, the voltage of the single-ended signal Vd) falls from a state where the reference voltage Vr1 is exceeded to below the reference voltage Vr1 and conversely shifts from the low potential to the high potential when the voltage of the divided voltage pulse signal Vdp that rises in keeping with a rise in the voltage at the other end of the capacitor 42c (that is, the voltage of the single-ended signal Vd) rises from a state below the reference voltage Vr1 and now exceeds the reference voltage Vr1, and outputs the control pulse signal Vct to the switch 42f with negative logic. As a result, the negative logic switch 42f shifts from the on state to the off state and from the off state to the on state at the same timing as the positive logic switch 42f of the waveform shaping circuit 42 depicted in FIG. 9. That is, as depicted in FIG. 19, the waveform shaping circuit 42 including the negative logic switch 42f and the switch control circuit SWC described above configured for this switch 42f has functions equivalent to the waveform shaping circuit 42 depicted in FIG. 9 (a waveform shaping circuit equipped with the positive logic switch 42f).

Next, the configuration of another waveform shaping circuit 42 with a switch 42f that operates with negative logic will be described with reference to FIG. 20. Note that compared to the waveform shaping circuit 42 depicted in FIG. 10, this waveform shaping circuit 42 has a configuration where the switch 42f operates with negative logic, and aside from a different configuration for the switch control circuit SWC that outputs the control pulse signal Vct as described above, has the same configuration as the waveform shaping circuit 42 depicted in FIG. 10. For this reason, the description below will focus on the switch control circuit SWC of the waveform shaping circuit 42.

In the same way as the switch control circuit SWC of the waveform shaping circuit 42 in FIG. 10, as depicted in FIG. 8, the switch control circuit SWC of this waveform shaping circuit 42 outputs the control pulse signal Vct for shifting the switch 42f to the on state during the high voltage period $T_H$ in the AC component $Vd0_{ac}$ to set (fix) the high potential-side voltage (that is, the voltage in the high voltage period $T_H$) of the single-ended signal Vd at the target constant voltage Vtg and shifting the switch 42f to the off state during the low voltage period $T_H$ in the AC component $Vd0_{ac}$. However, unlike the switch 42f of the waveform shaping circuit 42 in FIG. 10, the switch 42f of the waveform shaping circuit 42 in FIG. 20 operates with negative logic. This means it is necessary for the switch control circuit SWC in FIG. 20 to output a control pulse signal Vct with opposite polarity to the polarity of the control pulse signal Vct outputted from the switch control circuit SWC in FIG. 10 (that is, to output a signal with the same polarity as the control pulse signal Vct depicted in FIG. 6).

Figure 20:
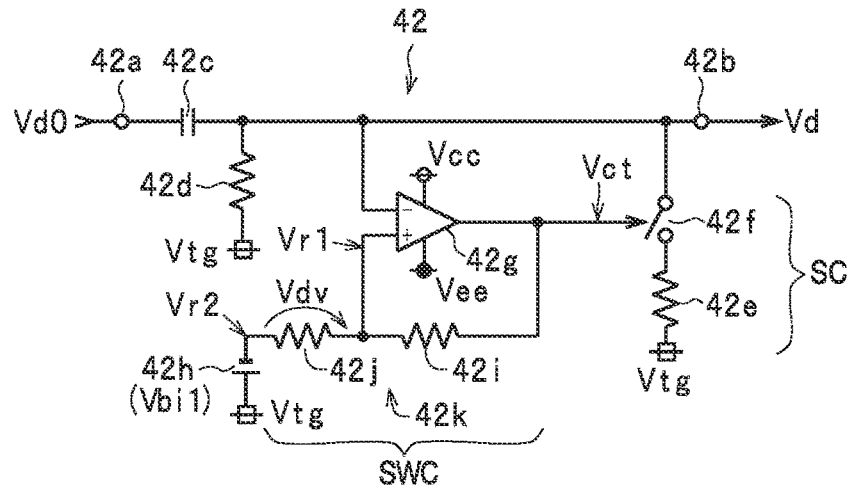
FIG. 20 is a circuit diagram of a waveform shaping circuit 42 where a switch 42f in FIG. 10 is configured to operate with negative logic.

Accordingly, the switch control circuit SWC in the waveform shaping circuit 42 in FIG. 20 has the basic configuration equivalent to the switch control circuit SWC in the waveform shaping circuit 42 depicted in FIG. 9 which outputs the control pulse signal Vct with the polarity depicted in FIG. 6. That is, the switch control circuit SWC in FIG. 20 is configured so that the inverting input terminal of the comparator 42g is connected to the other end of the capacitor 42c and the resistance voltage divider circuit 42k is configured so that one end is connected to the output terminal of the comparator 42g, the reference voltage Vr2 is applied to the other end, and a divided voltage set by the voltage of the reference voltage Vr2 and the voltage of the control pulse signal Vct is outputted to the non-inverting input terminal of the comparator 42g as the reference voltage Vr1. However, since the waveform shaping circuit 42 in FIG. 20 needs the reference voltage Vr1 to be equivalent to the waveform shaping circuit 42 in FIG. 7, as depicted in FIG. 20, the reference power supply 42h is configured to output a voltage that is lower than the target constant voltage Vtg as the reference voltage Vr2.

With this configuration, the switch control circuit SWC that drives the negative logic switch 42f generates the control pulse signal Vct (a signal with the opposite polarity to the control pulse signal Vct depicted in FIG. 8 (that is, a signal with a low potential in the high voltage period $T_H$ and a high potential in the low voltage period $T_L$)) that shifts from a low potential to a high potential when the voltage at the other end of the capacitor 42c (that is, the voltage of the single-ended signal Vd) has fallen from a state above the reference voltage Vr1 (that is, has fallen by a voltage Vdv further than the configuration in FIG. 7) and fallen below the reference voltage Vr1 and conversely shifts from the high potential to the low potential when the voltage at the other end of the capacitor 42c (that is, the voltage of the single-ended signal Vd) has risen from a state below the reference voltage Vr1 (that is, has risen by a voltage Vdv further than the configuration in FIG. 7) and now exceeds the reference voltage Vr1, and outputs the control pulse signal Vct to the switch 42f with negative logic. As a result, the negative logic switch 42f shifts from the on state to the off state and from the off state to the on state at the same timing as the positive logic switch 42f of the waveform shaping circuit 42 depicted in FIG. 10. That is, as depicted in FIG. 20, the waveform shaping circuit 42 including the negative logic switch 42f and the switch control circuit SWC configured for this switch 42f has functions equivalent to the waveform shaping circuit 42 depicted in FIG. 10 (a waveform shaping circuit equipped with the positive logic switch 42f).

In this way, it is also possible to use a configuration in which the switch 42f of the waveform shaping circuit 42 depicted in FIGS. 5, 7, 9, and 10 is replaced with a switch that operates with negative logic (the configurations of the waveform shaping circuits 42 depicted in FIGS. 17, 18, 19, and 20).

Although the signal generation apparatus 2 described above uses a configuration including a signal generator 14 that binarizes the single-ended signal Vd outputted from the waveform shaping circuit 42 and outputs as the code specifying signal Sf, when the coding apparatus 3 is configured so that the single-ended signal Vd can be processed as it is as the code specifying signal Sf (as one example, when the coding apparatus 3 incorporates an apparatus which corresponds to the signal generator 14), the signal generation apparatus 2 may be configured to output the single-ended signal Vd as it is as the code specifying signal Sf (that is, a configuration that does not include the signal generator 14).

In addition, although the signal reading system 1 described above uses a configuration where the signal generation apparatus 2 generates and outputs the code specifying signal Sf where the arrangement pattern of the "high potential periods" and "low potential periods" inverts the logic pattern (that is, the pattern exhibited by the magnitude of the potential difference (Va−Vb)) of the logic signal Sa transferred via the serial bus SB and the coding apparatus 3 executes a coding process that sets the high potential periods in the code specifying signal Sf at "1" in binary data and sets the low potential periods in the code specifying signal Sf at "0" in binary data to specify a code string Cs (or "CAN frames"), although not illustrated, it is also possible to use a configuration where the signal generation apparatus 2 generates and outputs a code specifying signal (that is, a signal where the phase of the code specifying signal Sf described above is inverted) where the arrangement pattern of the "high potential periods" and "low potential periods" matches the logic pattern (that is, the pattern exhibited by the magnitude of the potential difference (Va−Vb)) of the logic signal Sa transferred via the serial bus SB and the coding apparatus 3 executes a coding process that sets the low potential periods in the code specifying signal at "1" in binary data and sets the high potential periods in the code specifying signal at "0" in binary data to specify a code string Cs (or "CAN frames").

In addition, although the respective waveform shaping circuits 42 described above are configured to include the switch circuit SC, which includes a series circuit composed of the second impedance element 42e and the switch 42f that are connected in series, and to supply (apply), when the voltage of either the high potential-side voltage (that is, the voltage in the high voltage period) or the low potential-side voltage (that is, the voltage in the low voltage period) in the single-ended signal Vd is set (fixed) at the target constant voltage Vtg, the target constant voltage Vtg with a low impedance via the second impedance element 42e (a resistor with a sufficiently low resistance value) to the output 42b where the single-ended signal Vd is outputted, the present invention is not limited to this configuration.

When the waveform shaping circuit 42 depicted in FIGS. 5, 7, 9, 10, 13 to 16 are given as examples, it is also possible, as indicated by the corresponding waveform shaping circuits 42 in FIGS. 21 to 28, to use a configuration where the second impedance element 42e is omitted (by shorting) so that the target constant voltage Vtg is directly supplied via only the switch 42f in the on state (that is, a configuration that can supply the target constant voltage Vtg with much lower impedance). Note that as this configuration, as depicted in FIGS. 21 to 28, it is assumed here that a configuration is used where a third impedance element 42r is disposed between the other end of the capacitor 42c and the output 42b (a configuration where the other end of the capacitor 42c is connected to the output 42b via the third impedance element 42r).

First, the detailed configuration of the waveform shaping circuit 42 in FIG. 21 will be described in comparison with the waveform shaping circuit 42 in FIG. 5 whose basic configuration is related. Note that components that are the same as in the waveform shaping circuit 42 in FIG. 5 have been assigned the same reference numerals and duplicated description thereof is omitted. In the waveform shaping circuit 42 in FIG. 21, the second impedance element 42e of the waveform shaping circuit 42 depicted in FIG. 5 is omitted (by shorting). That is, only the switch 42f is disposed between the potential of the target constant voltage Vtg and the output 42b. In the waveform shaping circuit 42 in FIG. 21, the newly added third impedance element 42r is connected at one end to the other end (the end to which the inverting input terminal of the comparator 42g is connected) of the capacitor 42c and is connected at the other end to the output 42b so as to place the third impedance element 42r between the other end of the capacitor 42c and the output 42b.

Figure 21:
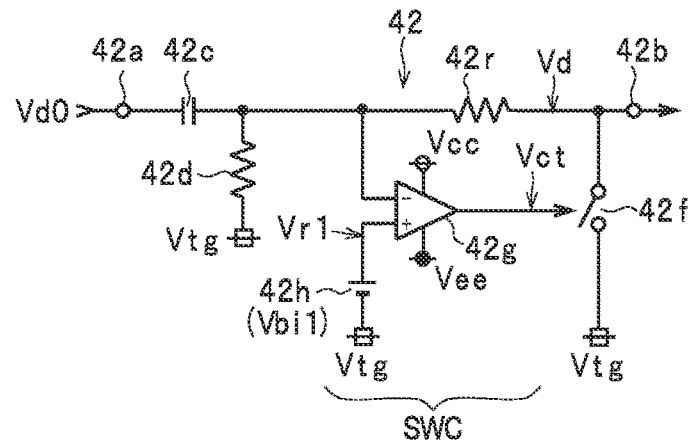
FIG. 21 is a circuit diagram of a waveform shaping circuit 42 with a configuration where a second impedance element 42e in FIG. 5 has been omitted.

By using this configuration, with the waveform shaping circuit 42 in FIG. 21, it is possible to apply the target constant voltage Vtg to the output 42b with extremely low impedance via the switch 42f in the on state (that is, much lower impedance than the configuration in FIG. 5 where the target constant voltage Vtg is applied via the second impedance element 42e). With this configuration, the waveform shaping circuit 42 in FIG. 21 functions in a similar way to the waveform shaping circuit 42 in FIG. 5 to generate and output the single-ended signal Vd from the differential signal Vd0, and can steepen falls in the single-ended signal Vd (that is, reduce the time taken to shift to the target constant voltage Vtg). As a result, by comparing with the threshold voltage Vth that has been set with a target constant voltage Vtg as a standard at the signal generator 14 disposed downstream, it is possible to generate the code specifying signal Sf by binarizing the single-ended signal Vd with higher reliability and a more accurate pulse width.

Next, the specific configuration of the waveform shaping circuit 42 in FIG. 22 will be described in comparison with the waveform shaping circuit 42 in FIG. 7 whose basic configuration is related. Note that components that are the same as in the waveform shaping circuit 42 in FIG. 7 have been assigned the same reference numerals, and duplicated description thereof is omitted. In the waveform shaping circuit 42 in FIG. 22, the second impedance element 42e of the waveform shaping circuit 42 depicted in FIG. 7 is omitted (by shorting). That is, only the switch 42f is disposed between the potential of the target constant voltage Vtg and the output 42b. In the waveform shaping circuit 42 in FIG. 22, the newly added third impedance element 42r is connected at one end to the other end (the end to which the non-inverting input terminal of the comparator 42g is connected) of the capacitor 42c and is connected at the other end to the output 42b so as to place the third impedance element 42r between the other end of the capacitor 42c and the output 42b.

Figure 22:
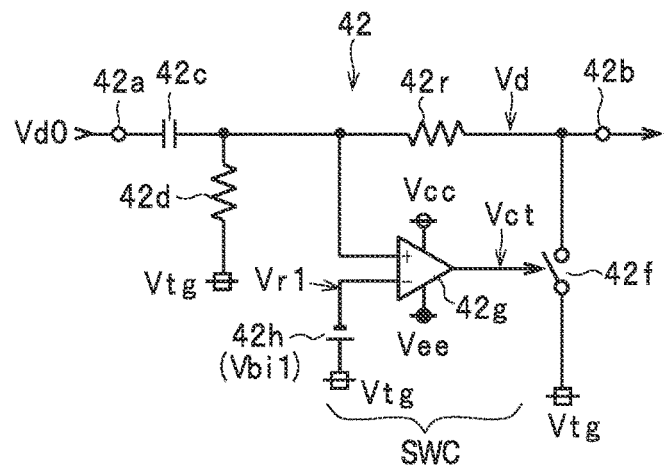
FIG. 22 is a circuit diagram of a waveform shaping circuit 42 with a configuration where a second impedance element 42e in FIG. 7 has been omitted.

By using this configuration, with the waveform shaping circuit 42 in FIG. 22 also, it is possible to apply the target constant voltage Vtg to the output 42b with extremely low impedance via the switch 42f in the on state (that is, much lower impedance than the configuration in FIG. 7 where the target constant voltage Vtg is applied via the second impedance element 42e). With this configuration, the waveform shaping circuit 42 in FIG. 22 functions in a similar way to the waveform shaping circuit 42 in FIG. 7 to generate and output the single-ended signal Vd from the differential signal Vd0, and can steepen rises in the single-ended signal Vd (that is, further reduce the time taken to shift to the target constant voltage Vtg). As a result, in the same way as with the waveform shaping circuit 42 in FIG. 21, at the signal generator 14 disposed downstream, it is possible to generate the code specifying signal Sf that has been binarized with a more accurate pulse width.

Next, the specific configurations of the waveform shaping circuits 42 in FIGS. 23 and 25 will be described with the waveform shaping circuit 42 in FIG. 23 in comparison with the waveform shaping circuit 42 in FIG. 9 whose basic configuration is related and the waveform shaping circuit 42 in FIG. 25 in comparison with the waveform shaping circuit 42 in FIG. 13 whose basic configuration is related. Note that components that are the same as in the waveform shaping circuits 42 in FIGS. 9 and 13 have been assigned the same reference numerals and duplicated description thereof is omitted. In the waveform shaping circuits 42 in FIGS. 23 and 25 also, the second impedance element 42e of the waveform shaping circuits 42 depicted in FIGS. 9 and 13 is omitted (by shorting). That is, only the switch 42f is disposed between the potential of the target constant voltage Vtg and the output 42b. In the waveform shaping circuits 42 in FIGS. 23 and 25, the newly added third impedance element 42r is connected at one end to the other end (the end to which the inverting input terminal of the comparator 42g is connected) of the capacitor 42c and is connected at the other end to the output 42b so as to place the third impedance element 42r between the other end of the capacitor 42c and the output 42b.

Figure 23:
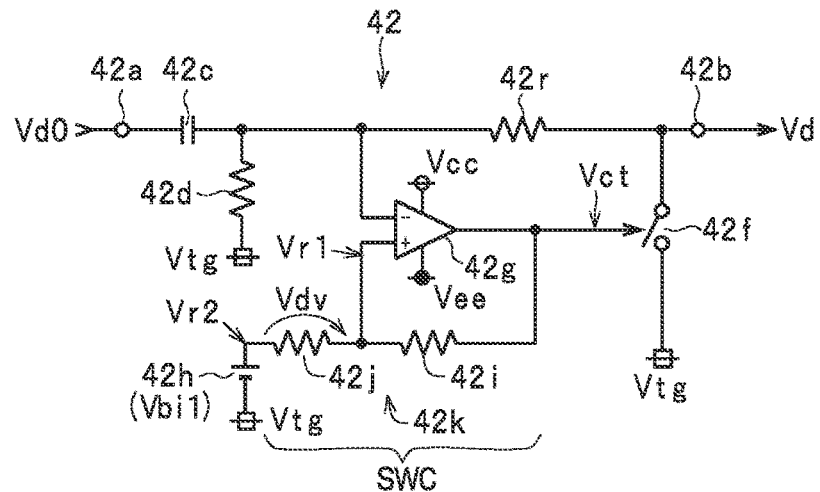
FIG. 23 is a circuit diagram of a waveform shaping circuit 42 with a configuration where a second impedance element 42e in FIG. 9 has been omitted.
Figure 25:
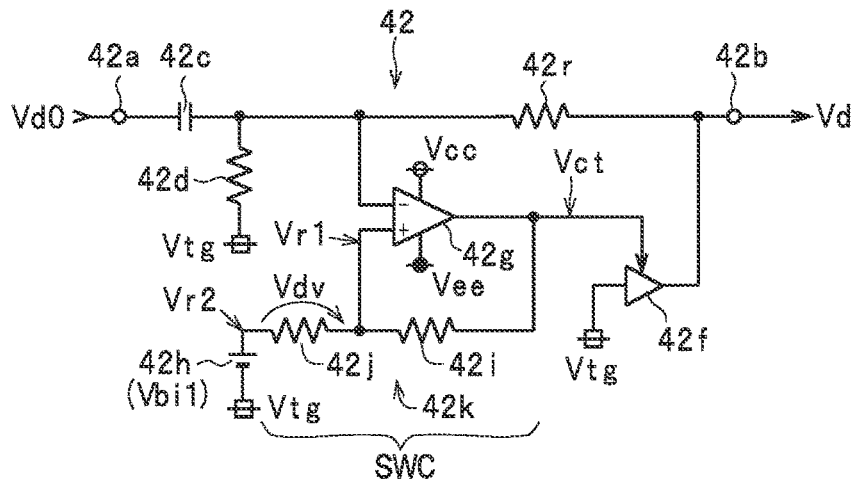
FIG. 25 is a circuit diagram of a waveform shaping circuit 42 with a configuration where a second impedance element 42e in FIG. 13 has been omitted.

By using this configuration, with the waveform shaping circuit 42 in FIGS. 23 and 25 also, it is possible to apply the target constant voltage Vtg to the output 42b with extremely low impedance via the switch 42f in the on state (that is, much lower impedance than the configurations in FIGS. 9 and 13 where the target constant voltage Vtg is applied via the second impedance element 42e). With this configuration, the waveform shaping circuits 42 in FIGS. 23 and 25 function in a similar way to the waveform shaping circuits 42 in FIGS. 9 and 13 to generate and output the single-ended signal Vd from the differential signal Vd0, and can steepen falls in the single-ended signal Vd (that is, reduce the time taken to shift to the target constant voltage Vtg). By doing so, in the same way as the waveform shaping circuit 42 in FIG. 21, at the signal generator 14 disposed downstream, it is possible to generate the code specifying signal Sf that has been binarized with a more accurate pulse width.

Next, the specific configurations of the waveform shaping circuits 42 in FIGS. 24 and 26 will be described with the waveform shaping circuit 42 in FIG. 24 in comparison with the waveform shaping circuit 42 in FIG. 10 whose basic configuration is related and the waveform shaping circuit 42 in FIG. 26 in comparison with the waveform shaping circuit 42 in FIG. 14 whose basic configuration is related. Note that components that are the same as in the waveform shaping circuits 42 in FIGS. 10 and 14 have been assigned the same reference numerals and duplicated description thereof is omitted. In the waveform shaping circuits 42 in FIGS. 24 and 26 also, the second impedance element 42e of the waveform shaping circuits 42 depicted in FIGS. 10 and 14 is omitted (by shorting). That is, only the switch 42f is disposed between the potential of the target constant voltage Vtg and the output 42b. In the waveform shaping circuits 42 in FIGS. 24 and 26, the newly added third impedance element 42r is connected at one end to the other end (the other end (or resistor 42j-side end) of the resistance voltage divider circuit 42k constructed of the two resistors 42i and 42j connected in series) of the capacitor 42c and is connected at the other end to the output 42b so as to place the third impedance element 42r between the other end of the capacitor 42c and the output 42b.

Figure 24:
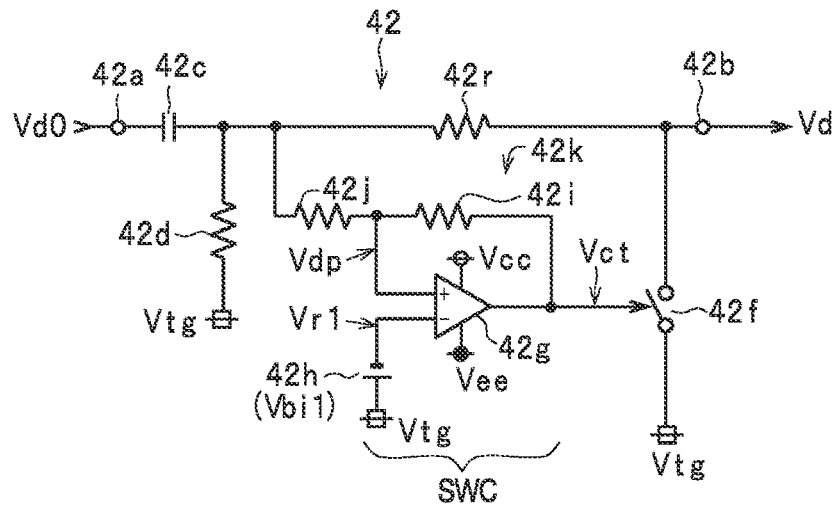
FIG. 24 is a circuit diagram of a waveform shaping circuit 42 with a configuration where a second impedance element 42e in FIG. 10 has been omitted.
Figure 26:
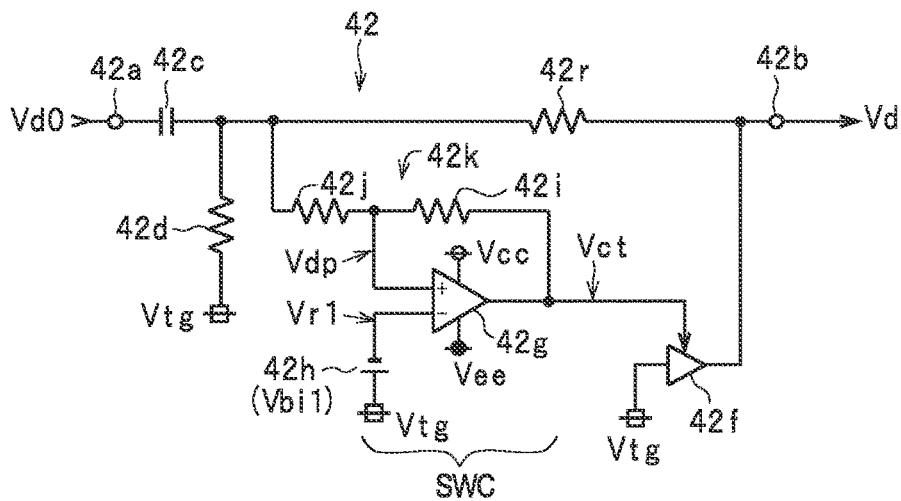
FIG. 26 is a circuit diagram of a waveform shaping circuit 42 with a configuration where a second impedance element 42e in FIG. 14 has been omitted.

By using this configuration, with the waveform shaping circuits 42 in FIGS. 24 and 26 also, it is possible to apply the target constant voltage Vtg to the output 42b with extremely low impedance via the switch 42f in the on state (that is, much lower impedance than the configurations in FIGS. 10 and 14 where the target constant voltage Vtg is applied via the second impedance element 42e). With this configuration, the waveform shaping circuits 42 in FIGS. 24 and 26 function in a similar way to the waveform shaping circuits 42 in FIGS. 10 and 14 to generate and output the single-ended signal Vd from the differential signal Vd0, and can steepen rises in the single-ended signal Vd (that is, further reduce the time taken to shift to the target constant voltage Vtg). By doing so, in the same way as the waveform shaping circuit 42 in FIG. 21, at the signal generator 14 disposed downstream, it is possible to generate the code specifying signal Sf that has been binarized with a more accurate pulse width.

Figure 27:
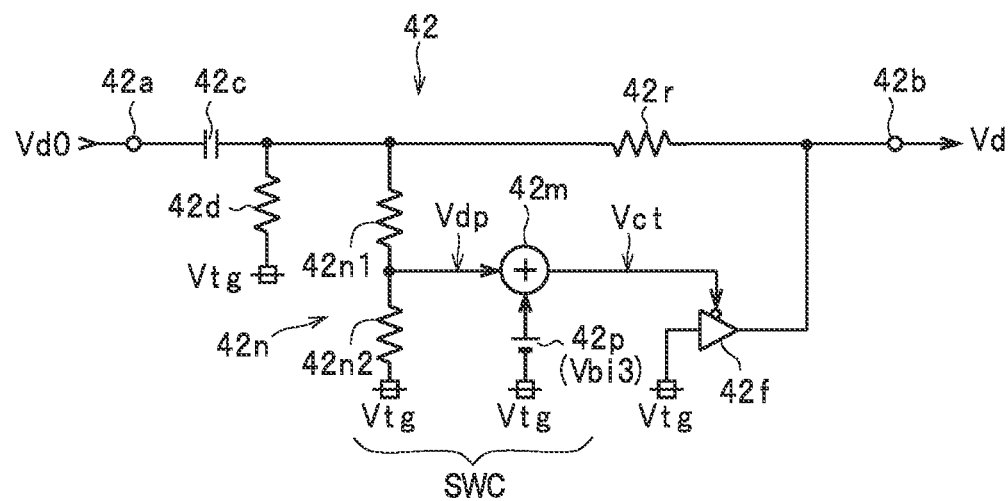
FIG. 27 is a circuit diagram of a waveform shaping circuit 42 with a configuration where a second impedance element 42e in FIG. 15 has been omitted.
Figure 28:
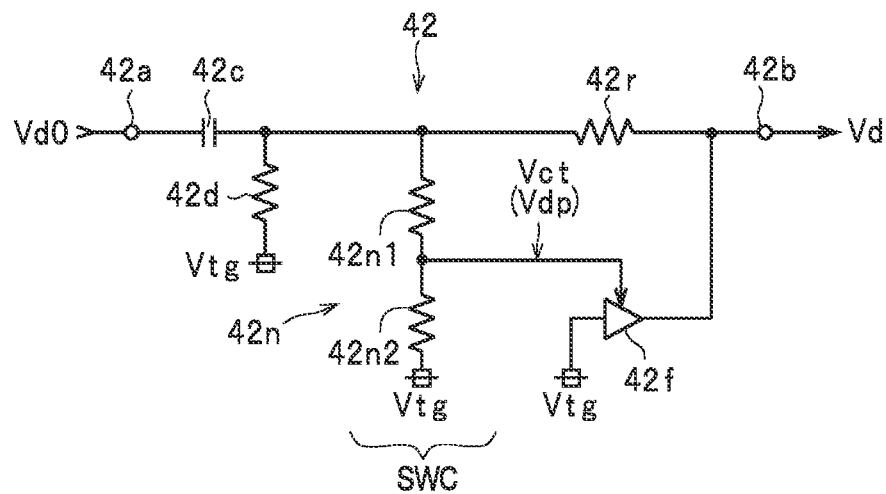
FIG. 28 is a circuit diagram of a waveform shaping circuit 42 with a configuration where a second impedance element 42e in FIG. 16 has been omitted.

For the waveform shaping circuit 42 depicted in FIG. 15, it is also possible to use a configuration where, like the waveform shaping circuits 42 depicted in FIGS. 21 to 26 described above, the second impedance element 42e is omitted (by shorting) and a third impedance element 42r is newly added to construct the waveform shaping circuit 42 depicted in FIG. 27. Likewise, for the waveform shaping circuit 42 depicted in FIG. 16, it is also possible to use a configuration where, like the waveform shaping circuits 42 depicted in FIGS. 21 to 26 described above, the second impedance element 42e is omitted (by shorting) and a third impedance element 42r is newly added to construct the waveform shaping circuit 42 depicted in FIG. 28.

In the same way as the waveform shaping circuits 42 depicted in FIGS. 21, 23, and 25, the waveform shaping circuit 42 depicted in FIG. 27 can generate and output a single-ended signal Vd from the differential signal Vd0 and can steepen falls in the single-ended signal Vd (that is, further reduce the time taken to shift to the target constant voltage Vtg). In the same way as the waveform shaping circuits 42 depicted in FIGS. 22, 24, and 26, the waveform shaping circuit 42 depicted in FIG. 28 can generate and output a single-ended signal Vd from the differential signal Vd0 and can steepen rises in the single-ended signal Vd (that is, further reduce the time taken to shift to the target constant voltage Vtg). By doing so, in the same way as the waveform shaping circuit 42 depicted in FIG. 21, the waveform shaping circuits 42 depicted in FIGS. 27 and 28 make it possible to generate a code specifying signal Sf that has been binarized with a more accurate pulse width at the signal generator 14 disposed downstream.

Although not illustrated, in the same way as the waveform shaping circuits 42 depicted in FIGS. 21 to 24, it is also possible for the respective waveform shaping circuits 42 depicted in FIGS. 17, 18, 19, and 20 (that is, circuits where the switch 42f operates with negative logic) to use a configuration where the second impedance element 42e is omitted (by shorting) and the third impedance element 42r is newly added, which makes it possible to directly supply the target constant voltage Vtg via only the switch 42f in the on state. According to a signal reading system 1 with a signal generation apparatus 2 equipped with any of the waveform shaping circuits 42 described above that use a configuration where the second impedance element 42e is omitted (by shorting) and the third impedance element 42r is added, it is possible to specify codes Cs indicated by the logic signal Sa much more reliably based on the code specifying signal Sf and to specify a CAN frame constructed of a string of the specified codes Cs more reliably.

Also, in this signal reading system 1, as described with reference to FIG. 2, the electrode portion 11a to be attached to one of the coated conductors La of the serial bus SB is connected to the signal generation apparatus 2 via the shielded cable CBa and the electrode portion 11b to be attached to the other coated conductor Lb of the serial bus SB is connected to the signal generation apparatus 2 via a shielded cable CBb that is separate to the shielded cable CBa.

Figure 29:
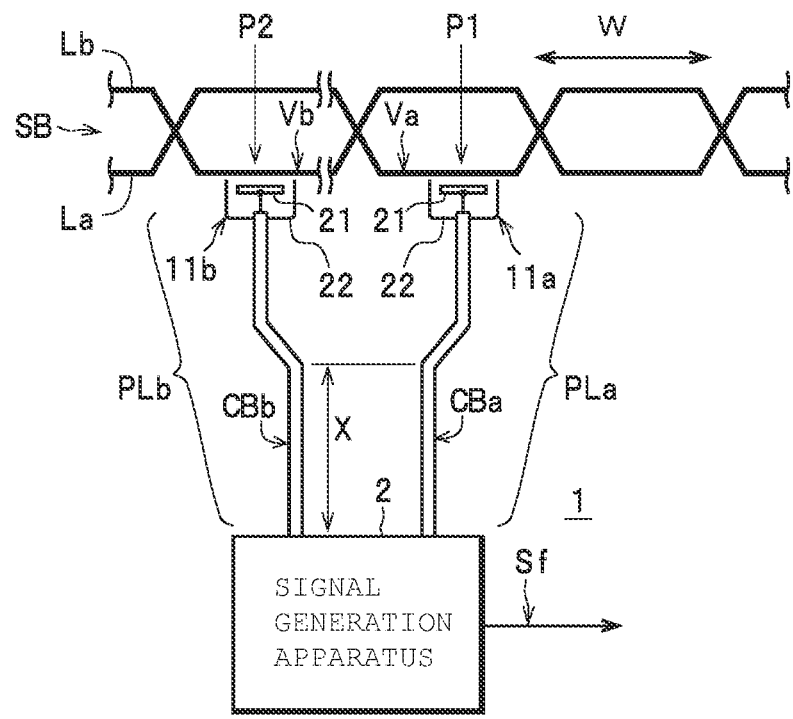
FIG. 29 is a block diagram useful in explaining a configuration that connects the signal generation apparatus 2 to coated conductors La and Lb.

That is, in the signal reading system 1, as depicted in FIG. 29, one of the electrodes 21, which is the electrode 21 of the electrode portion 11a, is connected to a free end-side of the first shielded cable CBa, whose base end portion-side is connected to the first impedance element 12a in the signal generation apparatus 2 (not depicted in FIG. 29). This means that the electrode portion 11a and the first shielded cable CBa function as a first detection probe PLa which connects the signal generation apparatus 2 (in more detail, the first impedance element 12a inside the signal generation apparatus 2) to one of the coated conductors La via non-metallic contact (that is, connection via a coupling capacitance). The other electrode 21, which is the electrode 21 of the electrode portion 11b, is connected to a free end-side of the second shielded cable CBb (a shielded cable that is separate to the first shielded cable CBa), whose base end portion-side is connected to the second impedance element 12b in the signal generation apparatus 2 (not depicted in FIG. 29). This means that the electrode portion 11b and the second shielded cable CBb function as a second detection probe PLb (a separate detection probe to the first detection probe PLa) which connects the signal generation apparatus 2 (in more detail, the second impedance element 12b inside the signal generation apparatus 2) to the other coated conductor Lb via non-metallic contact (that is, connection via a coupling capacitance).

With this configuration (that is, a configuration where the electrode portions 11a and 11b are disposed at the free end-sides of a pair of detection probes PLa and PLb that are formed separately), unlike a configuration where the electrode portions 11a and 11b are integrally formed, this signal reading system 1 makes it possible as depicted in FIG. 29 to attach and use the electrode portions 11a and 11b at two arbitrary positions that are separated along the longitudinal direction (or length direction) W of the serial bus SB (as depicted in FIG. 29, with the electrode portion 11a located at a first position Ph on the coated conductor La out of the coated conductors La and Lb that are usually twisted together and the electrode portion 11b at a second position P2 on the coated conductor Lb constructing the serial bus SB). This means that unlike a configuration, not illustrated, where the electrode portions 11a and 11b are integrally formed and attached at the same position along the longitudinal direction W in the serial bus SB (that is, a configuration that requires a task of unwinding the twisted coated conductors La and Lb at this position and separating the coated conductors La and Lb by a distance that enables the electrode portions 11a and 11b to be attached and a task of simultaneously attaching the electrode portions 11a and 11b to the corresponding coated conductors La and Lb at this position), it is possible to attach the electrode portions 11a and 11b to arbitrary positions P1 and P2 where attachment is easy (in the present embodiment, it is possible to unwind and attach to the twisted coated conductors La and Lb at each position P1 and P2). Also, since the electrode portions 11a and 11b are attached at different positions P1 and P2 along the longitudinal direction W of the serial bus SB, it is possible to reduce the amount of unwinding of the twisted coated conductors La and Lb performed at the respective positions P1 and P2. This means that according to this signal reading system 1, the electrode portions 11a and 11b can be reliably attached to the serial bus SB and the time required for attachment can be shortened (that is, attachment is improved).

Note that although not illustrated, it is also possible to use a configuration where the detection probes PLa and PLb are detachably connected to the signal generation apparatus 2 of the signal reading system 1 via a connector. The detection probes PLa and PLb may be connected to the signal generation apparatus 2 via one common connector, and parts at the base end sides of the detection probes PLa and PLb (for example, the parts X depicted in FIG. 29) may be integrated (combined) using a heat-shrinkable tube or the like in a state where parts on the electrode portion 11a and 11b-sides are somewhat exposed. Although the signal reading system 1 in FIG. 29 is configured with the base end sides of the detection probes PLa and PLb individually connected to the signal generation apparatus 2, the signal reading system 1 is not limited to this configuration.

Figure 30:
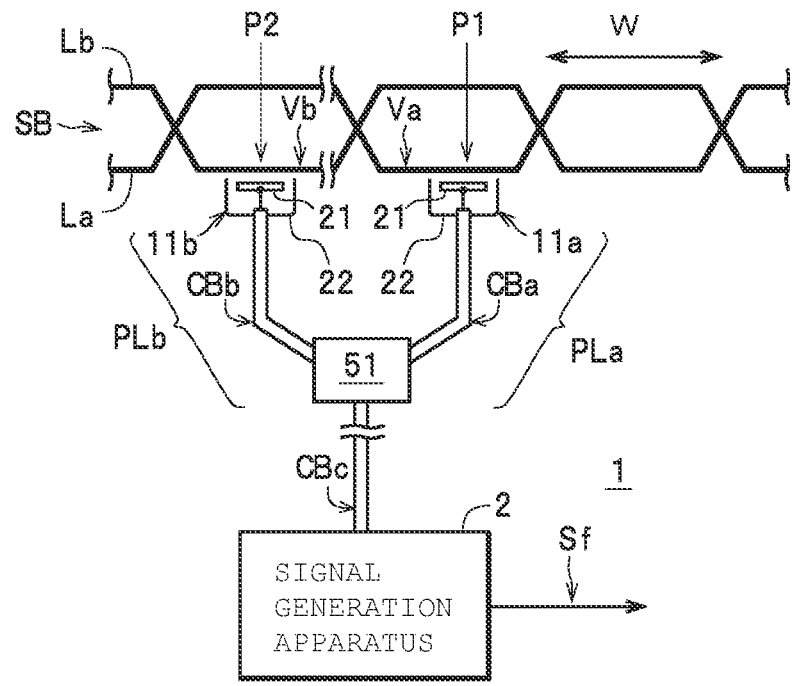
FIG. 30 is a block diagram useful in explaining another configuration that connects the signal generation apparatus 2 to coated conductors La and Lb.

As one example, like the signal reading system 1 depicted in FIG. 30, it is also possible to use a configuration where the base end sides of the detection probes PLa and PLb are connected to a connector 51, such as a connection box, which is connected to the signal generation apparatus 2 via a two-core shielded wire CBc. In this configuration, a base-end portion side of the two-core shielded wire CBc is connected to the signal generation apparatus 2 via a connector, not illustrated, the two core wires are connected to the respective impedance elements 12a and 12b inside the signal generation apparatus 2 via the connector, and a shield, not illustrated, is connected to the ground G in the signal generation apparatus 2 via the connector. The connector 51 is connected to the free end-side of the two-core shielded wire CBc. With this configuration, inside the connector 51, one of the core wires that is included in the two-core shielded wire CBc and connected to the impedance element 12a is connected to a core wire of the shielded cable that constructs the corresponding detection probe PLa, the other of the core wires that is included in the two-core shielded wire CBc and connected to the impedance element 12b is connected to a core wire of the shielded cable that constructs the corresponding detection probe PLb, and a connection circuit, not illustrated, for connecting the shield of the two-core shielded wire CBc to shields of the shielded cables constructing the detection probes PLa and PLb is incorporated.

Figure 31:
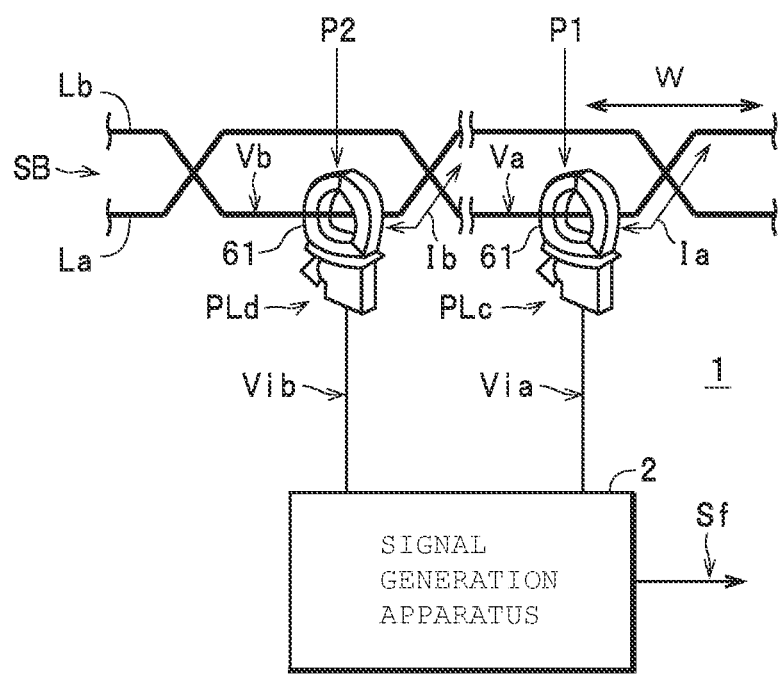
FIG. 31 is a block diagram useful in explaining another configuration that connects the signal generation apparatus 2 to coated conductors La and Lb using current detection probes PLc and PLd.

Also with the signal reading system depicted in FIG. 30, since the electrode portions 11a and 11b are disposed on the free end-sides of the pair of detection probes PLa and PLb that are formed separately, it is possible to achieve the effect equivalent to the signal reading system 1 depicted in FIG. 31 described above.

In addition, although the respective signal reading systems 1 described above are configured so that the signal generation apparatus 2 is connected to the coated conductors La and Lb via the electrode portions 11a and 11b, which become capacitively coupled to the metal parts (that is, the core wires) of the coated conductors La and Lb, and the shielded cables CBa and CBb, generates the voltage signals Vc1 and Vc2, whose voltages change in keeping with the voltages Va and Vb of the voltage signals Va and Vb being transferred on the coated conductors La and Lb, and generates a code specifying signal Sf capable of specifying the code Cs corresponding to the voltage signals Va and Vb based on the voltage signals Vc1 and Vc2, (that is, a configuration using the detection probes PLa and PLb described above that function as voltage detection probes), the signal reading system 1 is not limited to this configuration.

As one example, in place of the detection probes PLa and PLb, as depicted in FIG. 31, it is also possible to use a configuration where a pair of current detection probes PLc and PLd (preferably clamp-type current detection probes that can be attached to the coated conductors La and Lb without cutting the coated conductors La and Lb) are connected to the signal generation apparatus 2 and a code specifying signal Sf is generated. Although various known current detection probes can be used as the current detection probes PLc and PLd, in the following description, an example using the current detection probe disclosed in Japanese Laid-open Patent Publication No. 2006-343109 filed by the present applicant will be described.

As depicted in FIG. 31, the current detection probes PLc and PLd have the same configuration and each include a clamp 61, which is formed in a substantially circular shape and has a front end that can be opened and closed, and a current sensor (not illustrated), which is composed of a coil where a winding is wound around a magnetic core such as an iron core or the like disposed inside the clamp 61. With this current sensor, in a state (or "clamped state") where the corresponding coated conductors (that is, the coated conductor La for the current detection probe PLc and the coated conductor Lb for the current detection probe PLd) have been clamped by the respective clamps 61, the currents flowing through the corresponding coated conductors (that is, the current Ia flowing through the coated conductor La and the current Ib flowing through the coated conductor Lb) are detected, and current corresponding signals Vi, whose amplitudes are proportional to the current values (that is, a current corresponding signal Via for the current Ia and a current corresponding signal Vib for the current Ib), are outputted to the signal generation apparatus 2 as detection signals. Note that although the current detection probes PLc and PLd are configured as AC current detection probes (that is, alternating current detection probes) in the above configuration, it should be obvious it is also possible to use the current detection probes PLc and PLd as DC current detection probes (that is, direct current detection probes) that can measure not only AC current but also DC current.

Since the current value of the current Ia flowing through the coated conductor La changes in keeping with the voltage Va of the voltage signal Va transferred on the coated conductor La, the voltage value of the current corresponding signal Via changes in keeping with the voltage Va of the voltage signal Va. Likewise, since the current value of the current Ib flowing through the coated conductor Lb changes in keeping with the voltage Vb of the voltage signal Vb transferred on the coated conductor Lb, the voltage value of the current corresponding signal Vib changes in keeping with the voltage Vb of the voltage signal Vb. Accordingly, even with a configuration where the current detection probes PLc and PLd are connected to the signal generation apparatus 2, in the same way as the configuration described above where the detection probes PLa and PLb are connected, the differential amplifier circuit 41 (that is, any one of the various differential amplifier circuits 41 described above) generates and outputs the differential signal Vd0 based on the current corresponding signals Via and Vib, the waveform shaping circuit 42 (that is, any one of the various waveform shaping circuits 42 described above) generates the single-ended signal Vd from this differential signal Vd0 and outputs the single-ended signal Vd, and the signal generator 14 (the signal generator 14 corresponding to the waveform shaping circuit 42 out of the various signal generators 14 described above) can binarize the single-ended signal Vd to generate and output the code specifying signal Sf (see FIG. 2).

This means that according to the signal generation apparatus 2 with the configuration depicted in FIG. 31 and the signal reading system 1 equipped with this signal generation apparatus 2, by performing a simple operation of attaching the current detection probes PLc and PLd (in this example, by clamping the clamps 61) to arbitrary parts in the longitudinal direction W of the pair of coated conductors La and Lb, it is possible to generate the code specifying signal Sf that can specify the code Cs indicated by the logic signal Sa being transferred via the serial bus SB, to specify the codes Cs indicated by the logic signal Sa based on the generated code specifying signal Sf, and to also specify a CAN frame composed of a string of the specified codes Cs. By doing so, when a connector is not provided on the serial bus SB, or even if a connector has been provided on the serial bus SB, it is possible to read the logic signal Sa at arbitrary locations (the first position P1 and the second position P2) on the serial bus SB and to specify the code Cs and a CAN frame composed of the code Cs.

INDUSTRIAL APPLICABILITY

According to the present invention, since a switch circuit does not include a diode that is affected by temperature, it is possible to reliably shape an input pulse signal into an output pulse signal whose peak-to-peak voltage is equivalent to the peak-to-peak voltage of the AC component of the input pulse signal and whose low potential-side voltage is set at a constant voltage (that is, a target constant voltage that is not affected by temperature) applied from the switch circuit, or to reliably shape an input pulse signal into an output pulse signal whose peak-to-peak voltage is equivalent to the peak-to-peak voltage of the AC component of the input pulse signal and whose high potential-side voltage is set at a constant voltage applied from the switch circuit, and to output the output pulse signal from an output. Accordingly, it is possible to widely apply the present invention to waveform shaping circuits that shape an input pulse signal into an output pulse signal whose low potential-side voltage or high potential-side voltage is set at a target constant voltage that is not affected by temperature.

REFERENCE SIGNS LIST

1 Signal reading system
2 Signal generation apparatus
42 Waveform shaping circuit
42a Input
42b Output
42c Capacitor
42d First impedance element
42e Second impedance element
42f Switch
SC Series circuit
SWC Switch control circuit
Vd Single-ended signal
Vd0 Differential voltage signal
Vtg Target constant voltage

What is claimed is:

1. A waveform shaping circuit comprising:
a capacitor with one end connected to an input where an input pulse signal is inputted and another end connected to an output;
a first impedance element that has one end, which is connected to the other end of the capacitor, and another end, to which a target constant voltage is applied, and supplies the target constant voltage to the other end of the capacitor;
a switch circuit that includes a switch without including a diode, has one end connected to the output and has another end to which the target constant voltage is applied, applies, in a state where the switch is on, the target constant voltage to the output and stops, in a state where the switch is off, application of the target constant voltage to the output; and
a switch control circuit that generates and outputs, based on the input pulse signal, a control pulse signal that shifts the switch into the on state during a high voltage period in an AC component of the input pulse signal and shifts the switch to the off state during a low voltage period of the AC component,
wherein the waveform shaping circuit shapes the input pulse signal into an output pulse signal whose peak-to-peak voltage is equivalent to a peak-to-peak voltage of the AC component and whose voltage during the high voltage period is set at the target constant voltage, and outputs the output pulse signal from the output.

2. The waveform shaping circuit according to claim 1, wherein the switch is configured to shift to the on state when the control pulse signal is at a high potential and to shift to the off state when the control pulse signal is at a low potential, and
the switch control circuit includes a comparator whose non-inverting input terminal is connected to the other end of the capacitor, whose inverting input terminal inputs a reference voltage that is lower than the target constant voltage, and whose output terminal outputs the control pulse signal.

3. The waveform shaping circuit according to claim 1, wherein the switch is configured to shift to the on state when the control pulse signal is at a low potential and to shift to the off state when the control pulse signal is at a high potential, and
the switch control circuit includes a comparator whose inverting input terminal is connected to the other end of the capacitor, whose non-inverting input terminal inputs a reference voltage that is lower than the target constant voltage, and whose output terminal outputs the control pulse signal.

4. The waveform shaping circuit according to claim 1, wherein the switch is configured to shift to the on state when the control pulse signal is at a high potential and to shift to the off state when the control pulse signal is at a low potential, and
the switch control circuit includes:
a comparator that has one of the target constant voltage and a voltage in the vicinity of the target constant voltage applied to an inverting input terminal and outputs the control pulse signal from an output terminal; and
a resistance voltage divider circuit that has one end connected to the output terminal, has another end connected to the other end of the capacitor, and outputs a divided voltage pulse signal, which is set by a voltage of the output pulse signal and a voltage of the control pulse signal, to a non-inverting input terminal of the comparator.

5. The waveform shaping circuit according to claim 1, wherein the switch is configured to shift to the on state when the control pulse signal is at a low potential and to shift to the off state when the control pulse signal is at a high potential, and
the switch control circuit includes:
a comparator whose inverting input terminal is connected to the other end of the capacitor and whose output terminal outputs the control pulse signal; and
a resistance voltage divider circuit that has one end connected to the output terminal, has another end to which one of the target constant voltage and a voltage in the vicinity of the target constant voltage is applied, and outputs a divided voltage, which is set by the one of the target constant voltage and the voltage in the vicinity of the target constant voltage and a voltage of the control pulse signal, as a reference voltage to a non-inverting input terminal of the comparator.

6. A signal generation apparatus that generates, based on a two-wire differential voltage-type logic signal transferred via a communication path composed of a pair of coated conductors, a code specifying signal capable of specifying a code corresponding to the logic signal,
wherein the signal generation apparatus comprises:
a fourth impedance element that is connected to one electrode out of a pair of electrodes that are respectively placed in contact with coated portions of the pair of coated conductors and generates a first voltage signal whose voltage changes in keeping with a voltage being transferred on one coated conductor, which is capacitively coupled to the one electrode, out of the pair of coated conductors;
a fifth impedance element that is connected to another electrode out of the pair of electrodes and generates a second voltage signal whose voltage changes in keeping with a voltage being transferred on another coated conductor, which is capacitively coupled to the other electrode, out of the pair of coated conductors; and a differential amplifier that comprises: a differential amplifier circuit that inputs the first voltage signal and the second voltage signal and outputs a differential signal whose voltage changes in keeping with a differential voltage between the first voltage signal and the second voltage signal; and the waveform shaping circuit according to claim 1, the waveform shaping circuit shaping the differential signal inputted as the input pulse signal into the output pulse signal whose peak-to-peak voltage is equivalent to a peak-to-peak voltage of an AC component of the differential signal and whose voltage during a high voltage period is set at the target constant voltage and outputting from the output as a single-ended signal, and the signal generation apparatus generates the code specifying signal based on the single-ended signal.

7. The signal generation apparatus according to claim 6, wherein the one electrode is connected to a free end-side of a first shielded cable whose base end-side is connected to the fourth impedance element, and the other electrode is connected to a free end-side of a second shielded cable whose base end-side is connected to the fifth impedance element, the second shielded cable being separate to the first shielded cable.

8. The signal generation apparatus according to claim 6, further comprising a signal generator that generates the code specifying signal by comparing the single-ended signal with a threshold voltage and binarizing a result.

9. A signal reading system comprising:

the signal generation apparatus according to claim 6; and a coding apparatus that specifies the code corresponding to the logic signal based on the code specifying signal generated by the signal generation apparatus.

10. A signal generation apparatus that generates, based on a two-wire differential voltage-type logic signal transferred via a communication path composed of a pair of coated conductors, a code specifying signal capable of specifying a code corresponding to the logic signal, wherein the signal generation apparatus comprises:

a differential amplifier that comprises: a differential amplifier circuit that is connected to a first current detection probe, which is attached to one coated conductor out of the pair of coated conductors, detects a current flowing through the one coated conductor with a current value which changes in keeping with a voltage being transferred on the one coated conductor, and outputs a first voltage signal whose voltage value changes in keeping with the current value, and is connected to a second current detection probe, which is attached to another coated conductor out of the pair of coated conductors, detects a current flowing through the other coated conductor with a current value which changes in keeping with a voltage being transferred on the other coated conductor, and outputs a second voltage signal whose voltage value changes in keeping with the current value, the differential amplifier circuit inputting the first voltage signal and the second voltage signal and outputting a differential signal whose voltage changes in keeping with a differential voltage between the first voltage signal and the second voltage signal; and the waveform shaping circuit according to claim 1, the waveform shaping circuit shapes the difference signal inputted as the input pulse signal into the output pulse signal whose peak-to-peak voltage is equivalent to a peak-to-peak voltage of an AC component of the differential signal and whose voltage during a high voltage period is set at the target constant voltage and outputs from the output as a single-ended signal, and the signal generation apparatus generates the code specifying signal based on the single-ended signal.

11. The signal generation apparatus according to claim 10, further comprising a signal generator that generates the code specifying signal by comparing the single-ended signal with a threshold voltage and binarizing a result.

12. A signal reading system comprising:

the signal generation apparatus according to claim 10; and a coding apparatus that specifies the code corresponding to the logic signal based on the code specifying signal generated by the signal generation apparatus.

13. The waveform shaping circuit according to claim 1, wherein the switch circuit is composed of a series circuit in which a second impedance element and the switch are connected in series.

14. The waveform shaping circuit according to claim 1, wherein the other end of the capacitor is connected to the output via a third impedance element, and the switch circuit is composed of the switch.

15. The waveform shaping circuit according to claim 1, wherein the switch is composed of a three-state buffer that is controlled by the control pulse signal, outputs the target constant voltage from an output terminal to the output when in the on state, and shifts the output terminal to a high impedance state when in the off state.

16. The waveform shaping circuit according to claim 1, further comprising a D/A converter that performs D/A conversion on voltage data inputted from outside and outputs the target constant voltage with a voltage value indicated by the voltage data.

* * * * *